US011222912B2

(12) United States Patent
Furukawa et al.

(10) Patent No.: US 11,222,912 B2
(45) Date of Patent: Jan. 11, 2022

(54) IMAGING ELEMENT, STACKED TYPE IMAGING ELEMENT AND SOLID-STATE IMAGING APPARATUS

(71) Applicant: SONY CORPORATION, Tokyo (JP)

(72) Inventors: Akira Furukawa, Kanagawa (JP); Yoshihiro Ando, Kanagawa (JP); Hideaki Togashi, Kanagawa (JP); Fumihiko Koga, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/349,361

(22) PCT Filed: Nov. 14, 2017

(86) PCT No.: PCT/JP2017/040938
§ 371 (c)(1),
(2) Date: May 13, 2019

(87) PCT Pub. No.: WO2018/096980
PCT Pub. Date: May 31, 2018

(65) Prior Publication Data
US 2019/0371844 A1    Dec. 5, 2019

(30) Foreign Application Priority Data
Nov. 22, 2016  (JP) .............................. JP2016-226658

(51) Int. Cl.
*H01L 27/146* (2006.01)
*H04N 5/225* (2006.01)

(52) U.S. Cl.
CPC ................. *H01L 27/14614* (2013.01); *H01L 27/14605* (2013.01); *H01L 27/14627* (2013.01);
(Continued)

(58) Field of Classification Search
CPC ......... H01L 27/14605; H01L 27/14641; H01L 27/307; H01L 27/14636; H01L 27/1464; H01L 27/14647; H01L 27/14614
See application file for complete search history.

(56) References Cited

U.S. PATENT DOCUMENTS

| 4,379,306 A | 4/1983 | Chatterjee |
| 7,242,449 B1 * | 7/2007 | Yamazaki ............... H01L 27/12 |
| | | 349/116 |

(Continued)

FOREIGN PATENT DOCUMENTS

| EP | 0242291 | 10/1987 |
| JP | S64-057668 | 3/1989 |

(Continued)

OTHER PUBLICATIONS

International Search Report and Written Opinion prepared by the European Patent Office dated Mar. 23, 2018, for International Application No. PCT/JP2017/040938.

(Continued)

*Primary Examiner* — Bilkis Jahan
*Assistant Examiner* — Victor V Barzykin
(74) *Attorney, Agent, or Firm* — Sheridan Ross P.C.

(57) ABSTRACT

Provided is an imaging element including a photoelectric conversion unit formed by stacking a first electrode, a photoelectric conversion layer and a second electrode. The photoelectric conversion unit further includes a charge storage electrode which is disposed to be spaced apart from the first electrode and disposed opposite to the photoelectric conversion layer via an insulating layer. The photoelectric conversion unit is formed of N number of photoelectric conversion unit segments, and the same applies to the photoelectric conversion layer, the insulating layer and the charge storage electrode. An $n^{th}$ photoelectric conversion unit segment is formed of an $n^{th}$ charge storage electrode (Continued)

segment, an $n^{th}$ insulating layer segment and an $n^{th}$ photoelectric conversion layer segment. As n increases, the $n^{th}$ photoelectric conversion unit segment is located farther from the first electrode. A thickness of the insulating layer segment gradually changes from a first to $N^{th}$ photoelectric conversion unit segment.

8 Claims, 61 Drawing Sheets

(52) U.S. Cl.
CPC ..... *H01L 27/14641* (2013.01); *H04N 5/2254* (2013.01); *H04N 5/2258* (2013.01)

(56) References Cited

U.S. PATENT DOCUMENTS

| | | | |
|---|---|---|---|
| 8,964,084 | B2 | 2/2015 | Yamashita |
| 2012/0001285 | A1* | 1/2012 | Kokubun ............... G02B 5/285 257/432 |
| 2013/0093911 | A1 | 4/2013 | Sul et al. |
| 2013/0093932 | A1* | 4/2013 | Choo ..................... H01L 51/424 348/294 |
| 2014/0021574 | A1* | 1/2014 | Egawa ............. H01L 27/14641 257/432 |
| 2014/0232912 | A1* | 8/2014 | Morimoto ................ G06T 5/20 348/270 |
| 2016/0037098 | A1* | 2/2016 | Lee ....................... H01L 27/307 257/40 |
| 2016/0240570 | A1 | 8/2016 | Barna et al. |
| 2016/0293654 | A1* | 10/2016 | Tomekawa ........ H01L 27/14603 |
| 2017/0221939 | A1* | 8/2017 | Hatada ..................... H04N 5/32 |

FOREIGN PATENT DOCUMENTS

| | | |
|---|---|---|
| JP | 2007-258424 | 10/2007 |
| JP | 2008-112907 | 5/2008 |
| JP | 2008-263119 | 10/2008 |
| JP | 2011-138927 | 7/2011 |
| JP | 5095100 | 12/2012 |
| JP | 2016-039203 | 3/2016 |
| TW | 201543660 | 11/2015 |
| TW | 201615003 | 4/2016 |
| WO | WO 2017/150540 | 9/2017 |

OTHER PUBLICATIONS

Official Action (with English translation) for Japanese Patent Application No. 2016-226658, dated Nov. 4, 2020, 14 pages.
Official Action (no English translation avallable) for Taiwan Patent Application No. 106139409, dated Mar. 11, 2021, 13 pages.

* cited by examiner

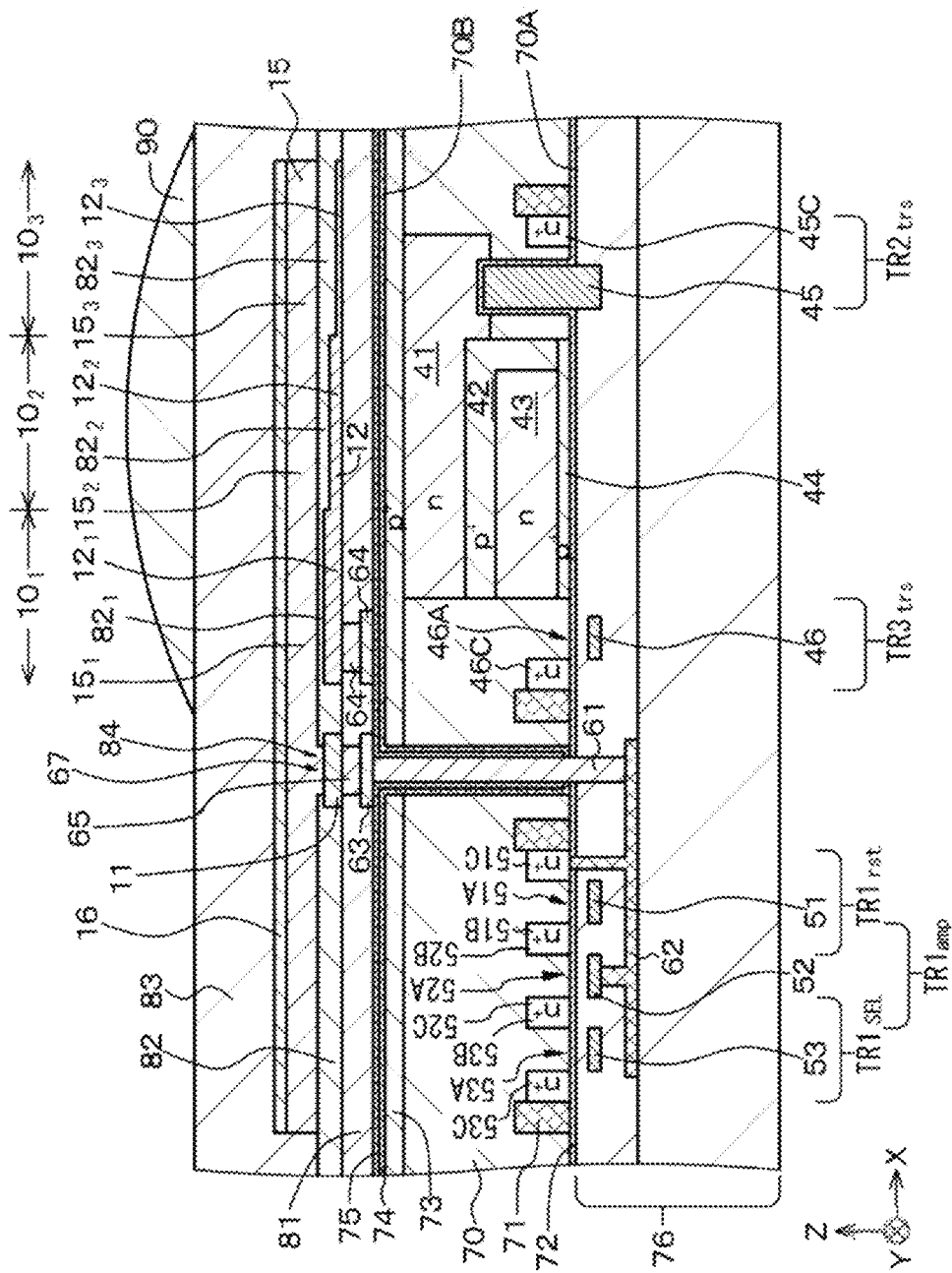

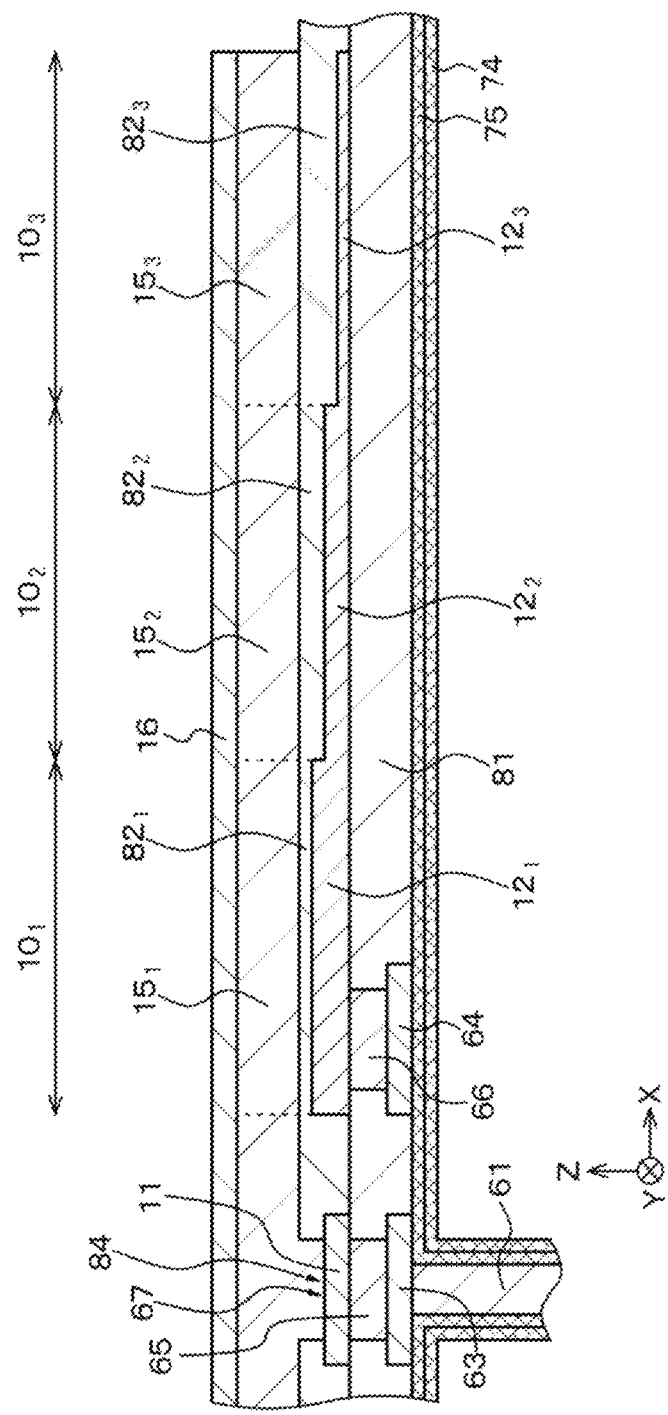
[FIG. 2]

[FIG. 3]
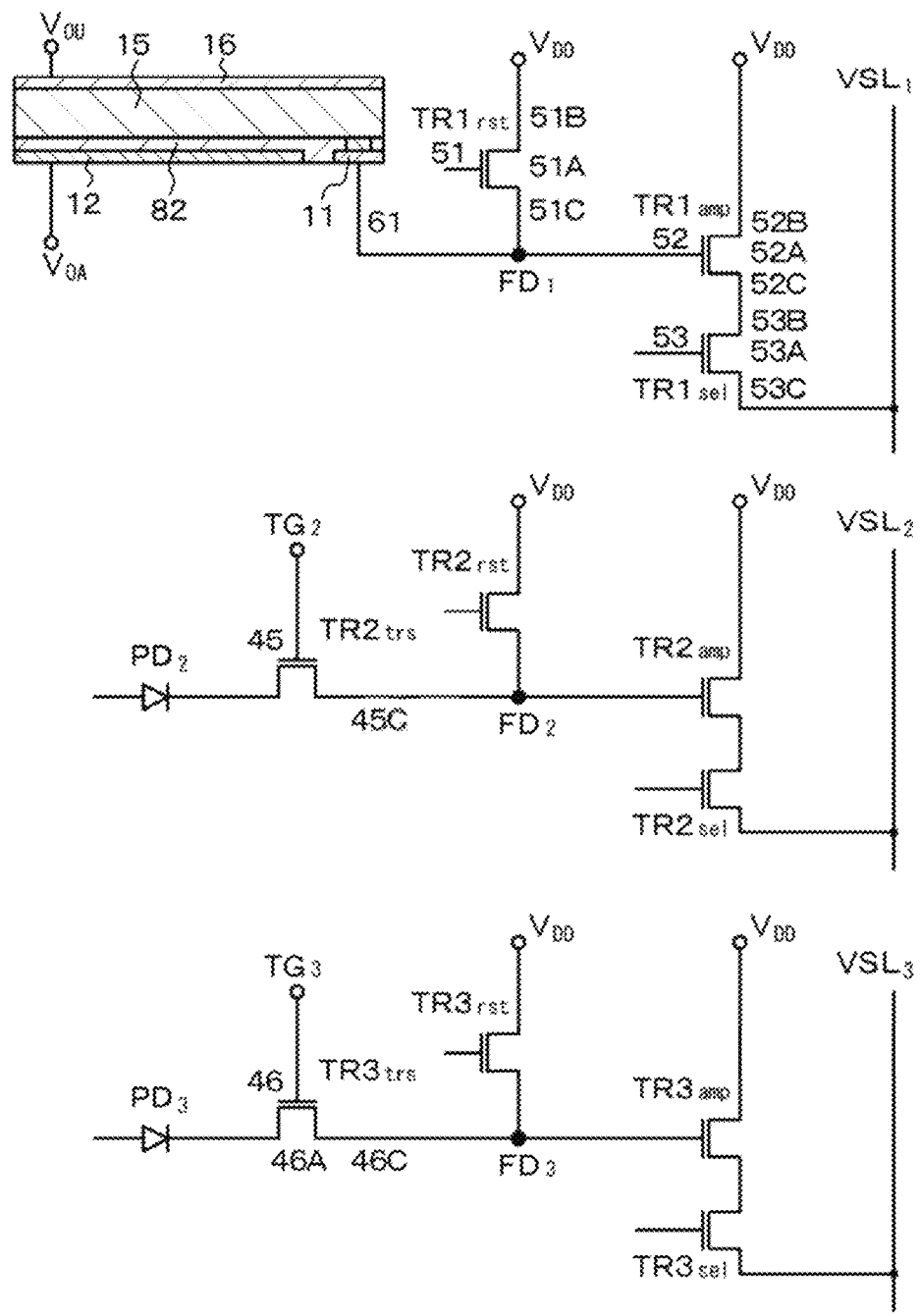

[FIG. 4]
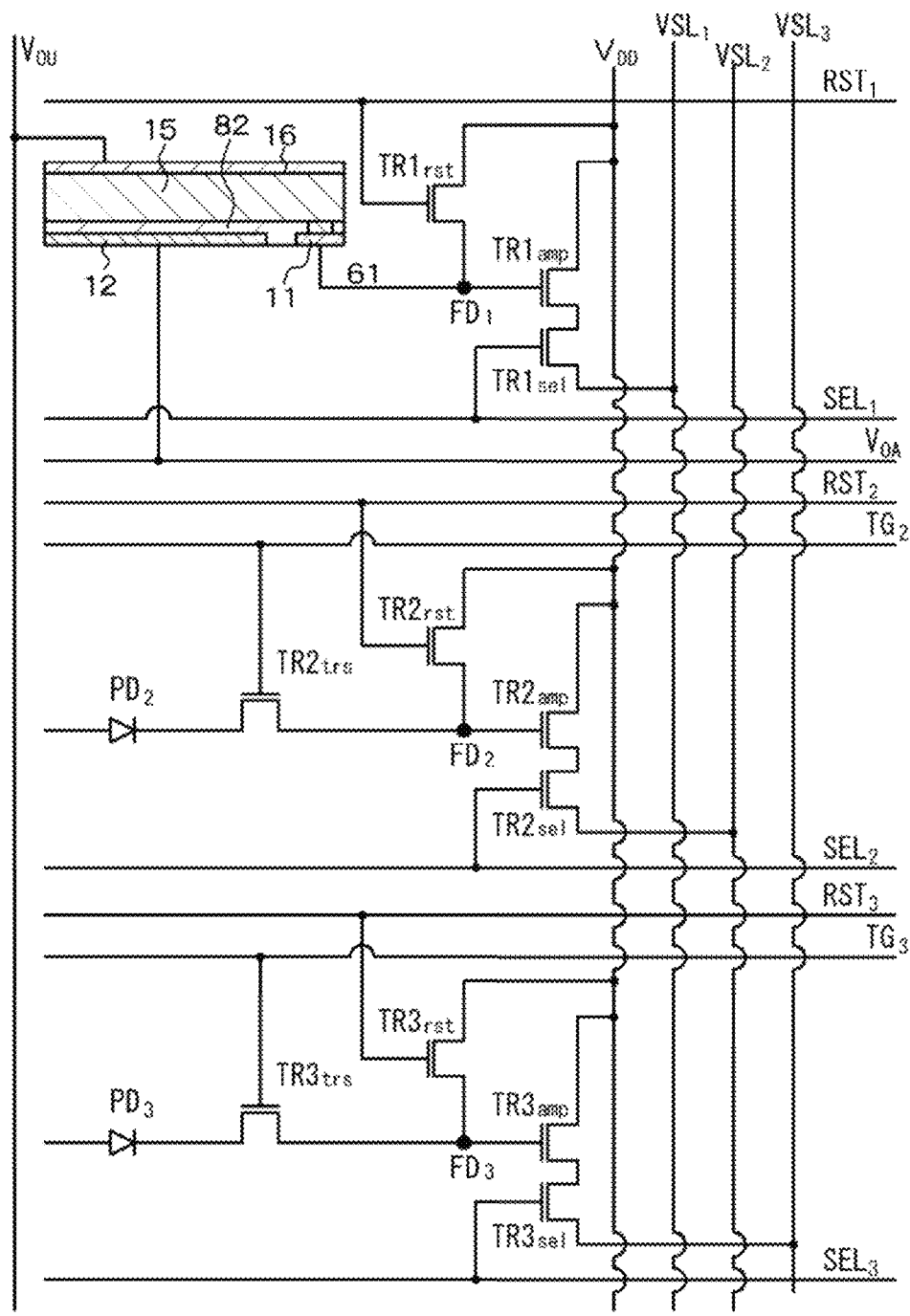

[FIG. 5]
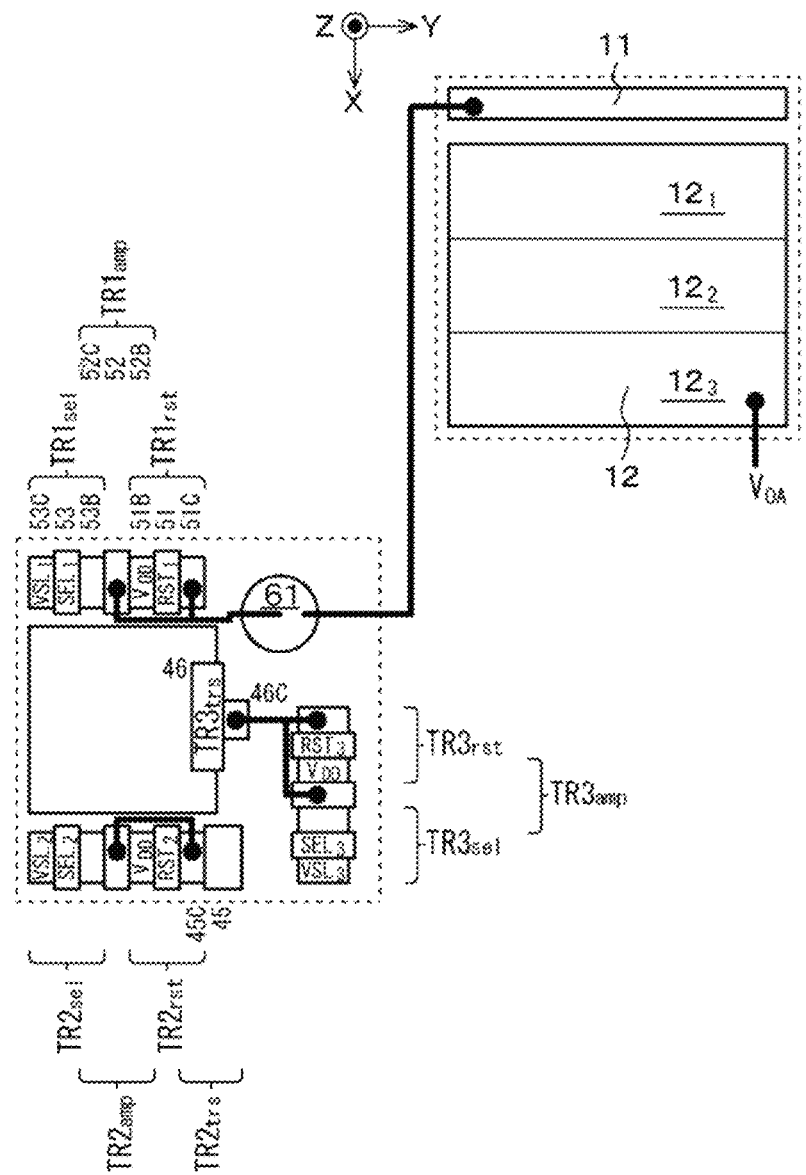

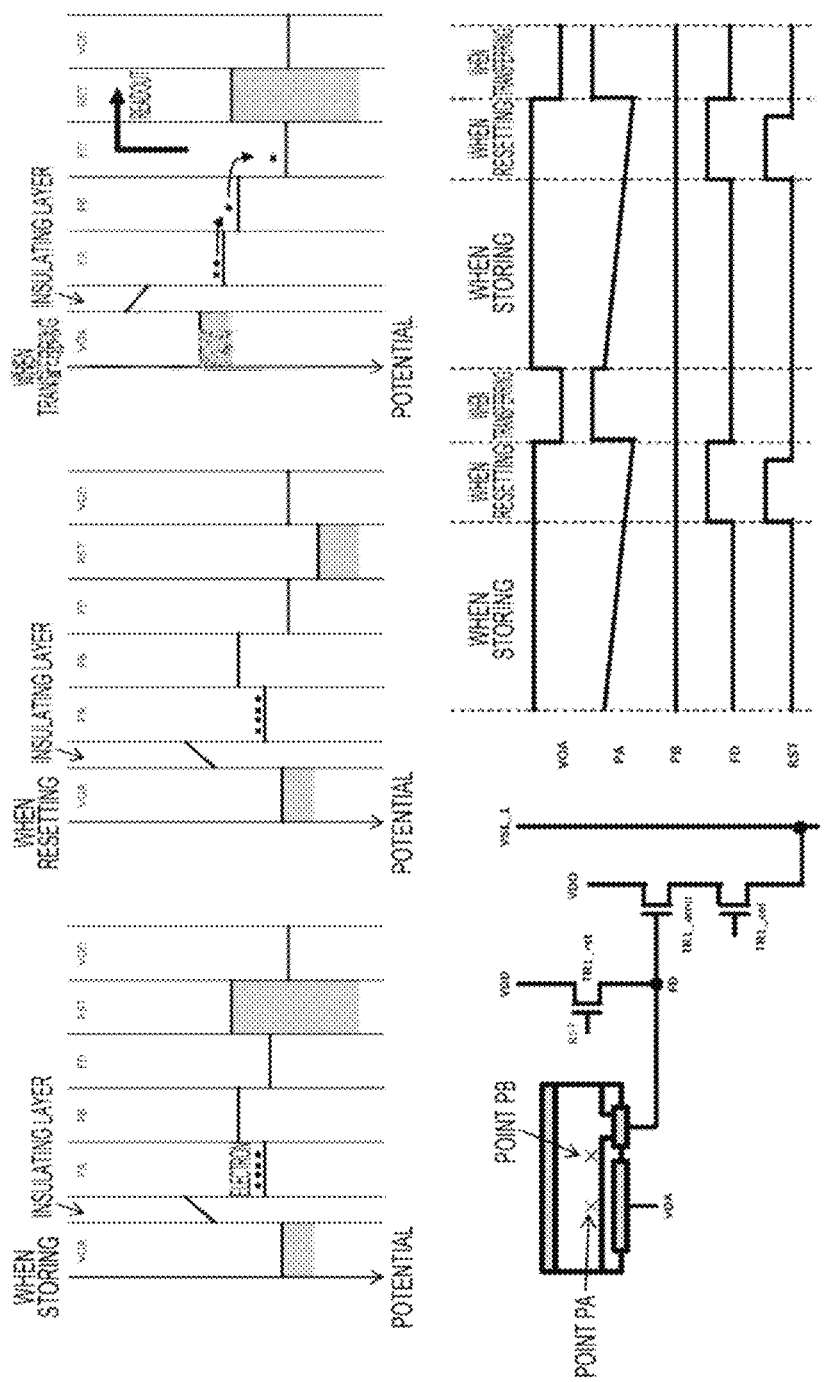
[FIG. 6]

[FIG. 7]
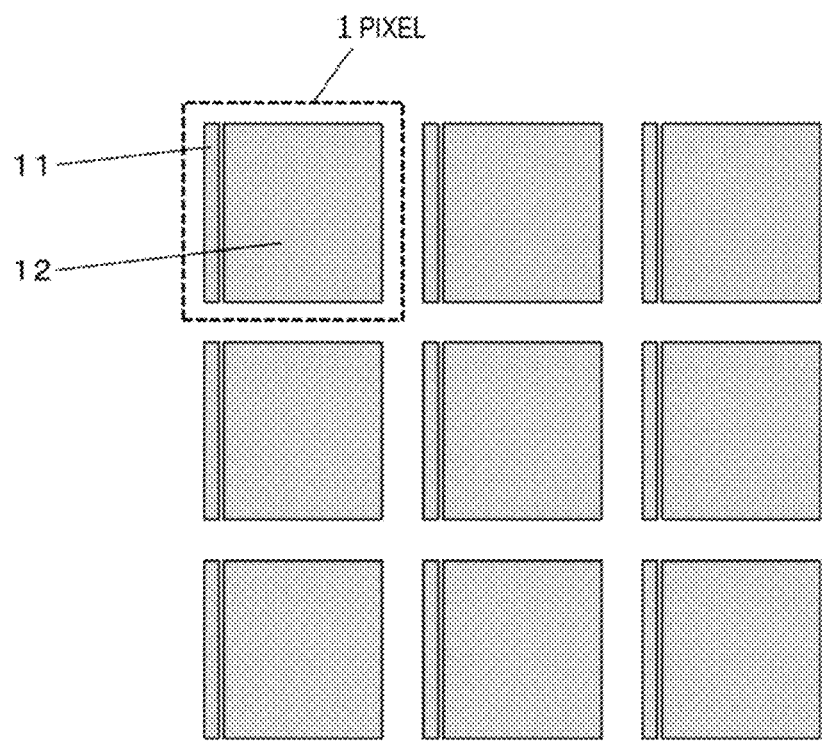

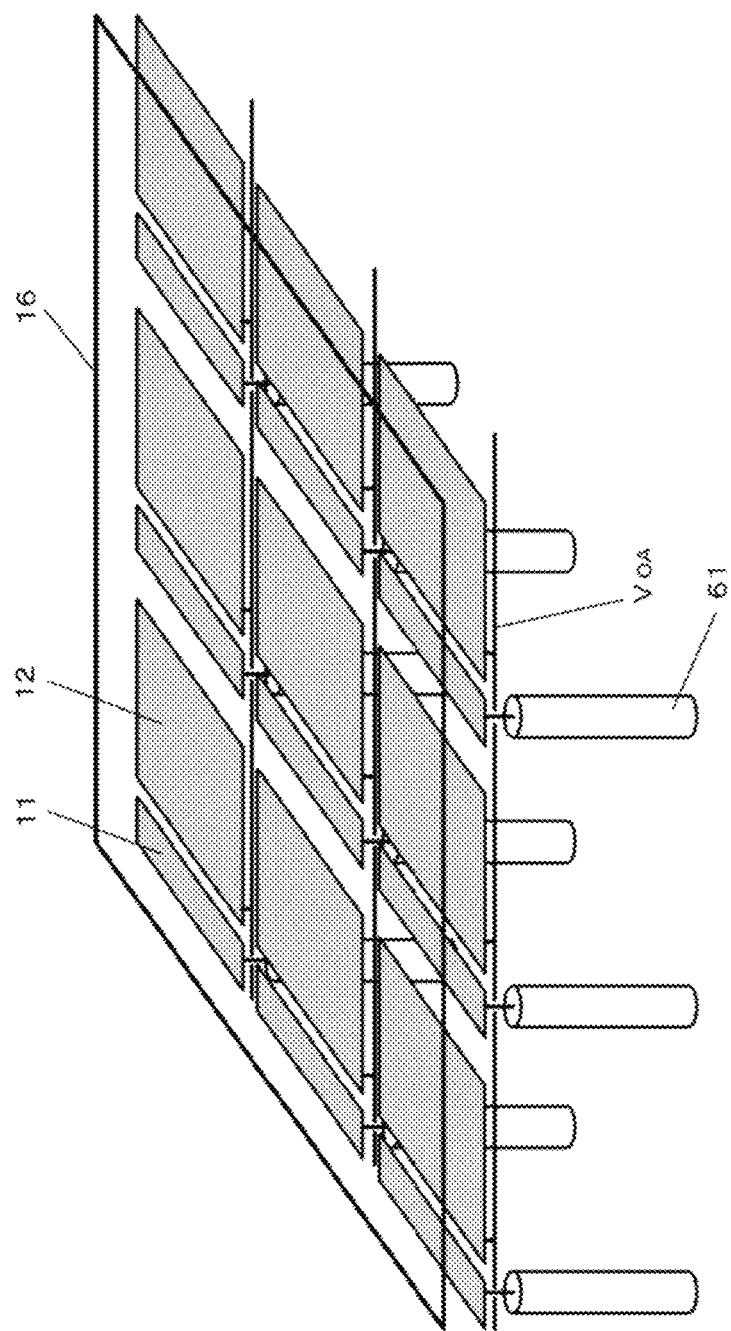
[FIG. 8]

[FIG. 9]
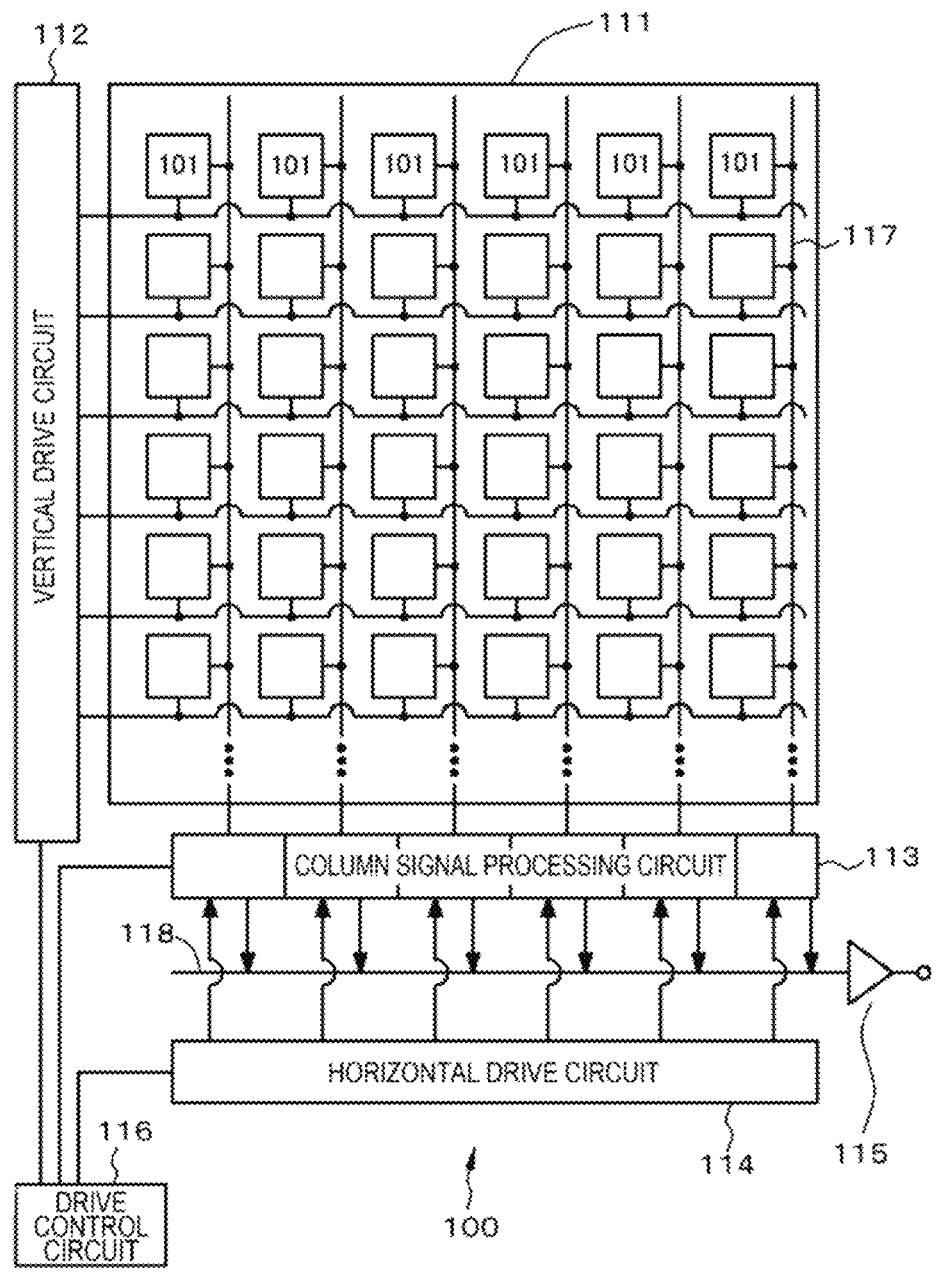

[FIG. 10]
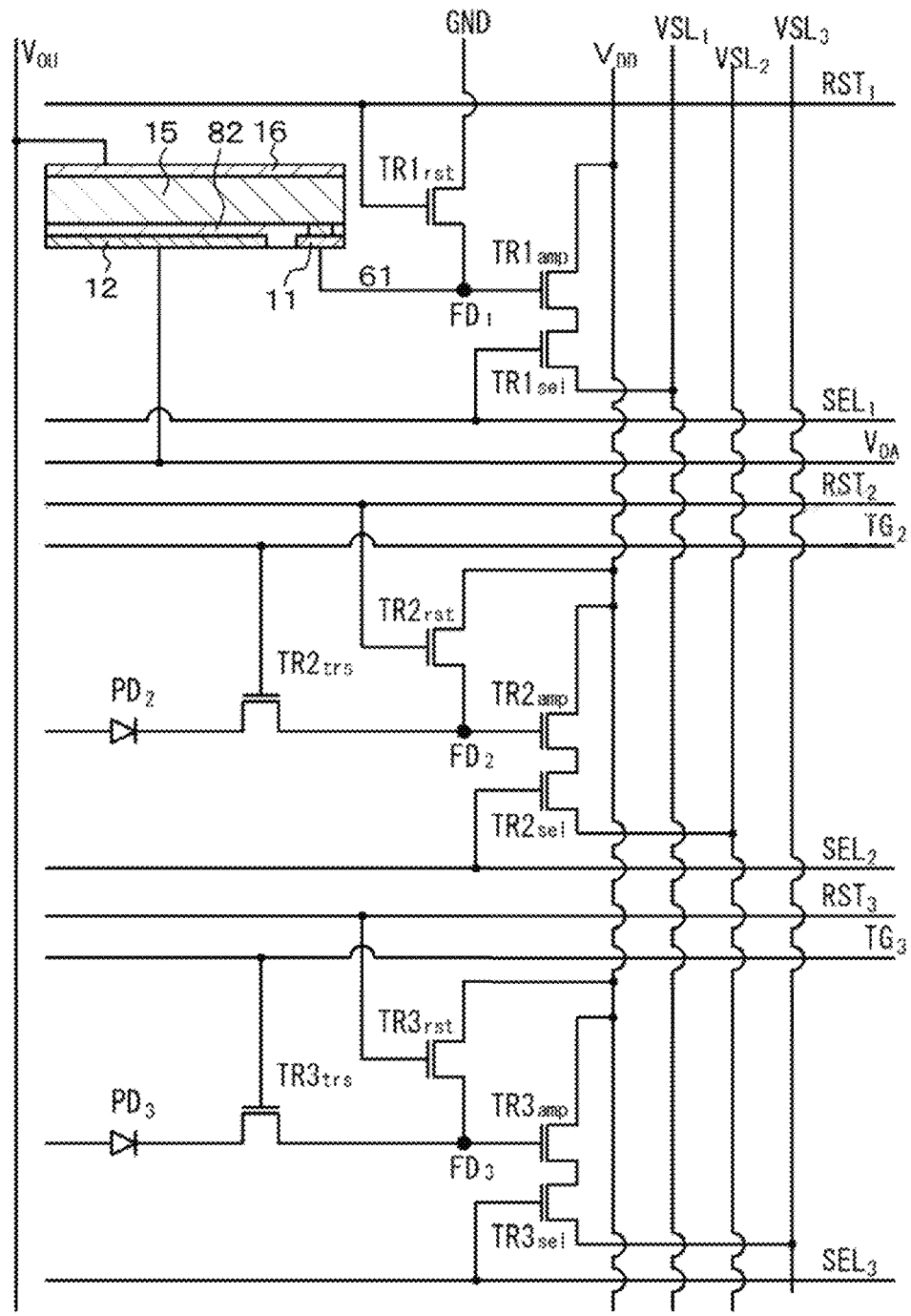

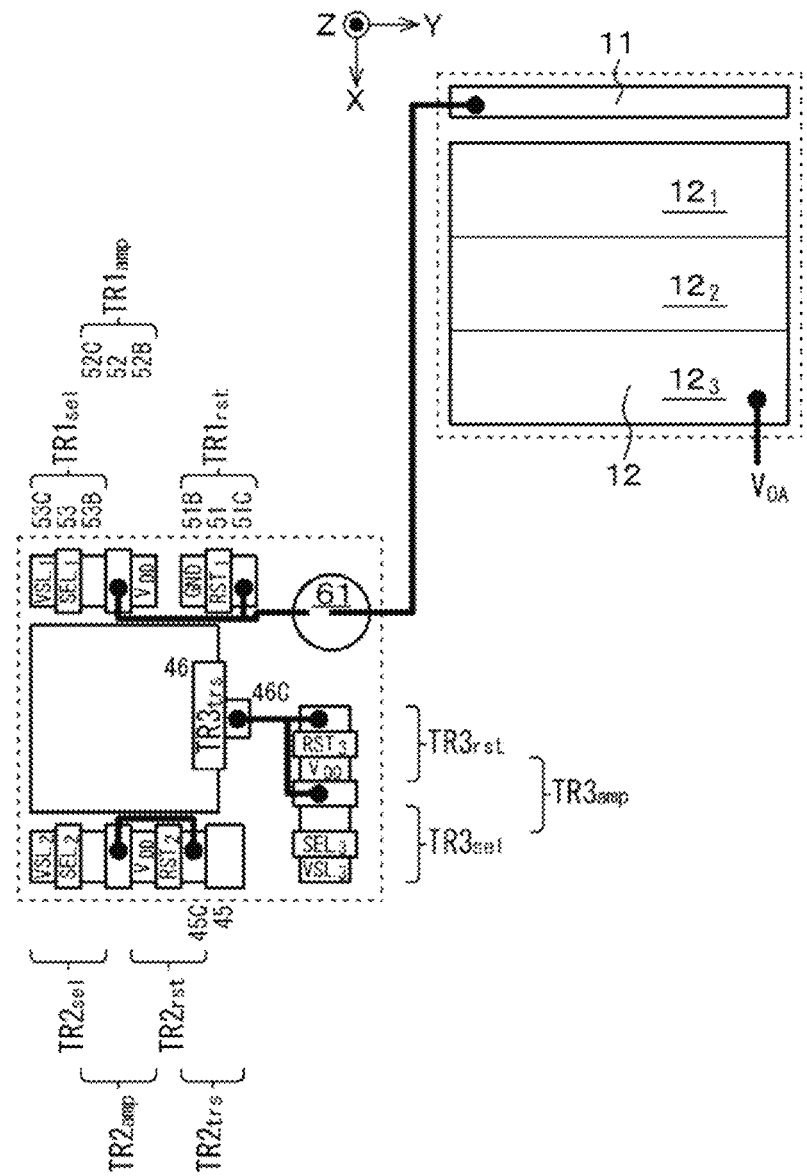

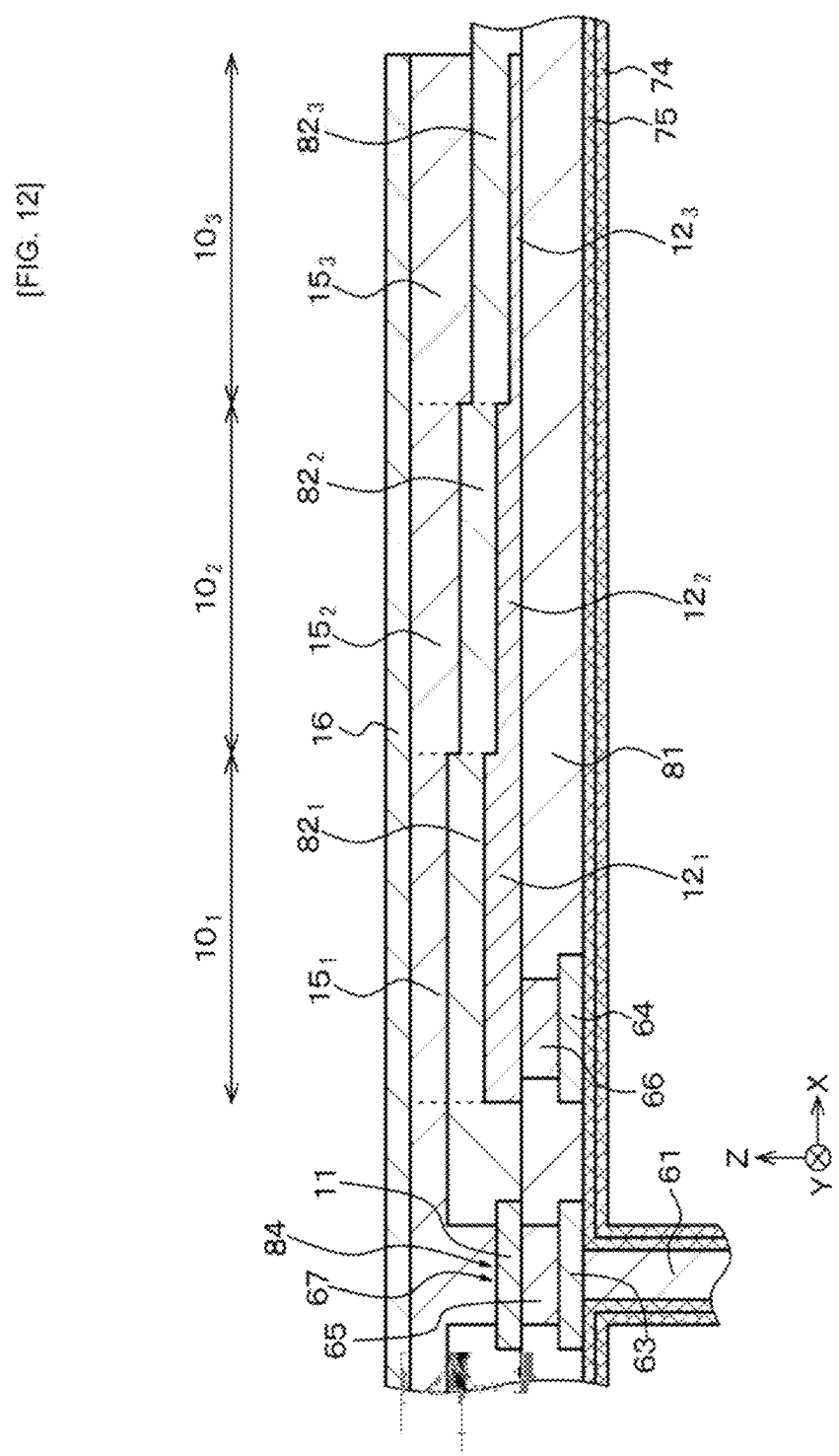
[FIG. 12]

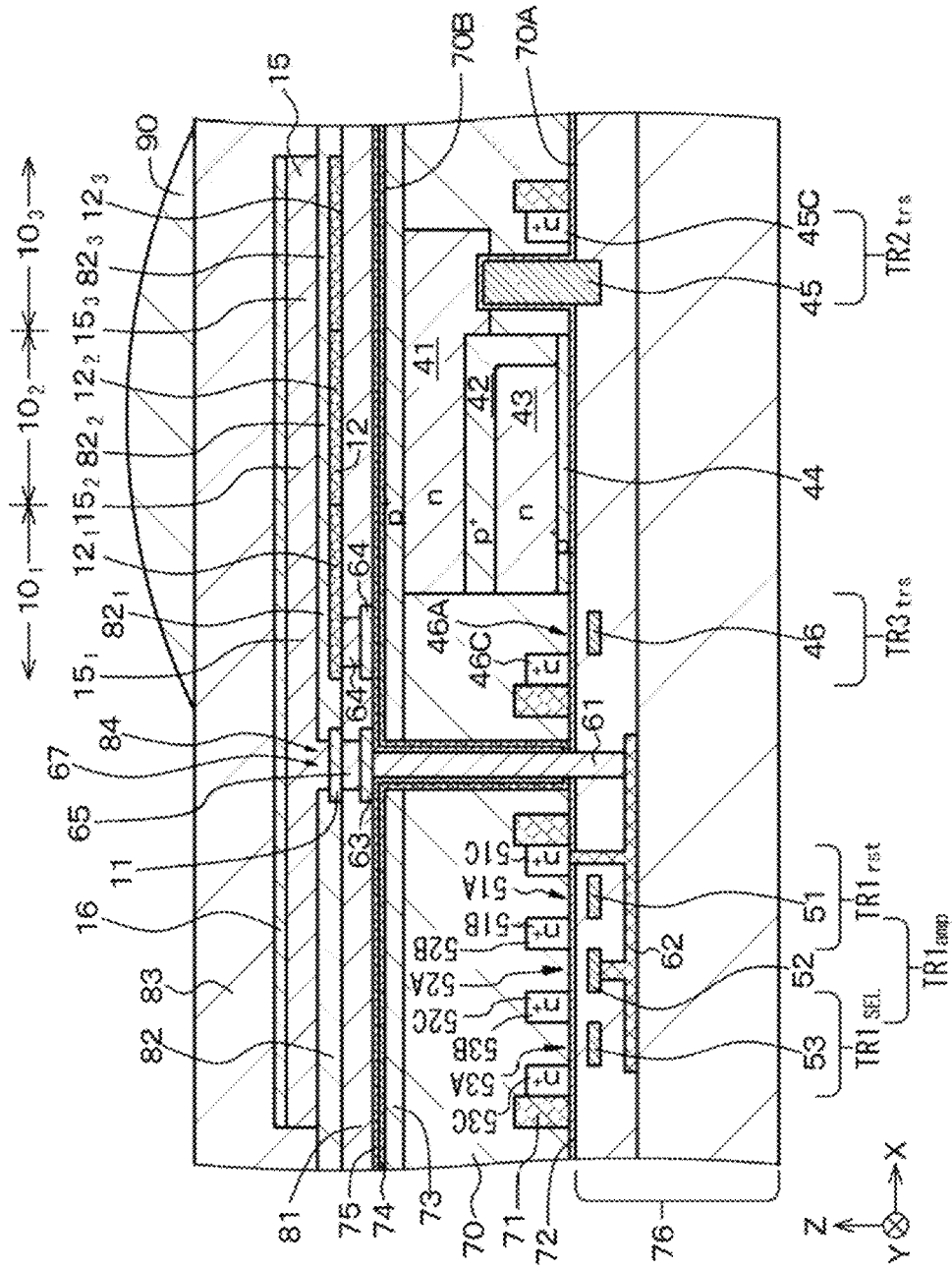

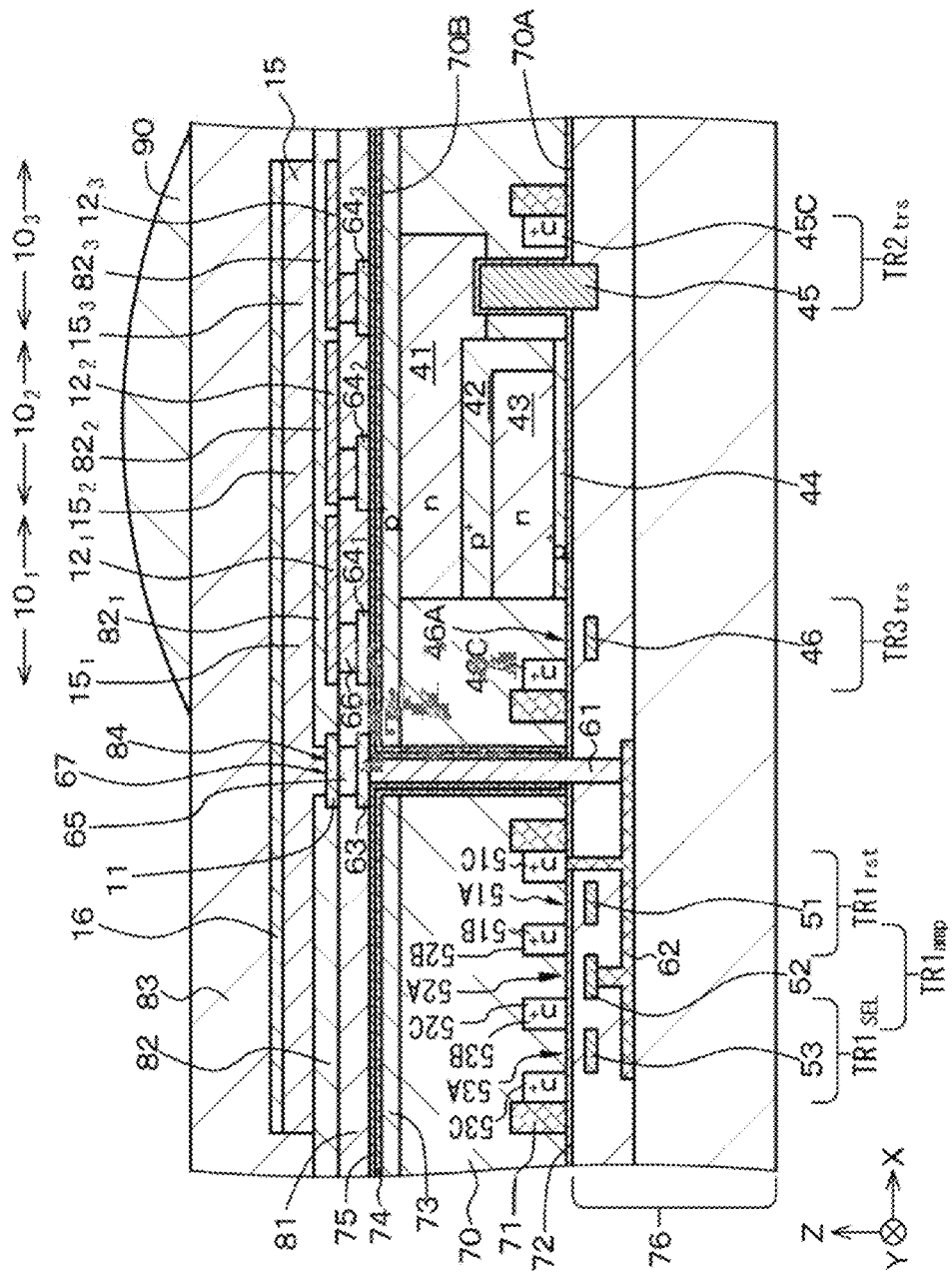

[FIG. 15A]
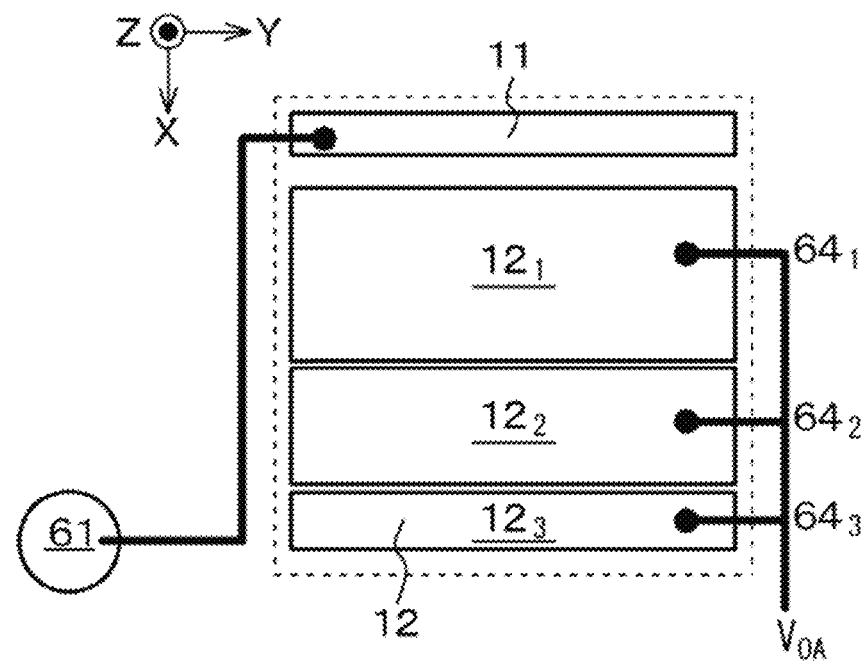
[FIG. 15B]
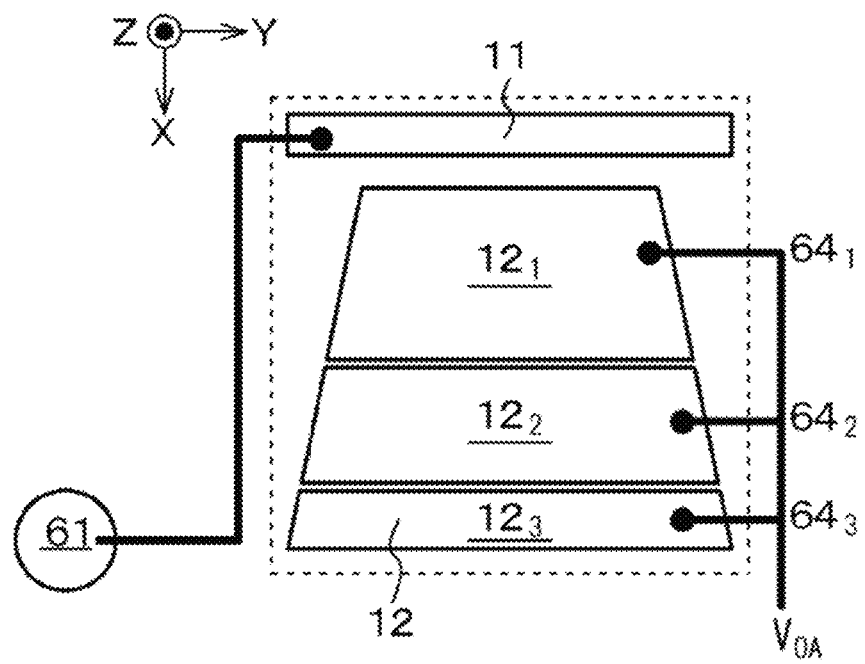

[FIG. 16A]
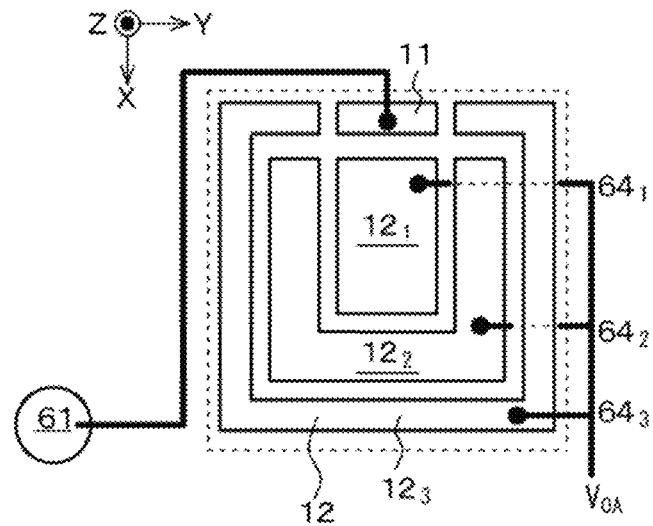
[FIG. 16B]
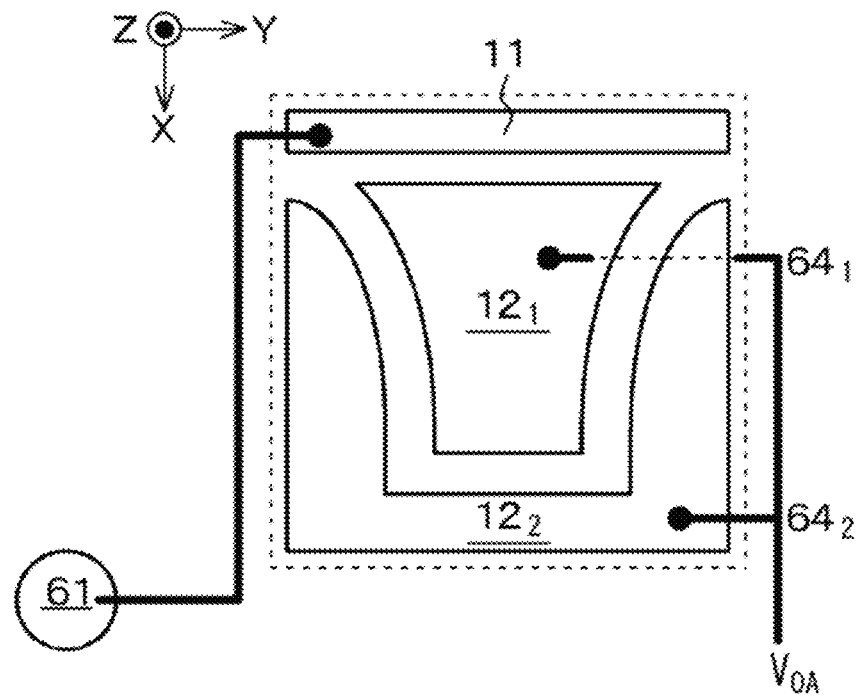

[FIG. 17]
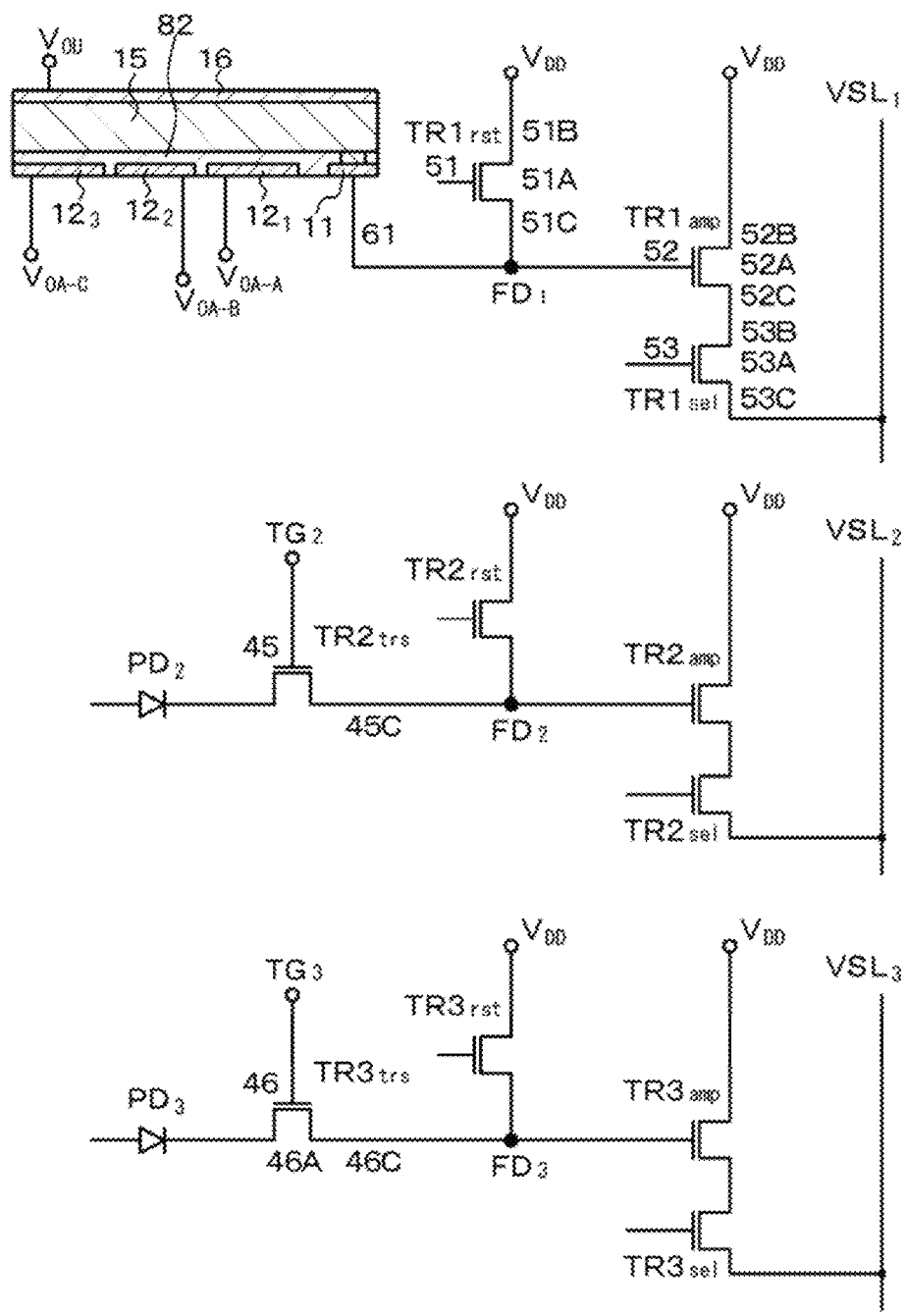

[FIG. 18]
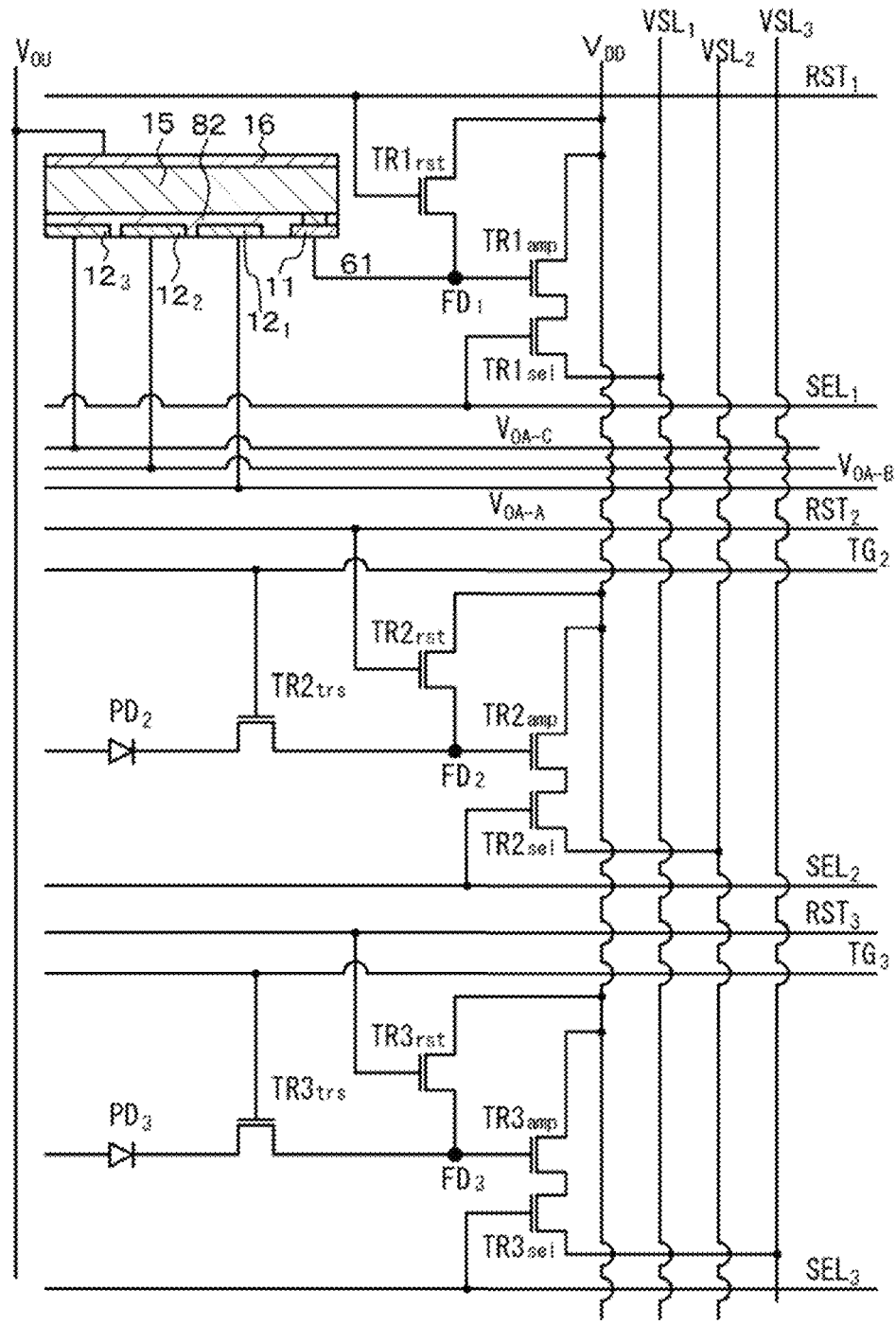

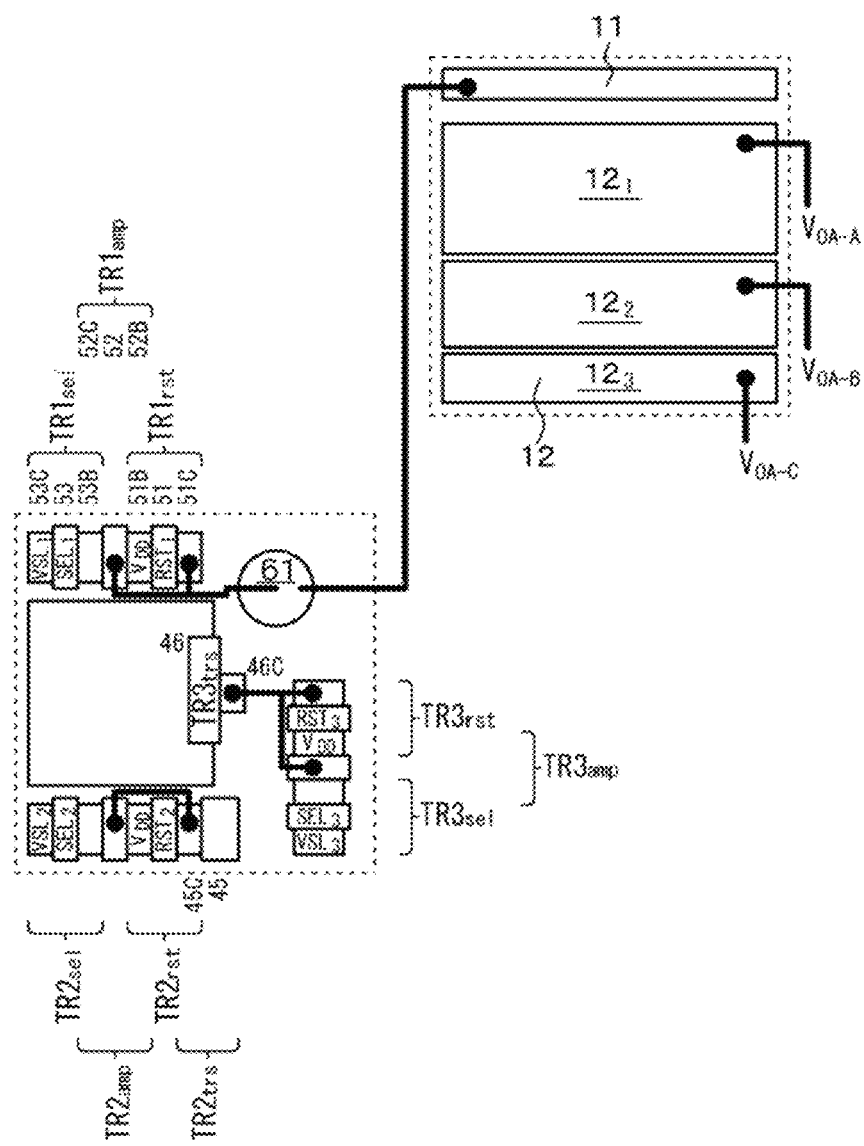
[FIG. 19]

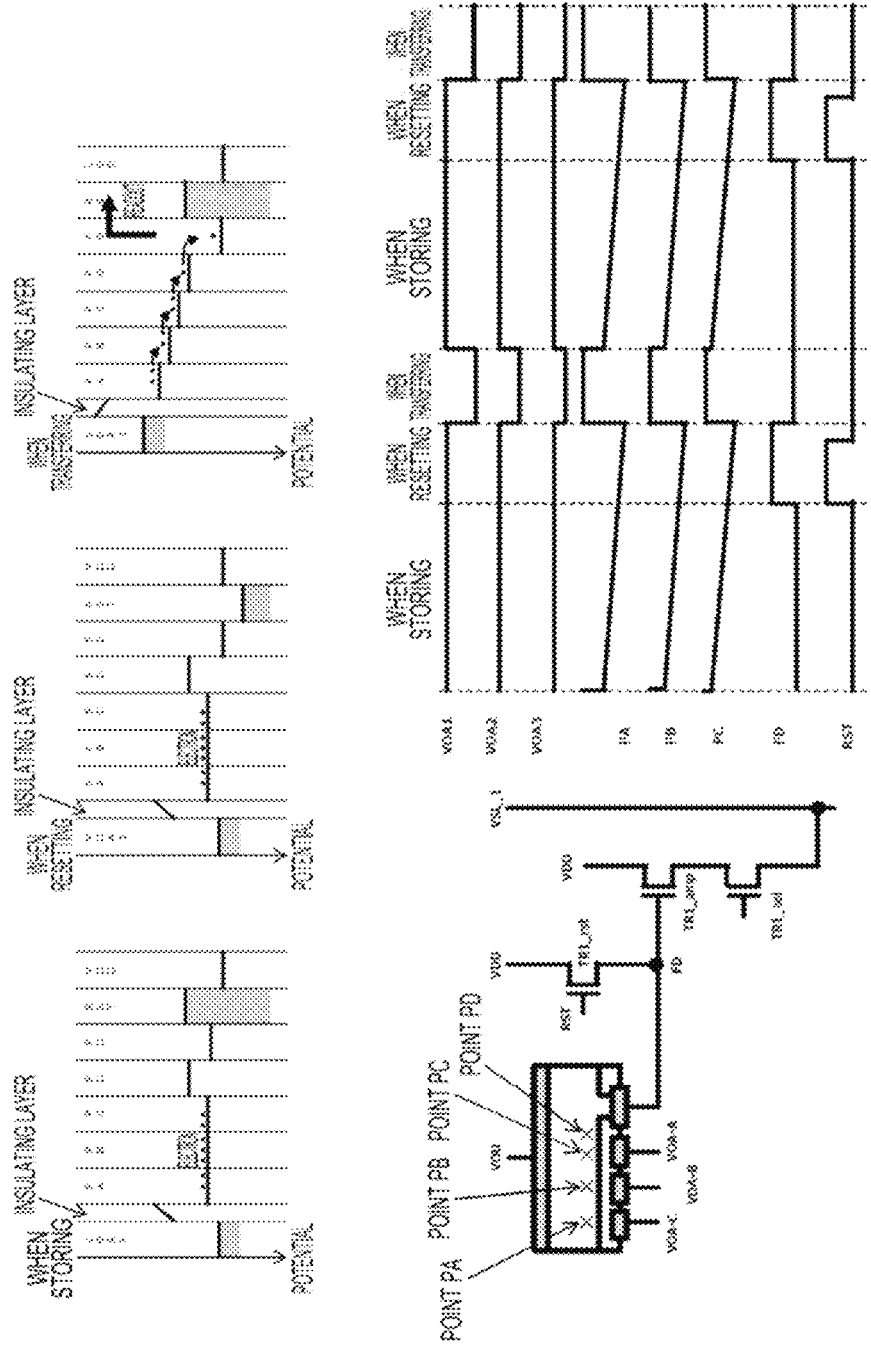
[FIG. 20]

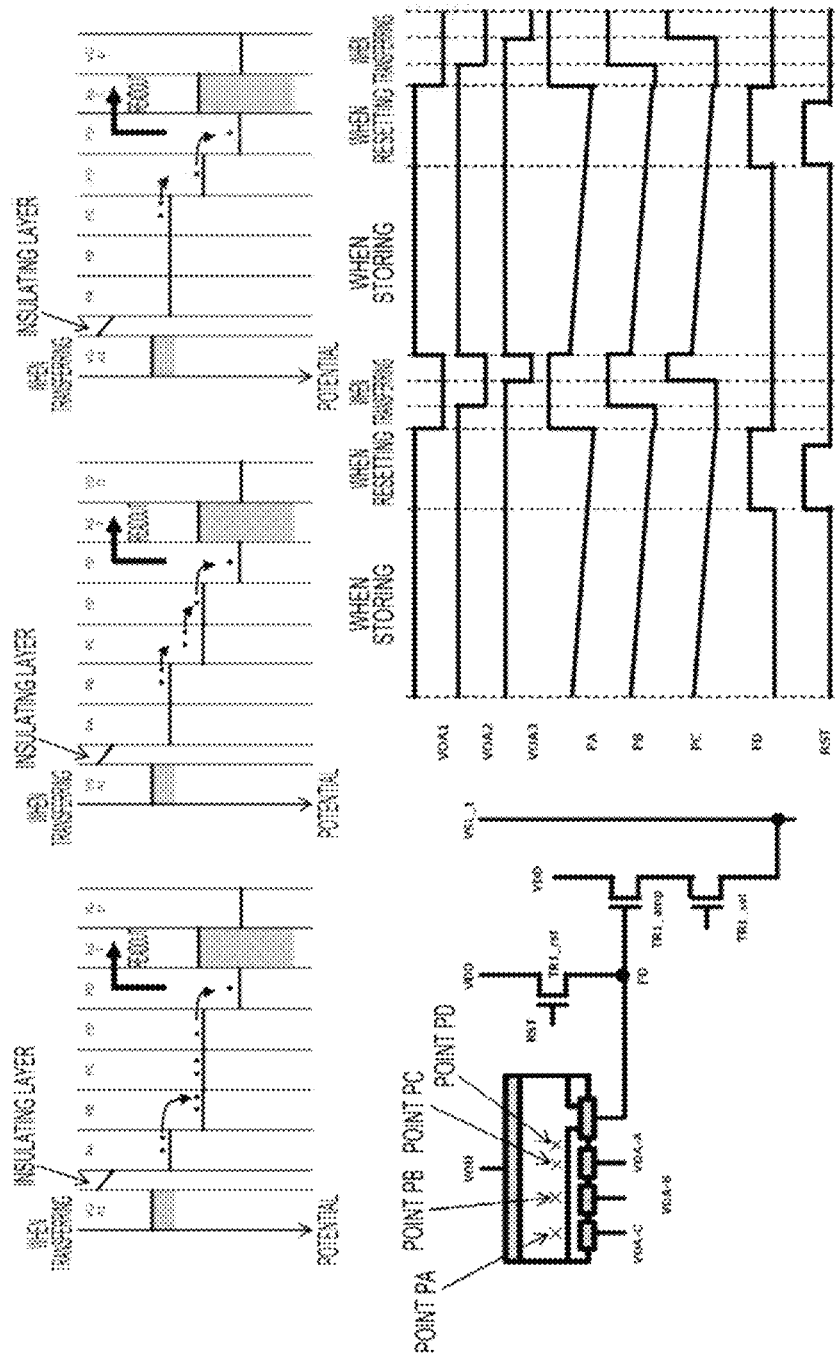

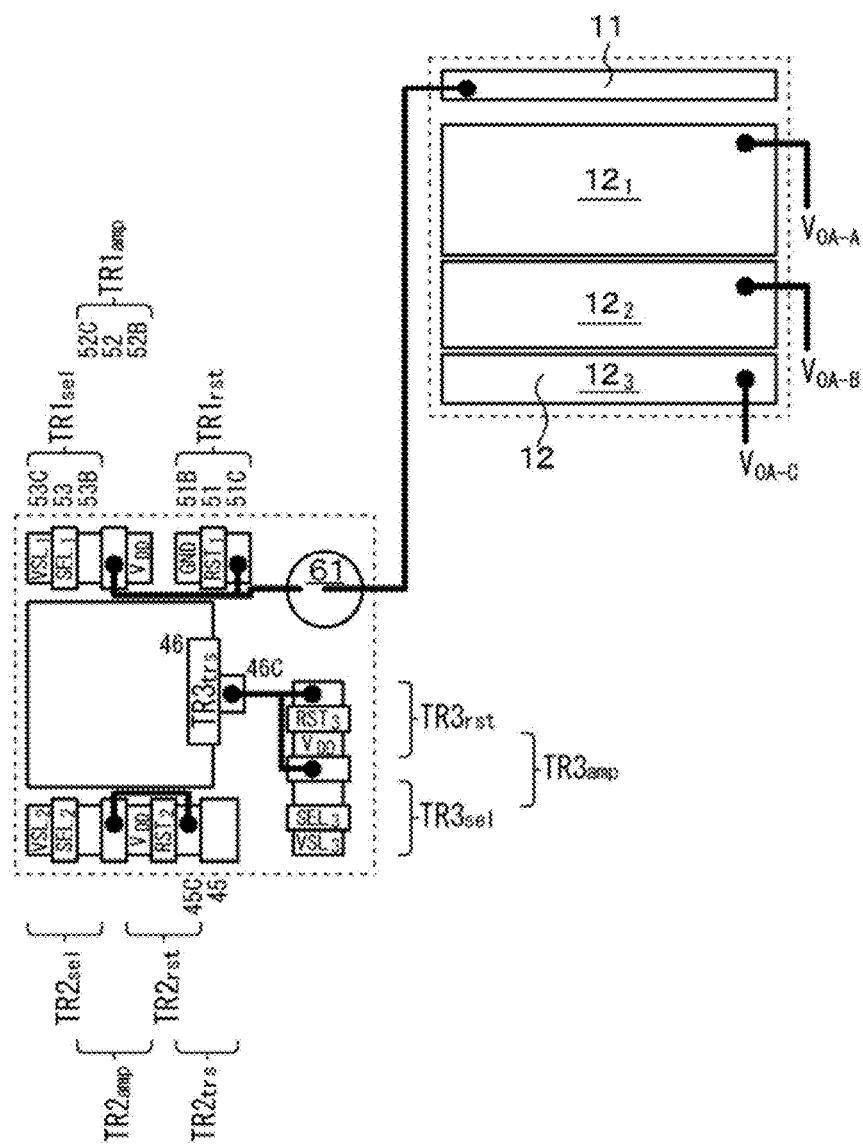
[FIG. 22]

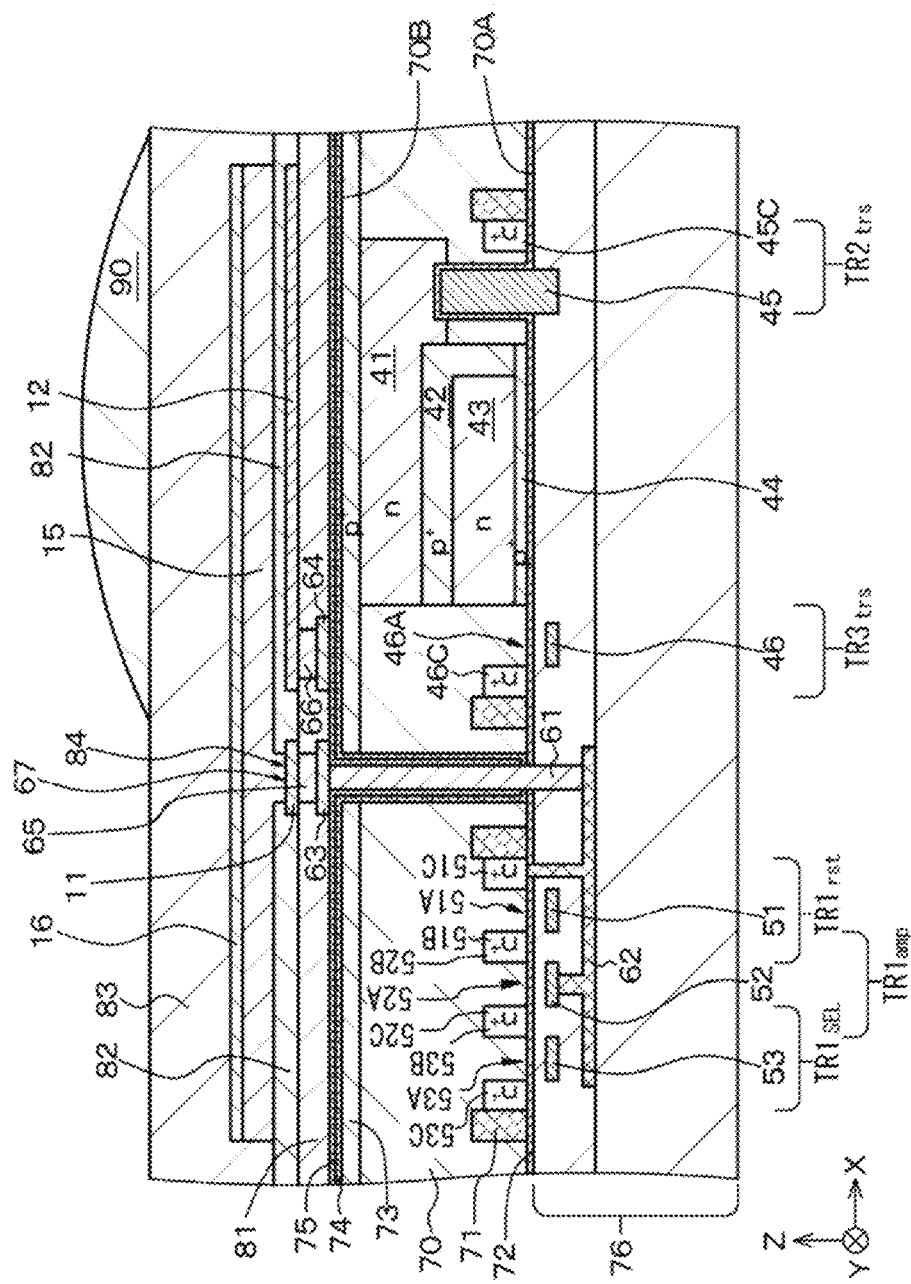

[FIG. 24A]
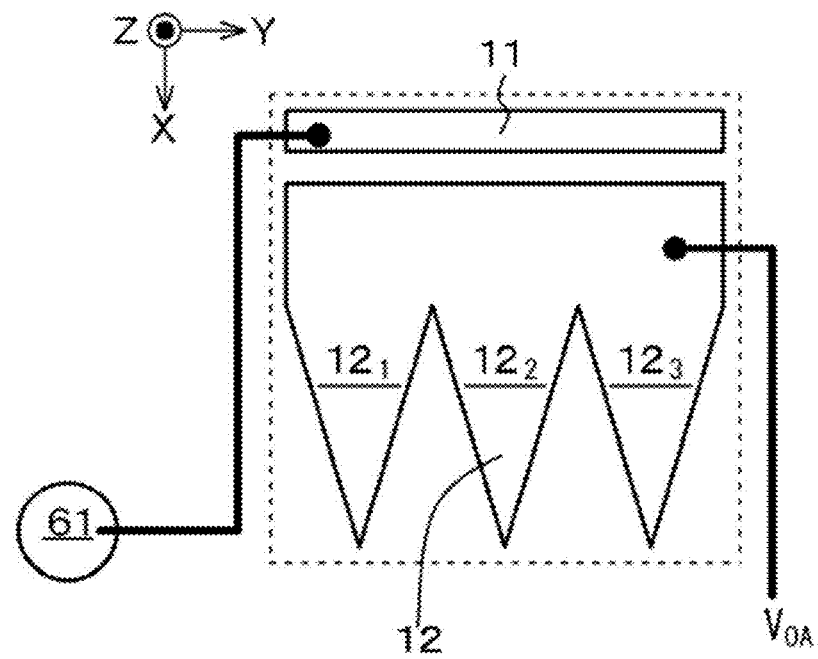
[FIG. 24B]
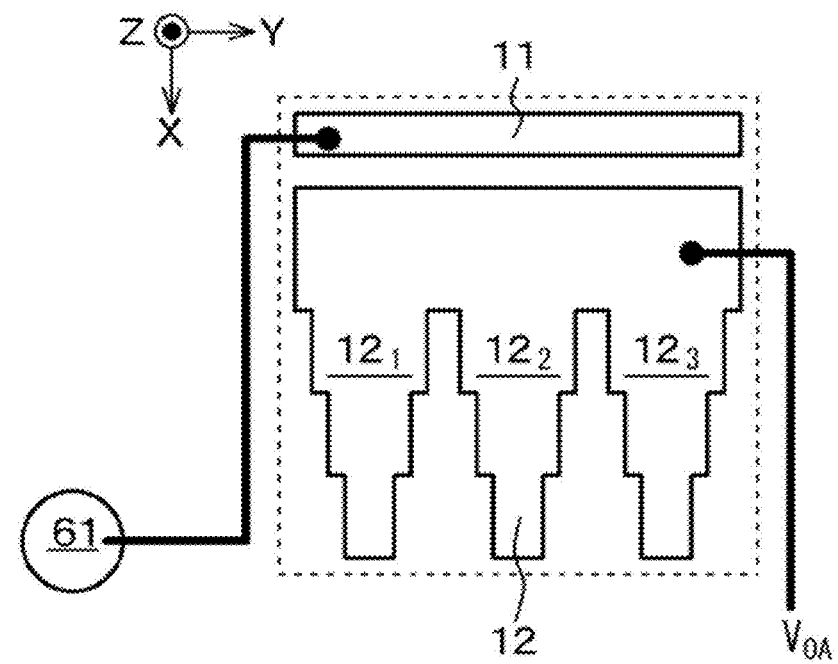

[FIG. 25]
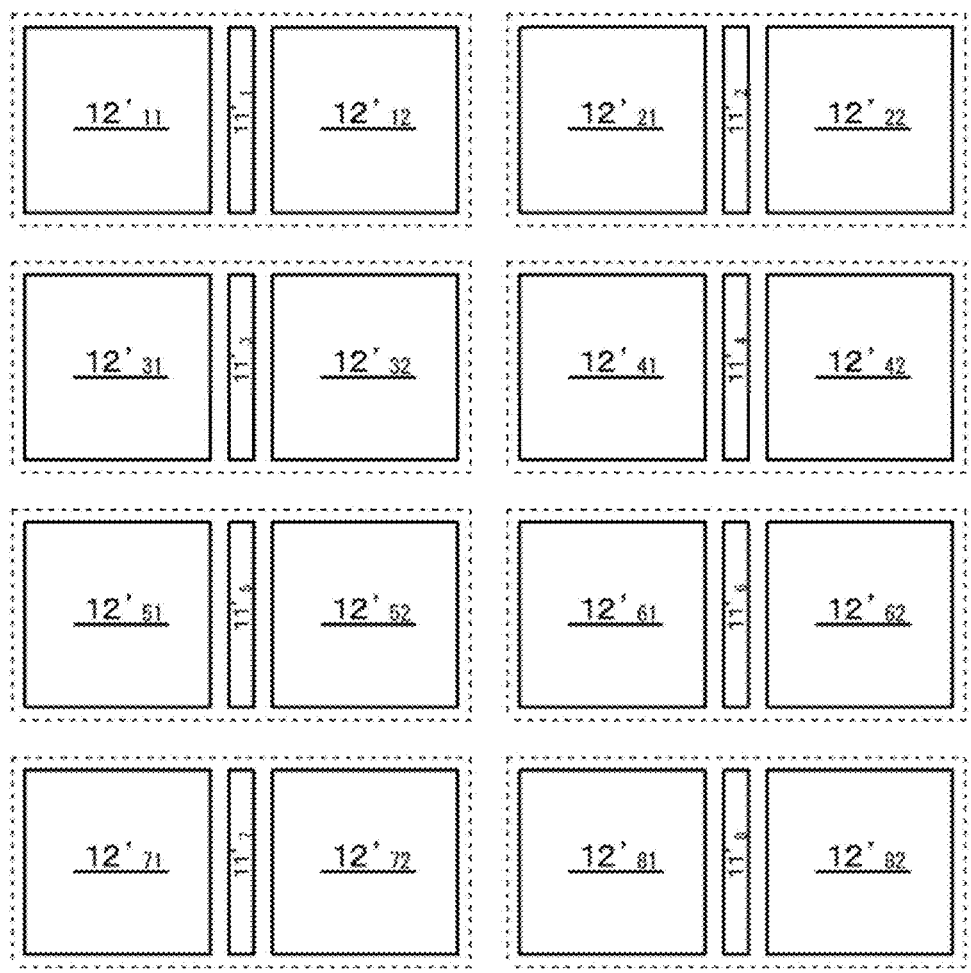

[FIG. 26]
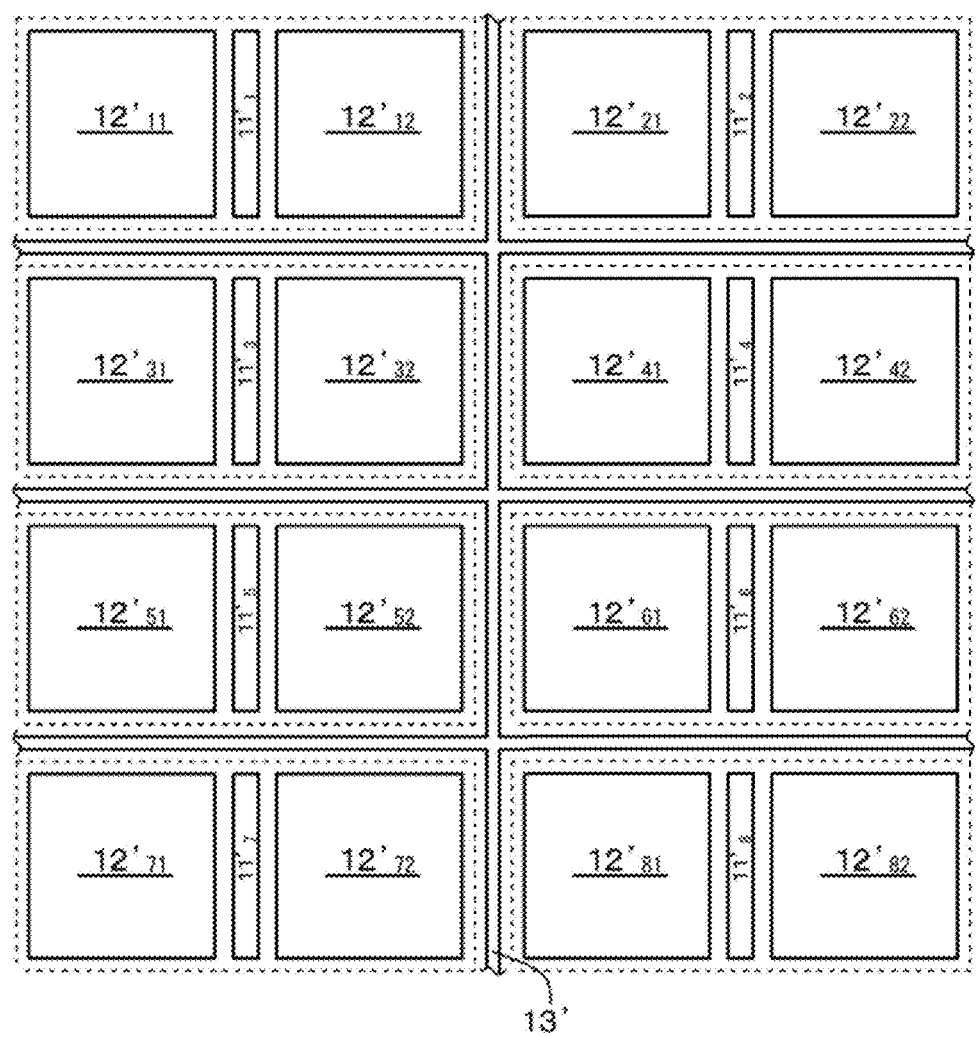

[FIG. 27]
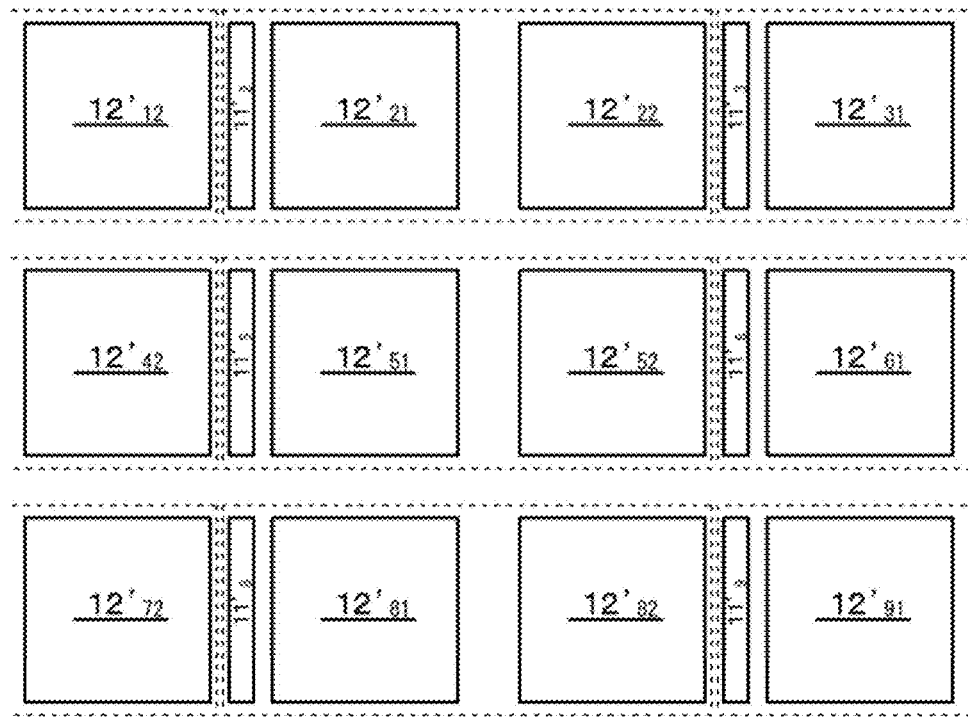
[FIG. 28]
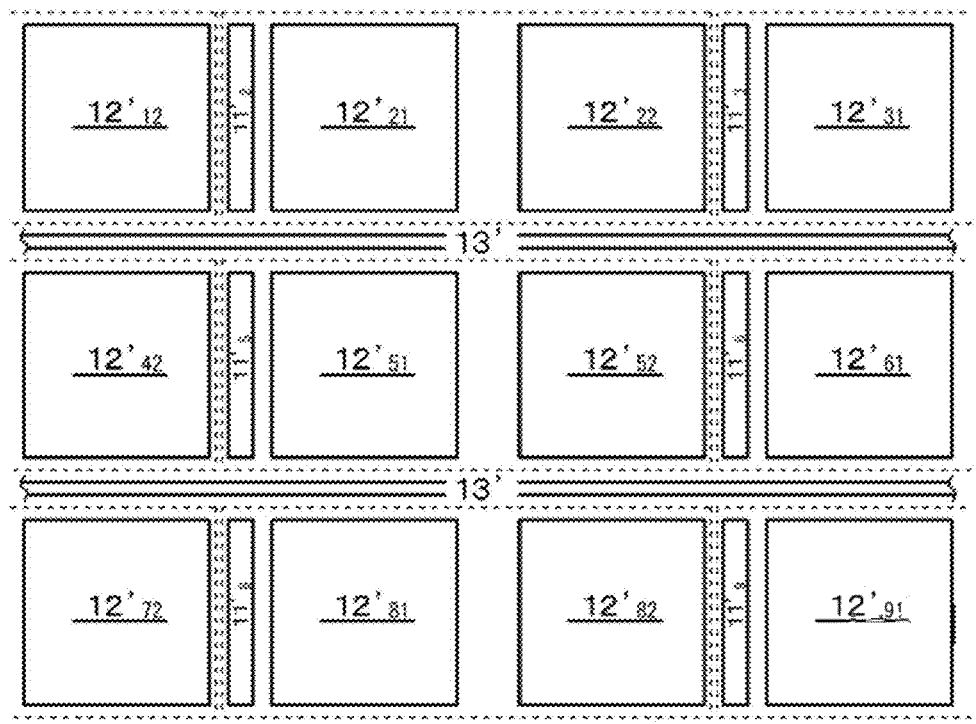

[FIG. 29]
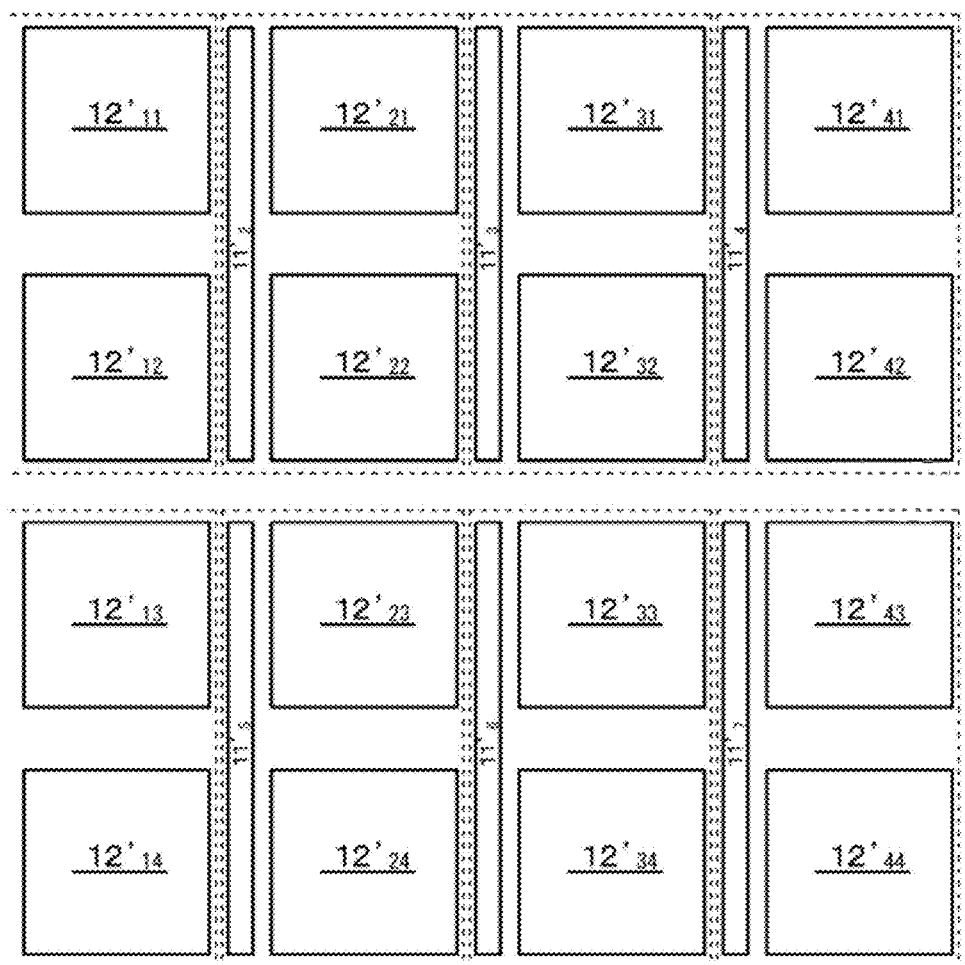

[FIG. 30]
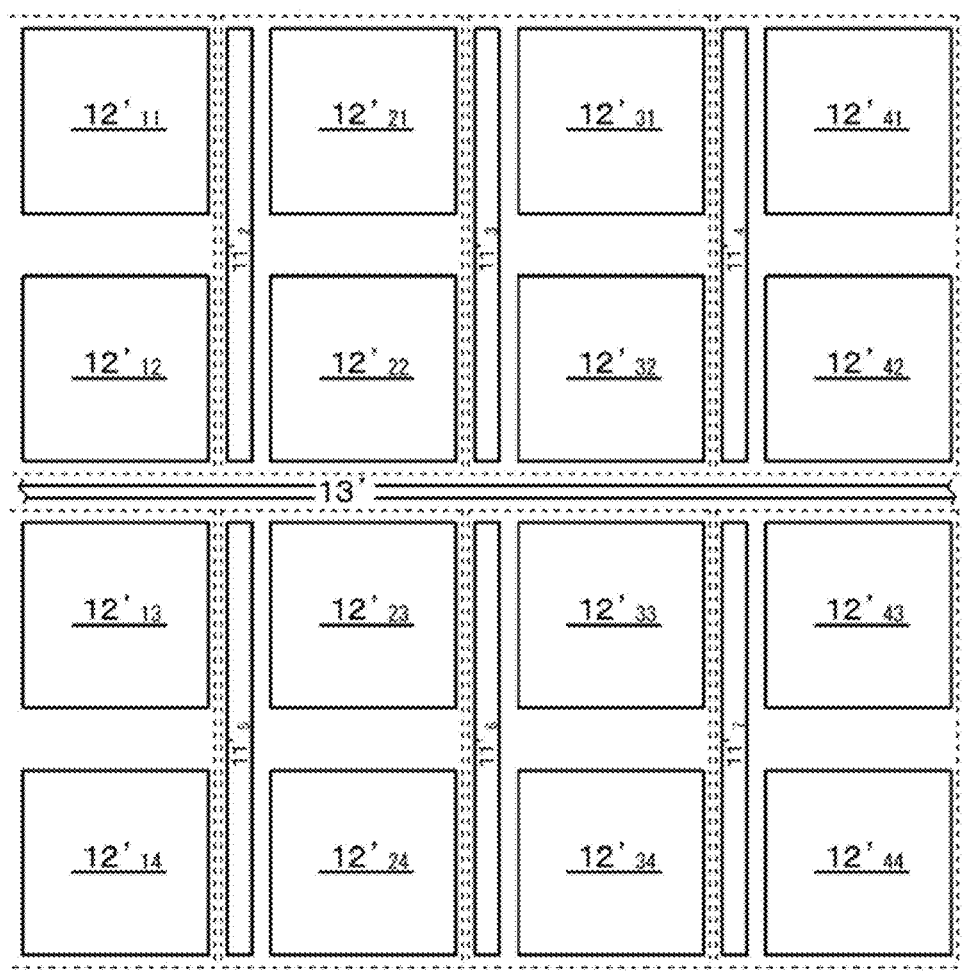

[FIG. 31]
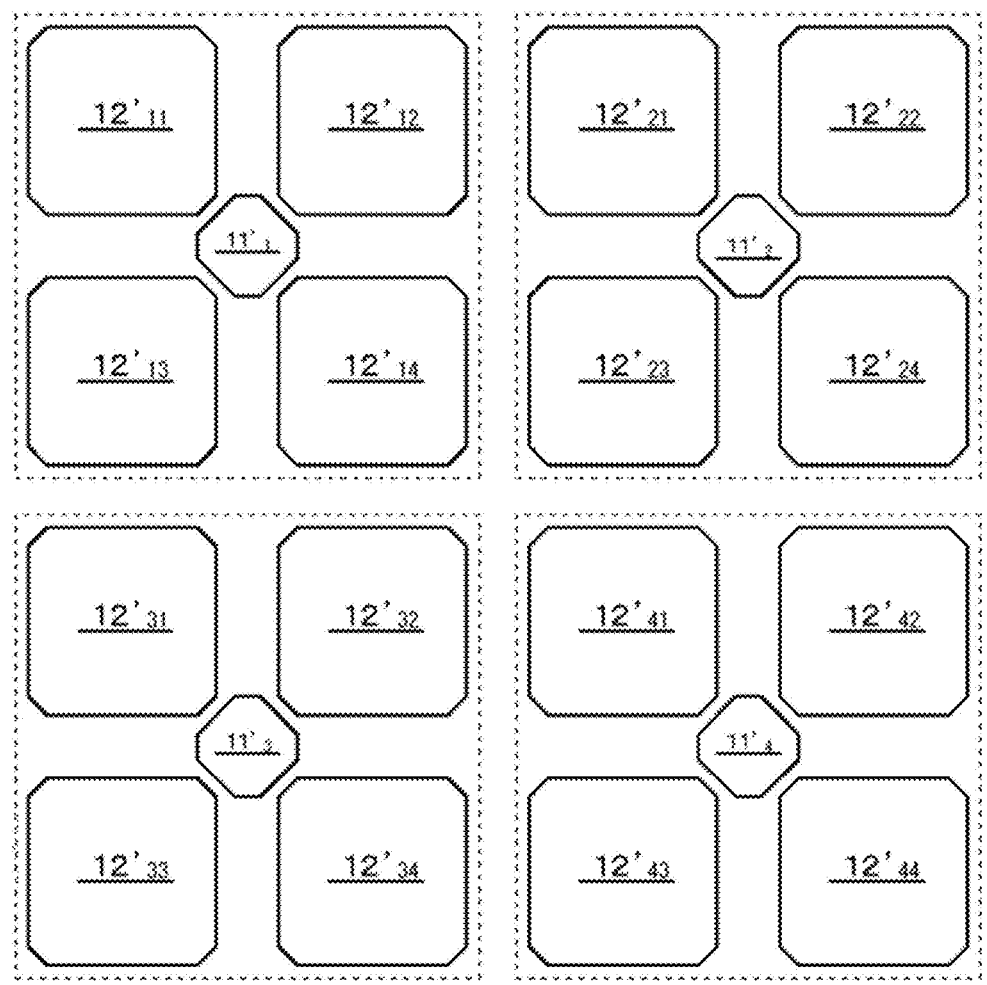

[FIG. 32]
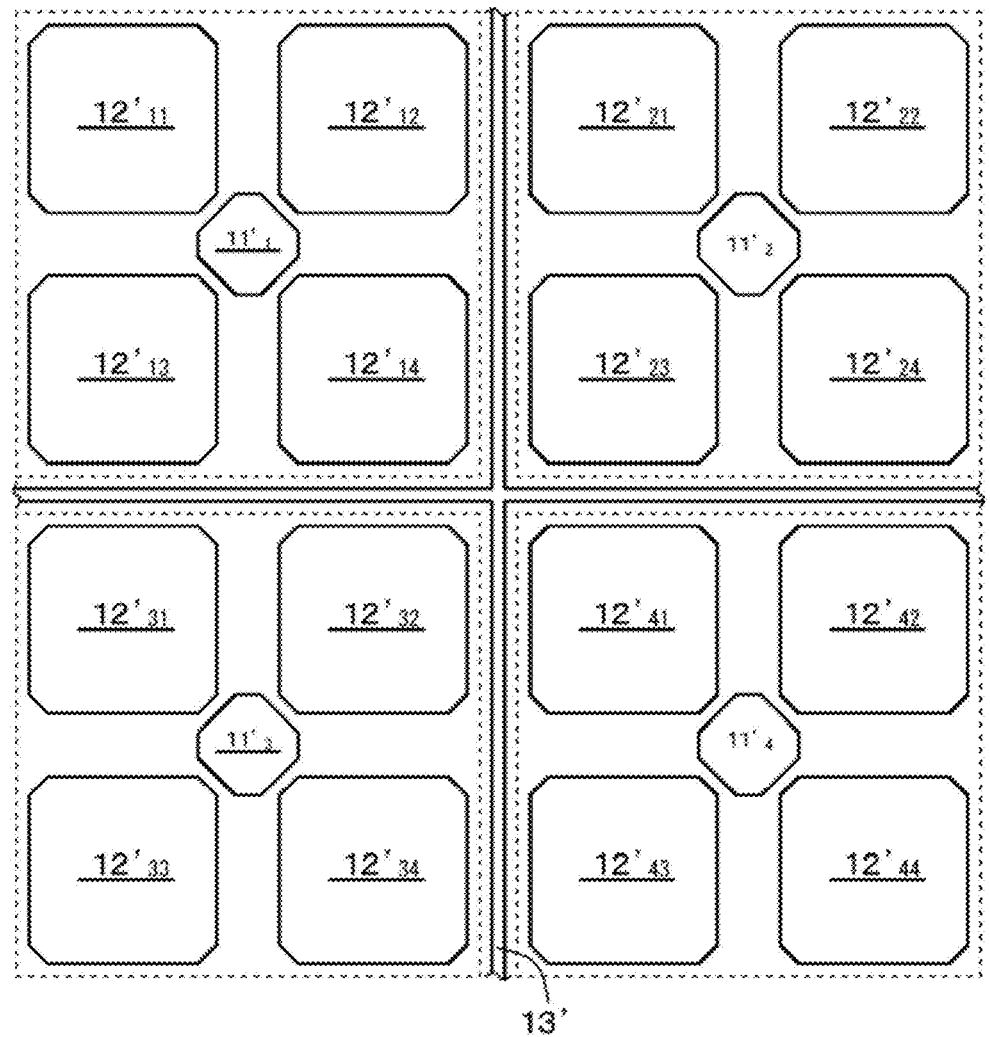

[FIG. 33]
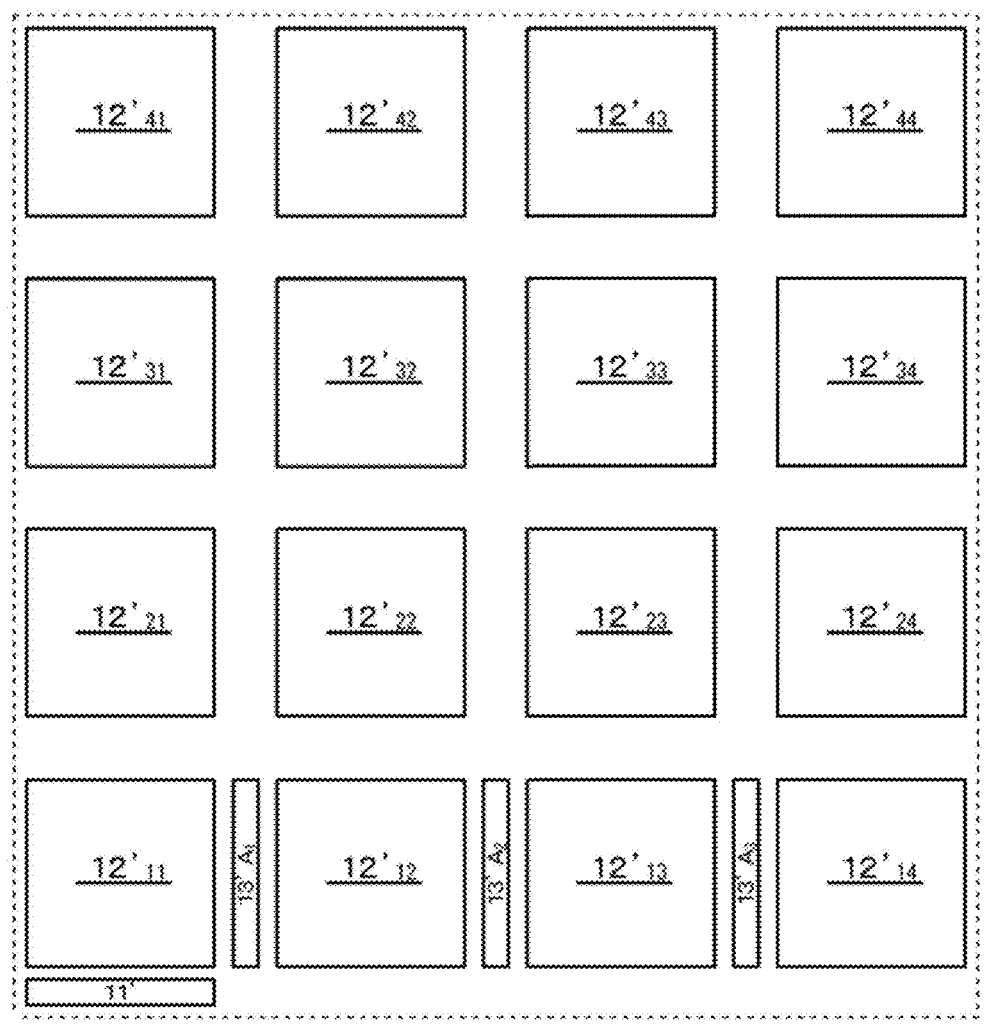

[FIG. 34]
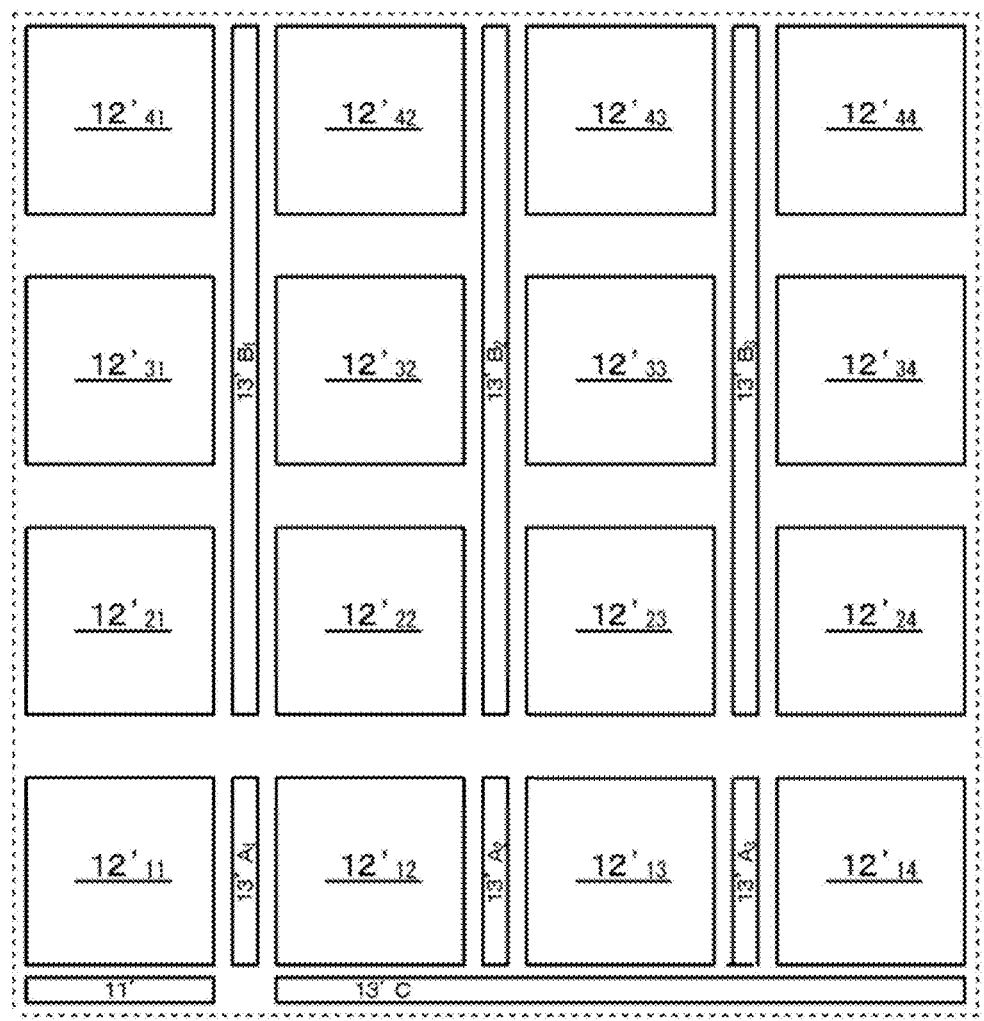

[FIG. 35A]
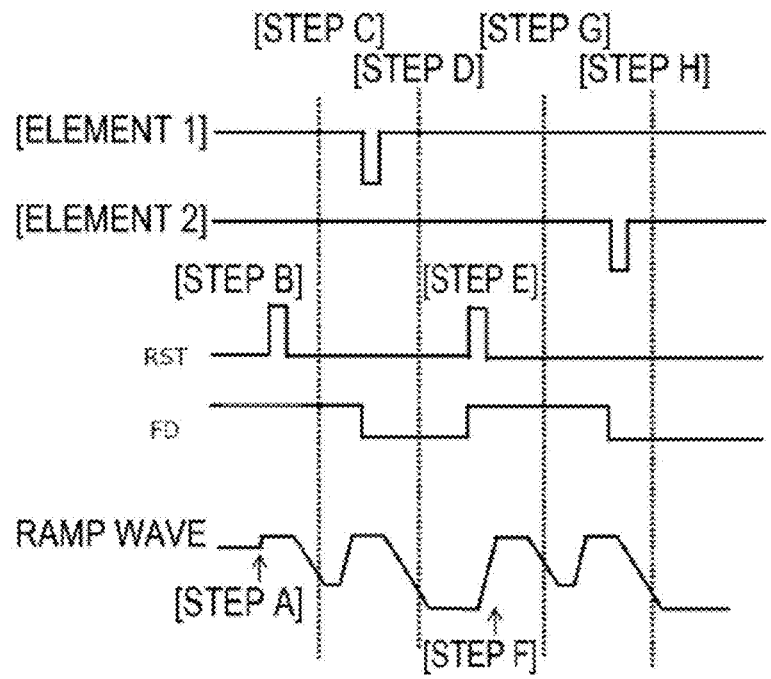
[FIG. 35B]
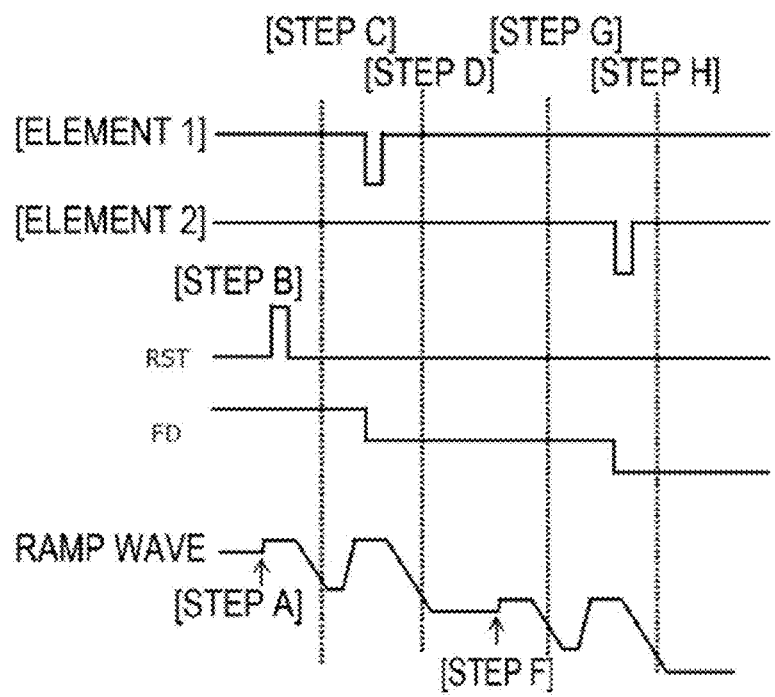

[FIG. 35C]
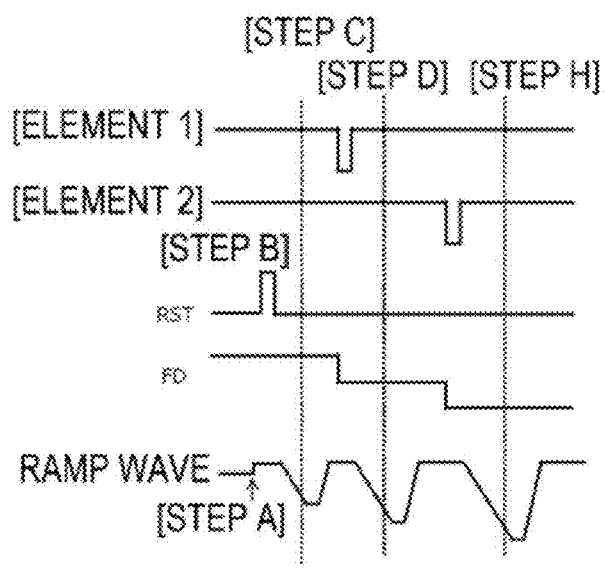

[FIG. 36]
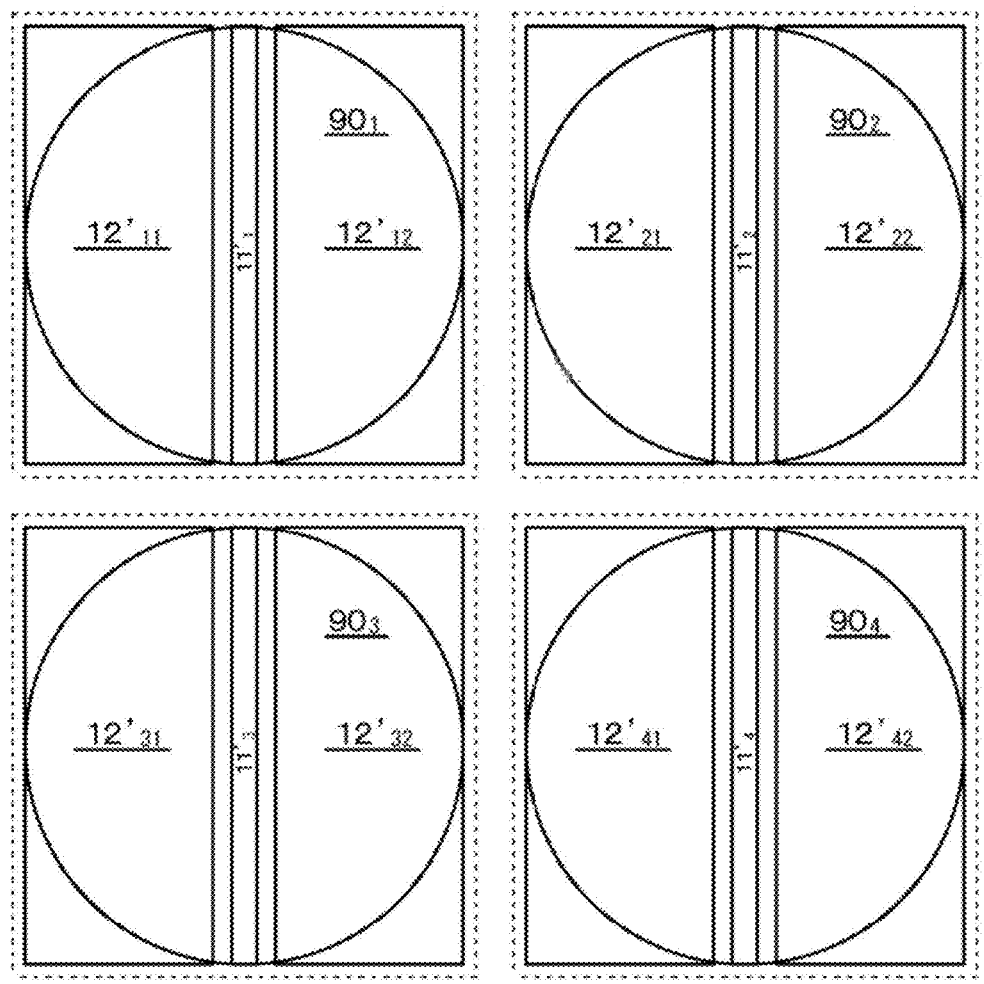

[FIG. 37]
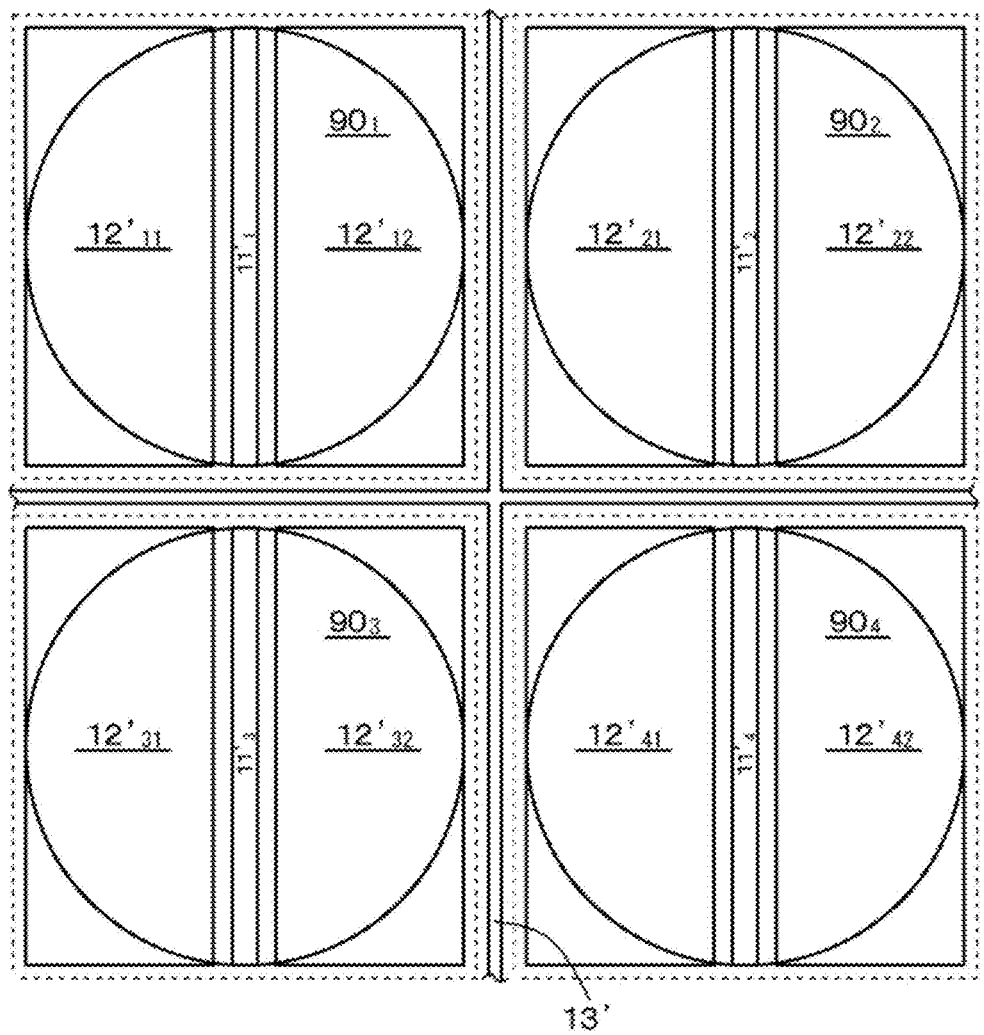

[FIG. 38]
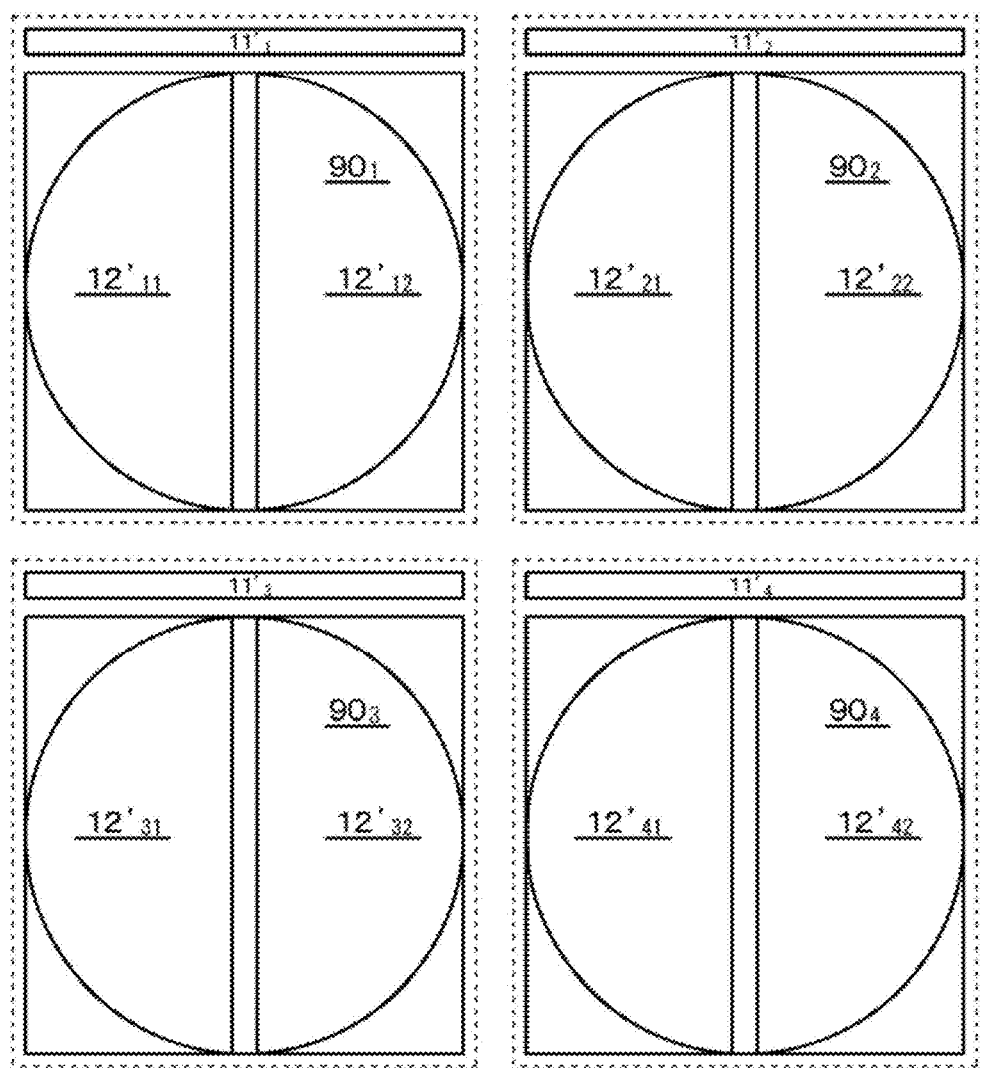

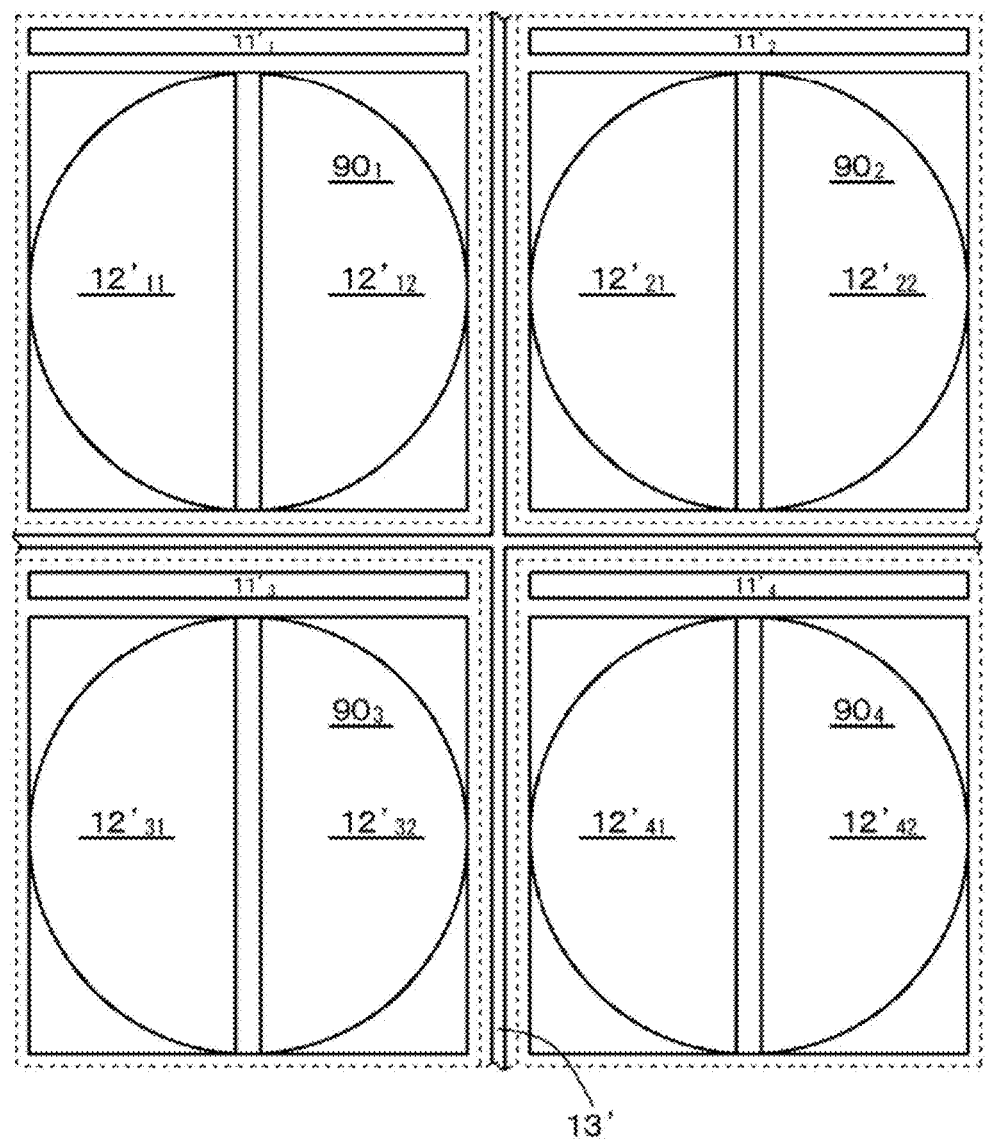
[FIG. 39]

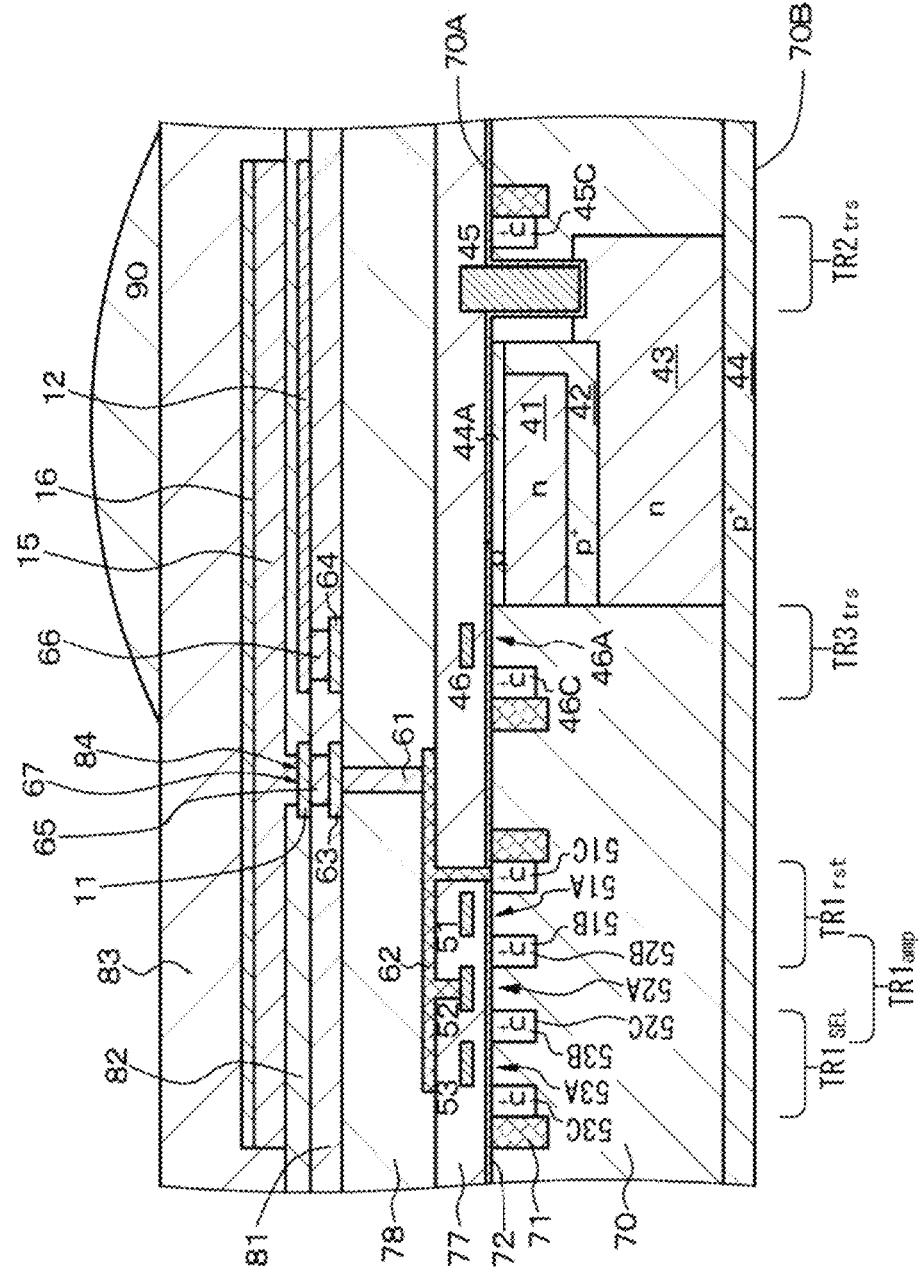
[FIG. 40]

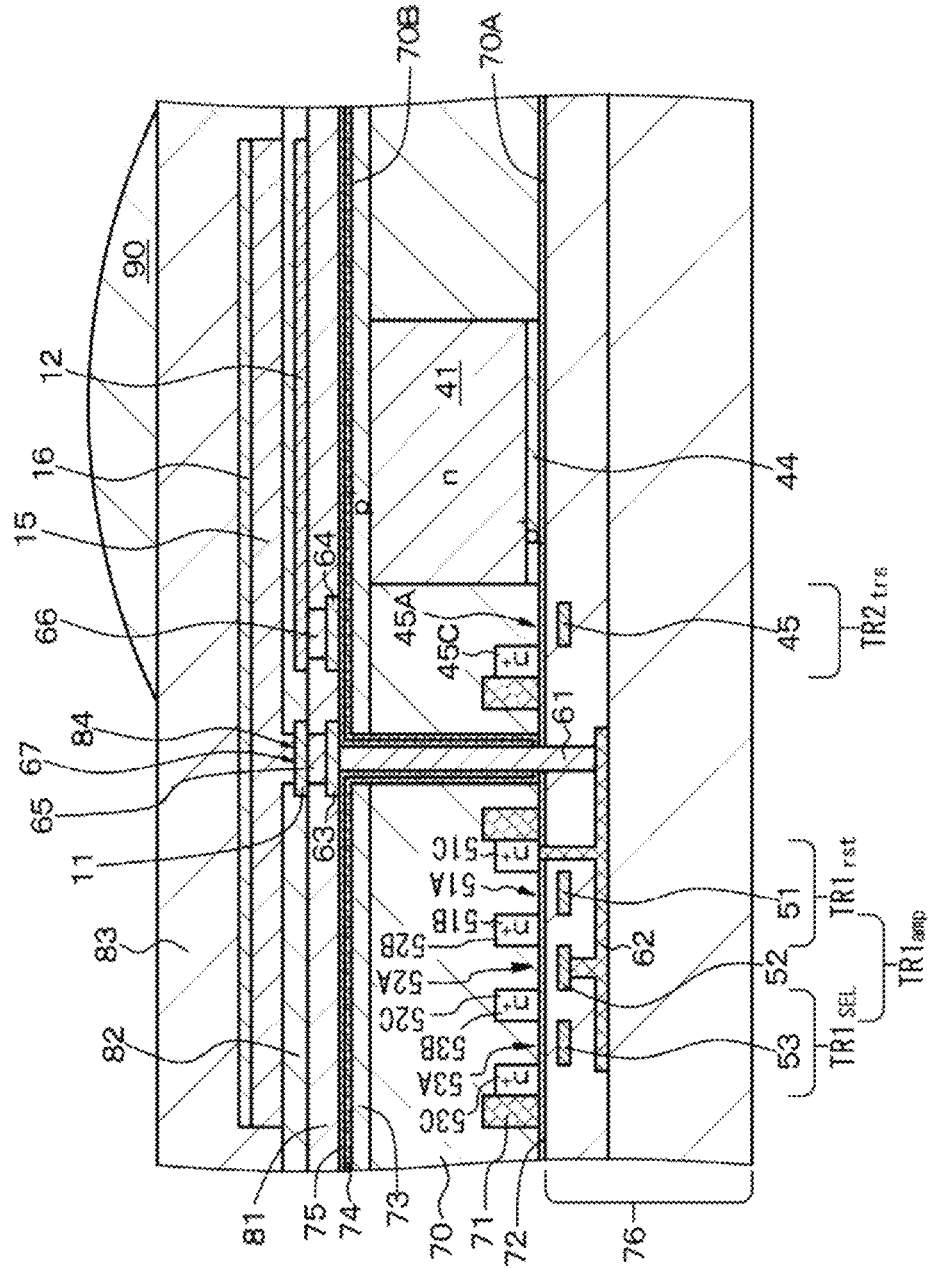
[FIG. 41]

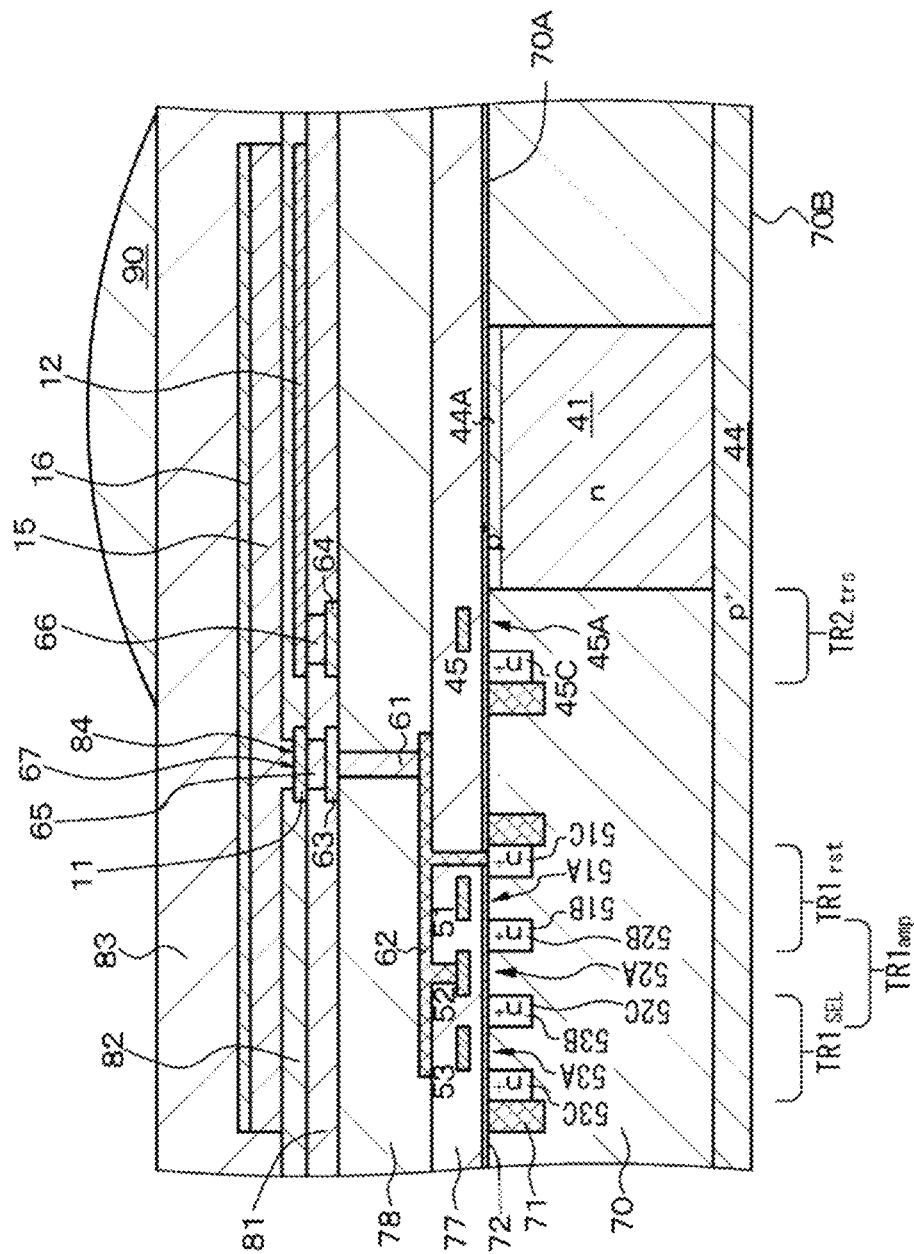
[FIG. 42]

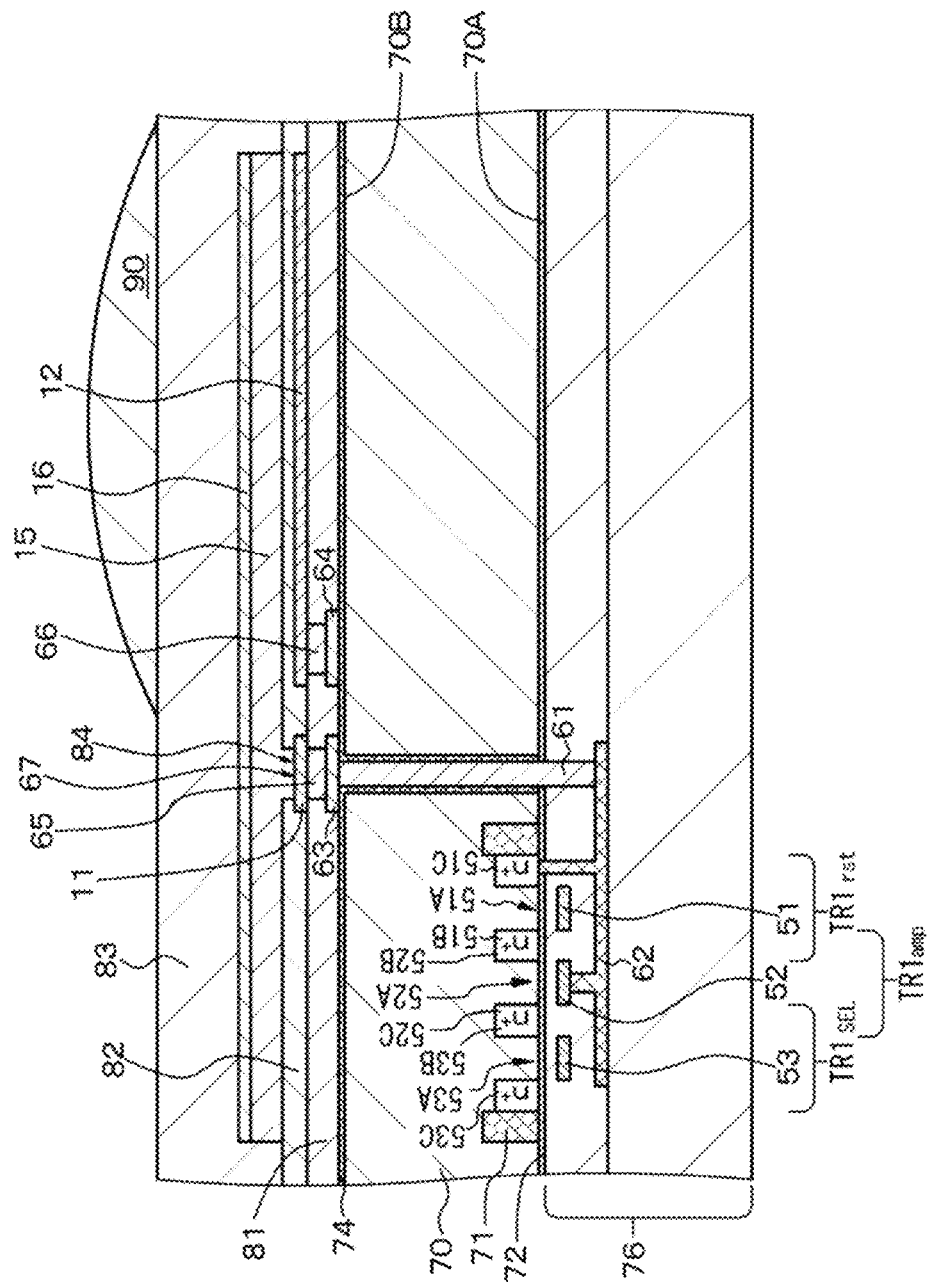
[FIG. 43]

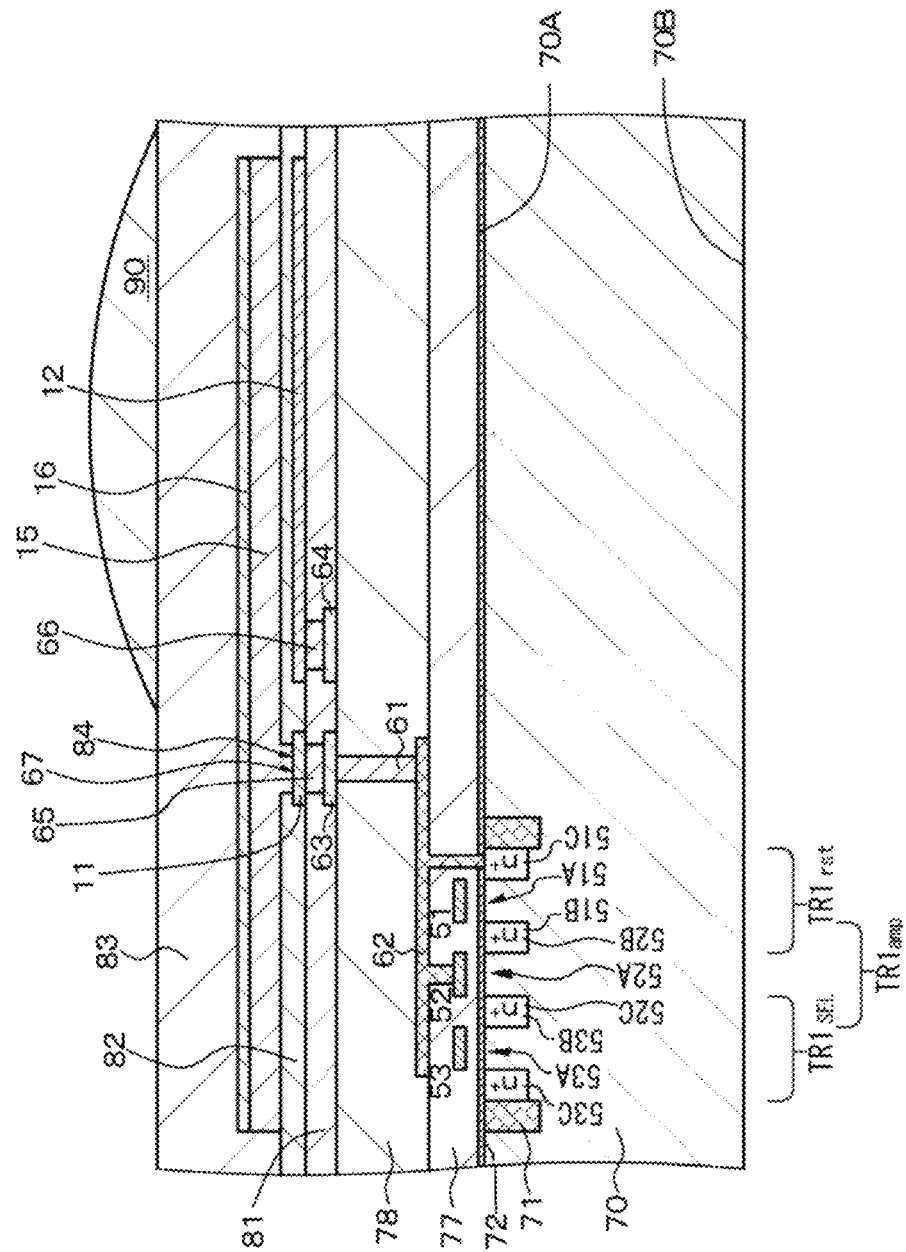
[FIG. 44]

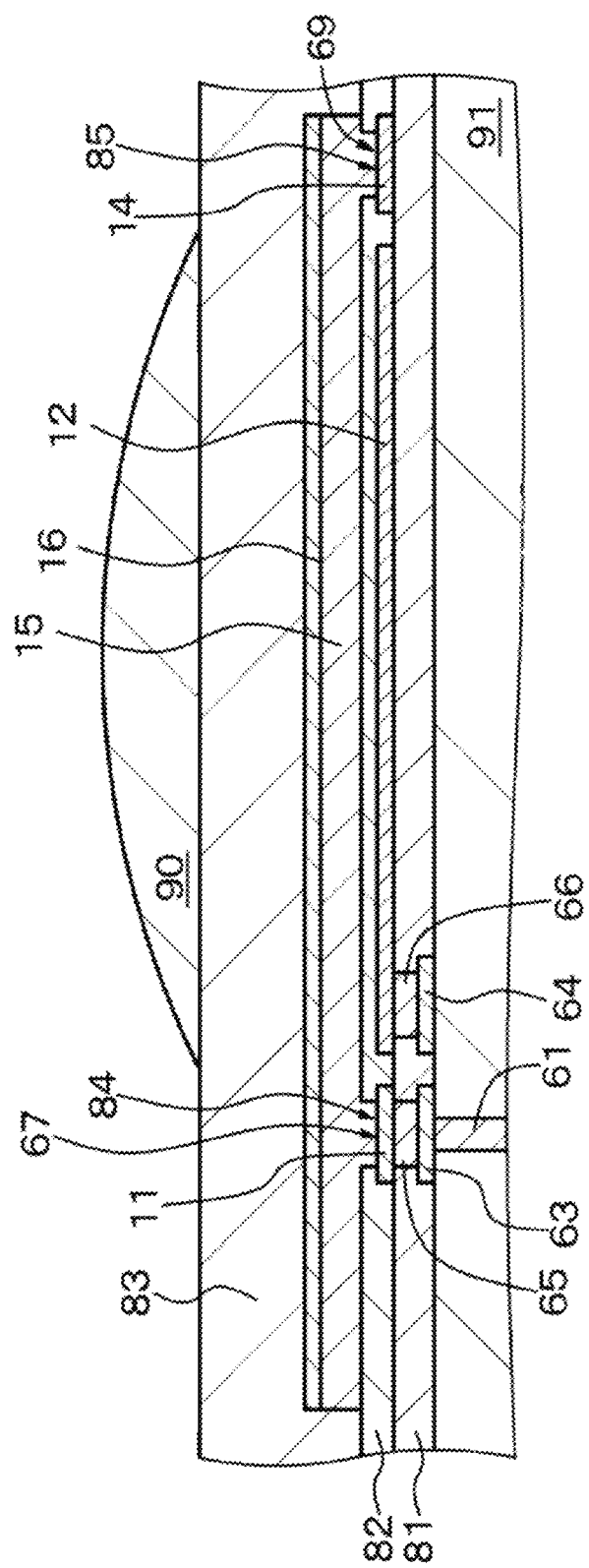
[FIG. 45]

[FIG. 46]
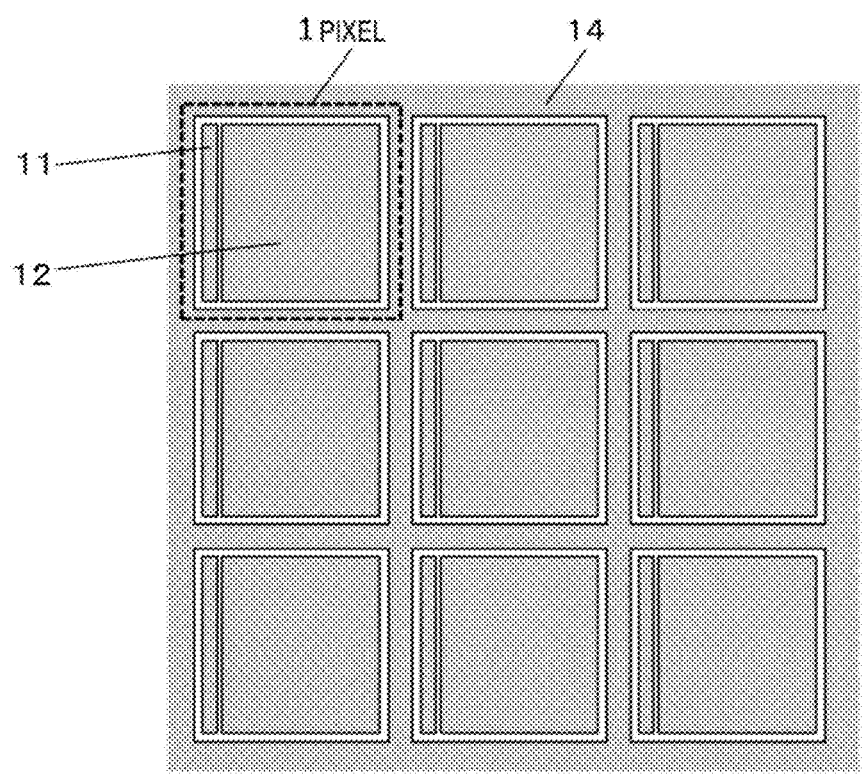

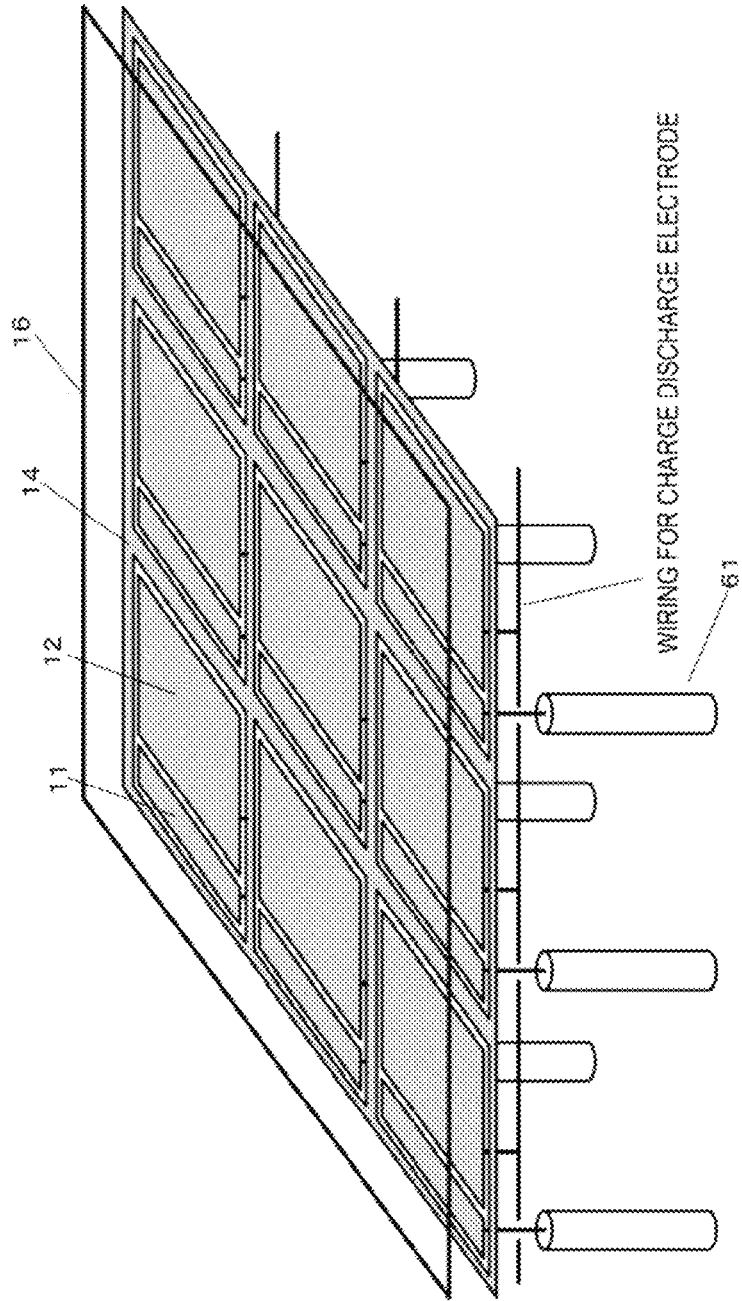

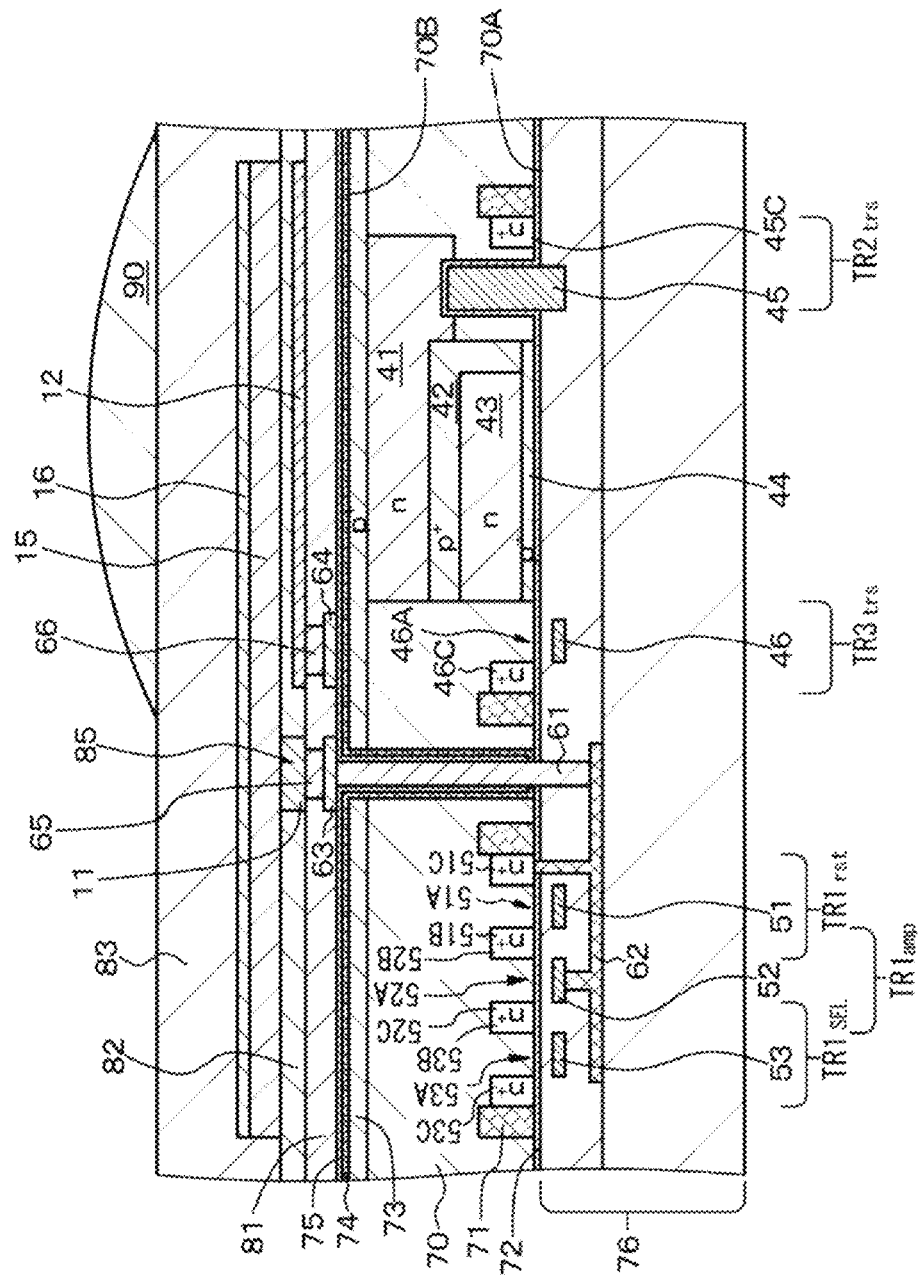

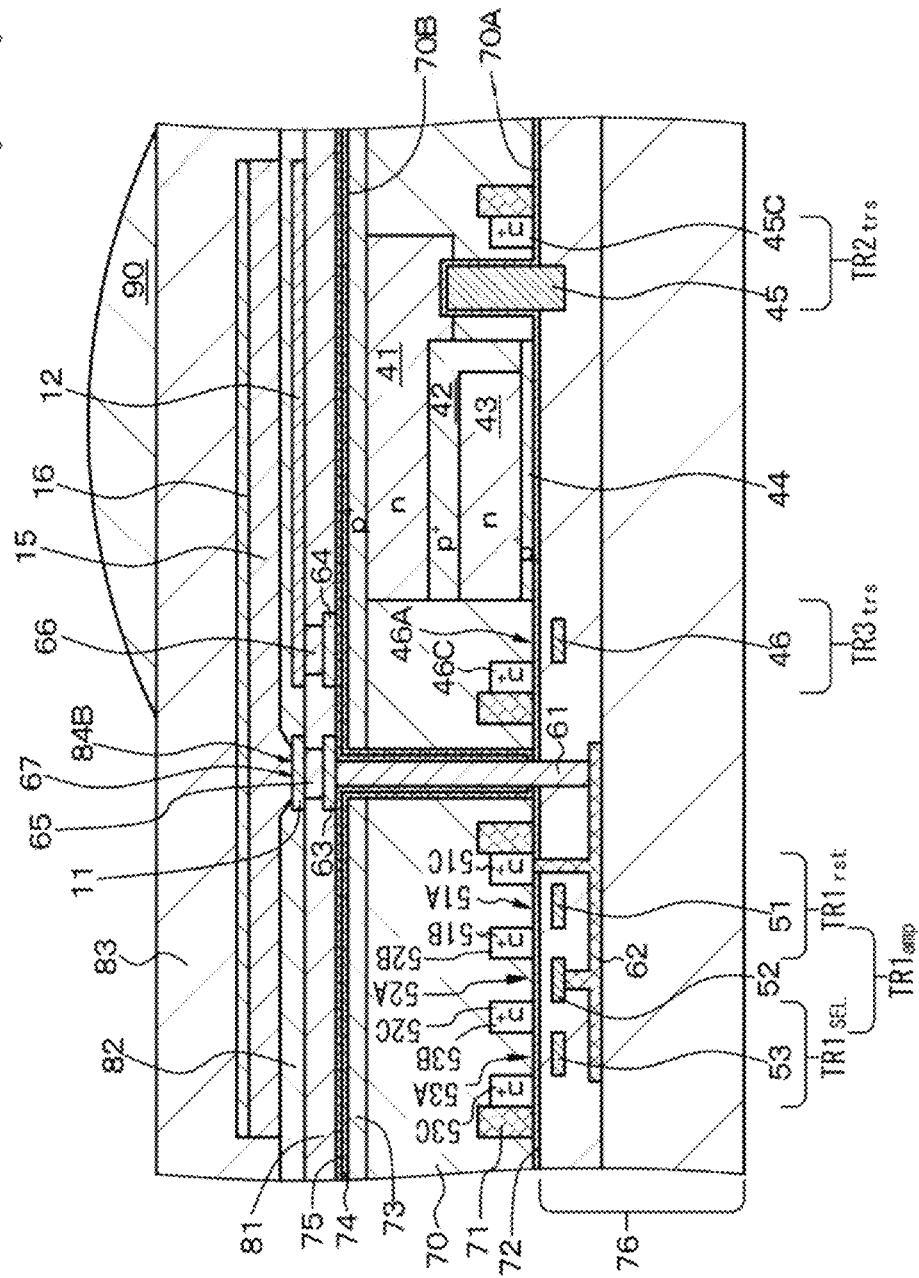

[FIG. 50A]
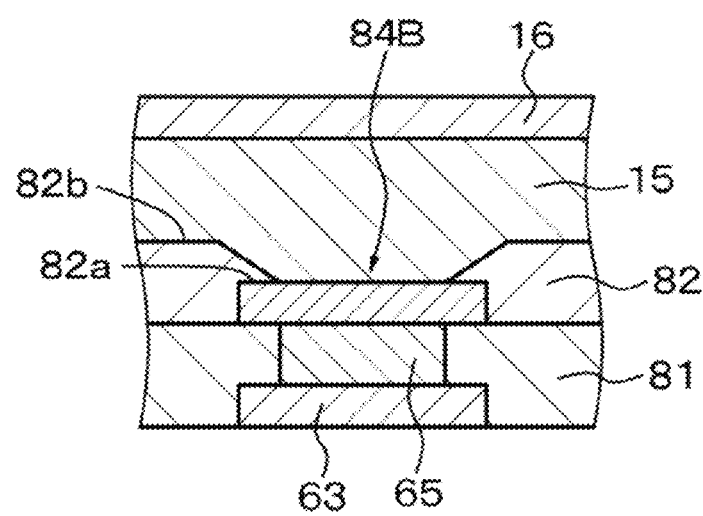
[FIG. 50B]
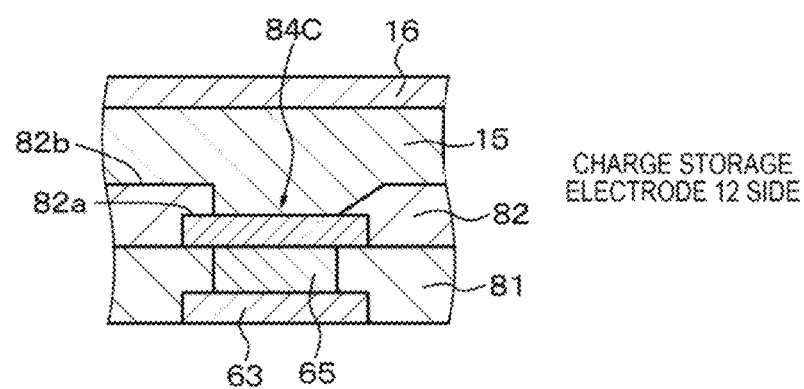
CHARGE STORAGE
ELECTRODE 12 SIDE

[FIG. 50C]
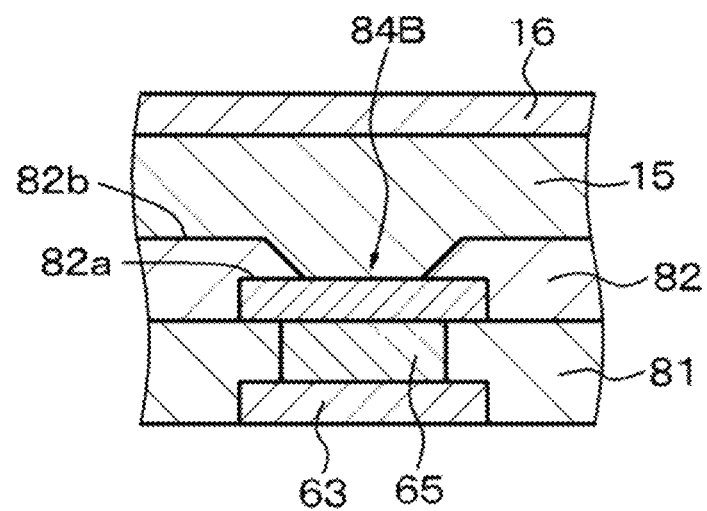

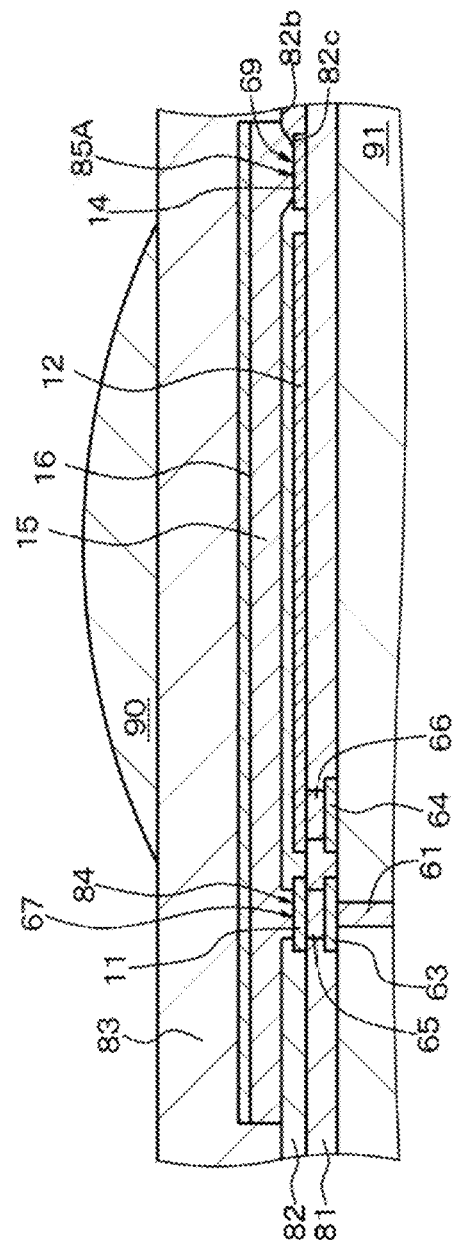
[FIG. 51]

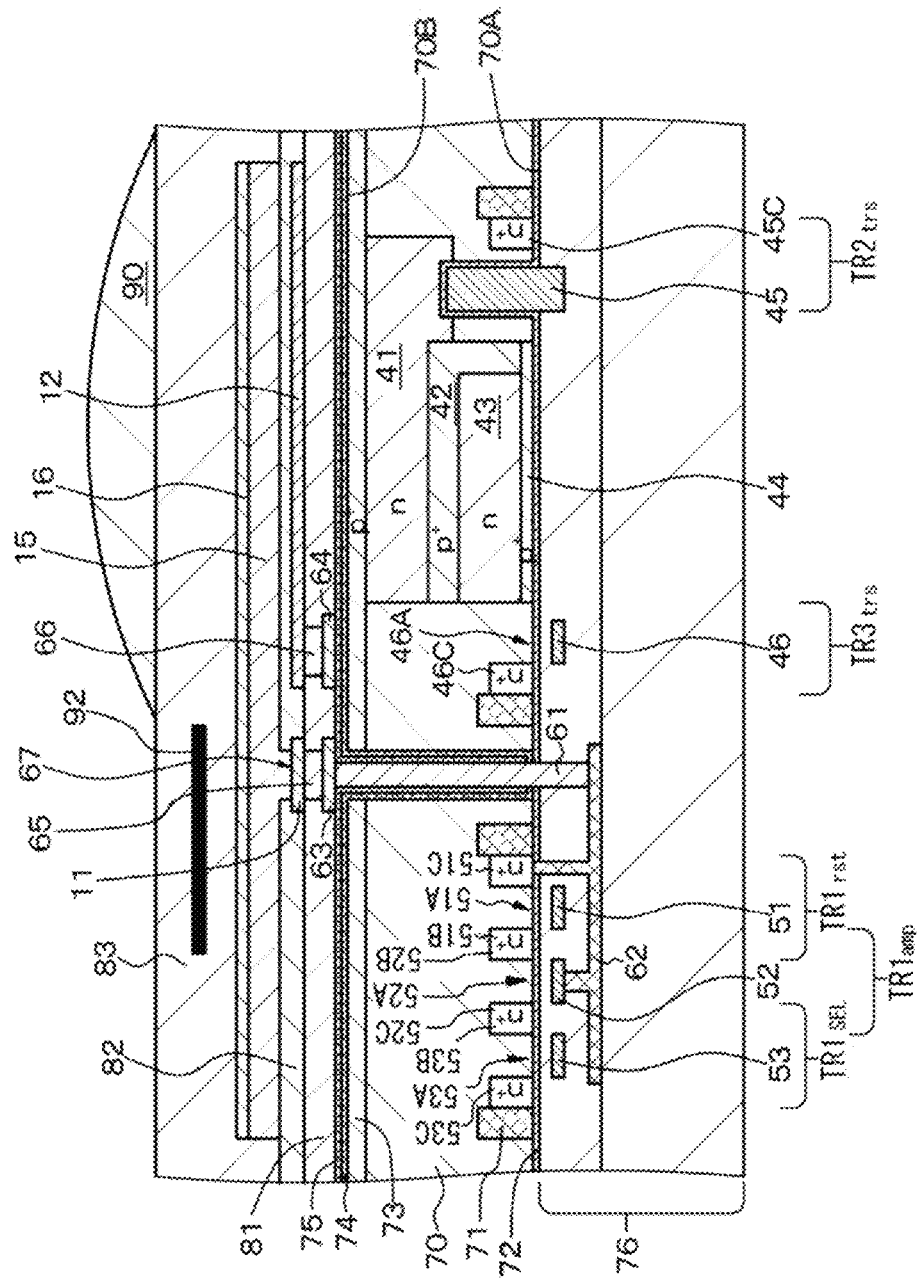
[FIG. 52]

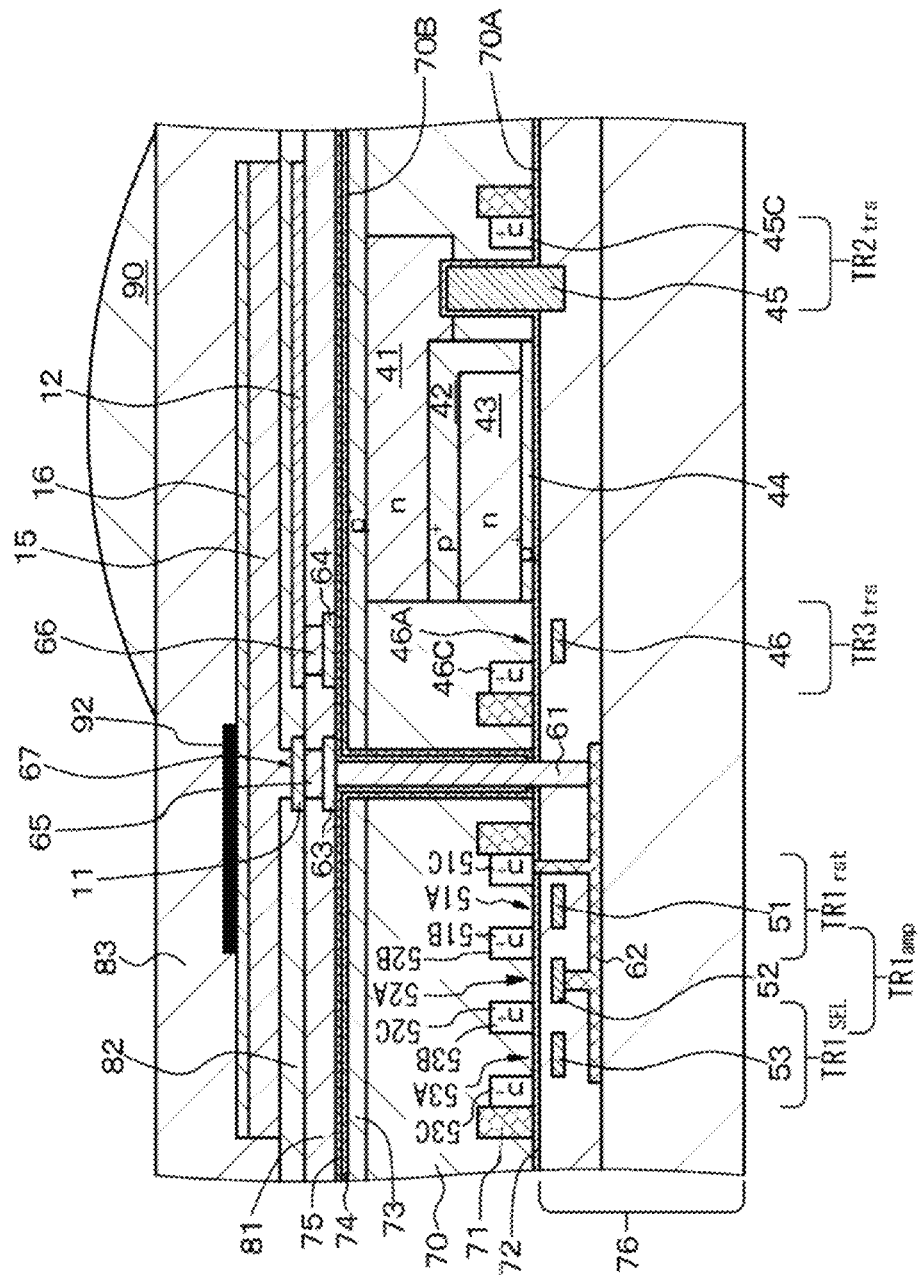
[FIG. 53]

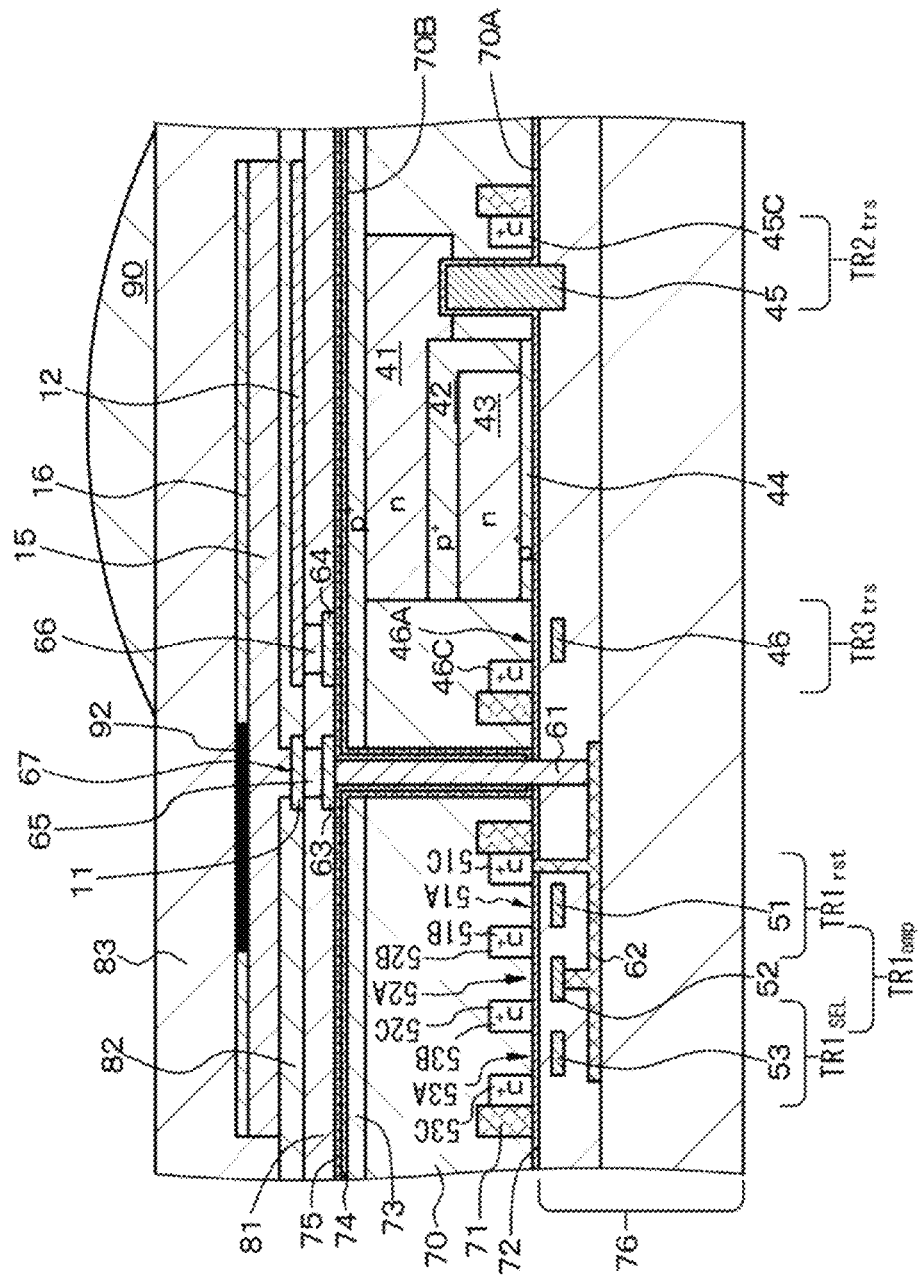
[FIG. 54]

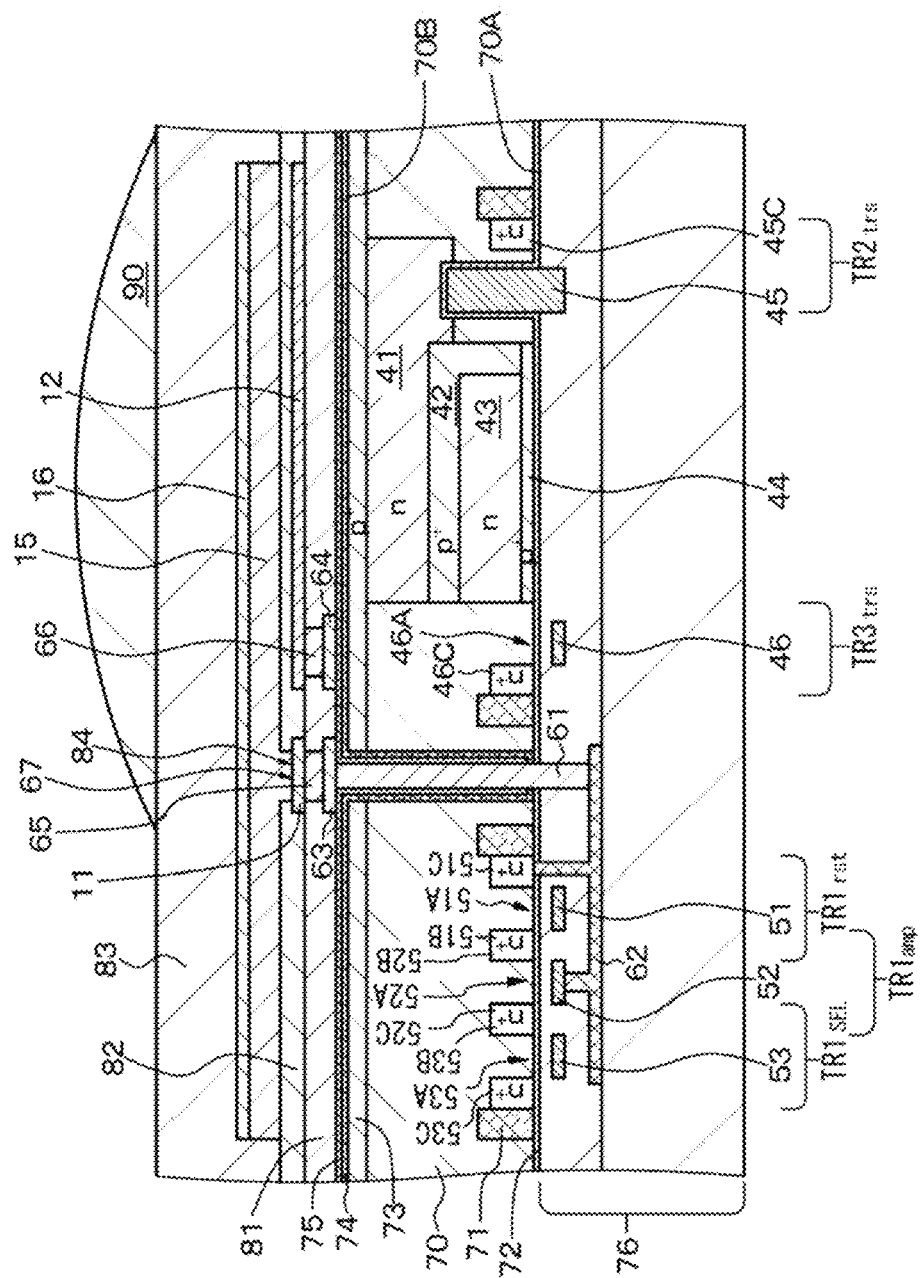

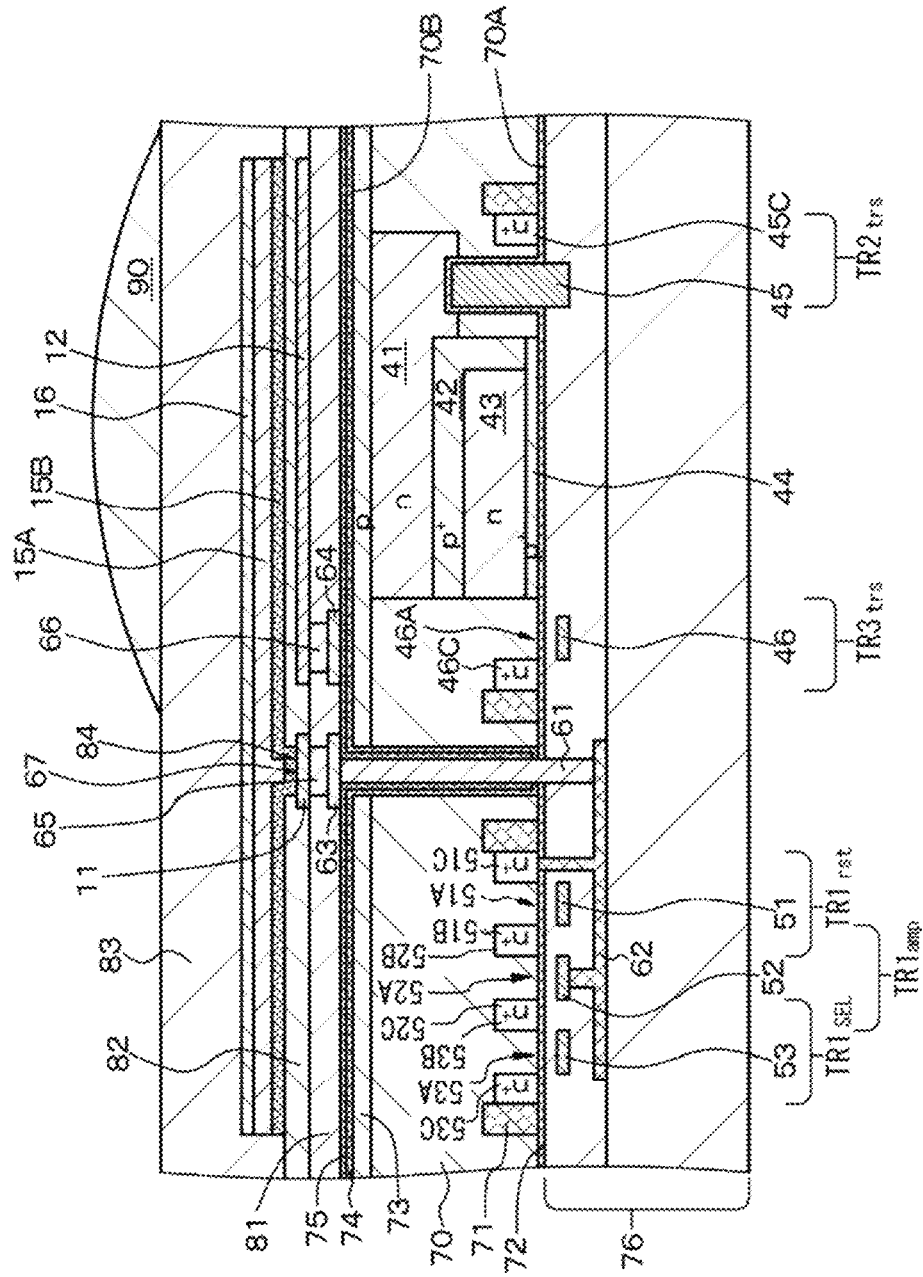
[FIG. 56]

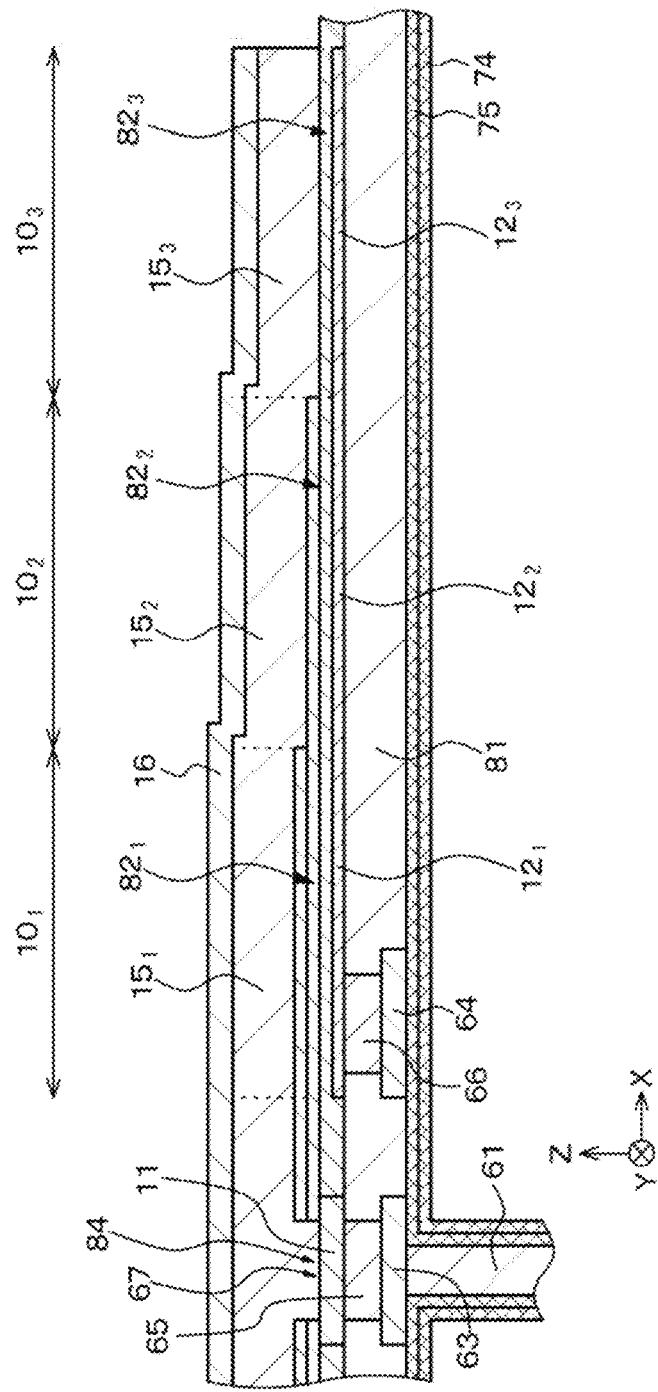
[FIG. 57]

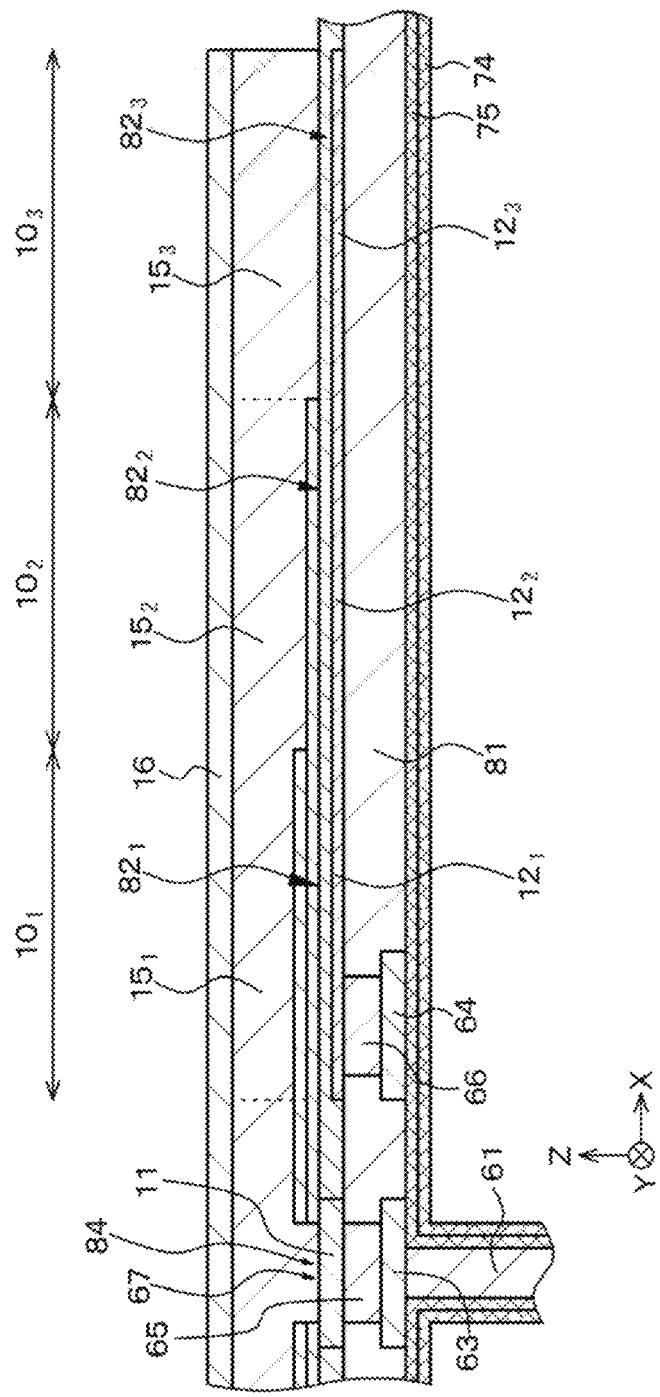
[FIG. 58]

[FIG. 59]
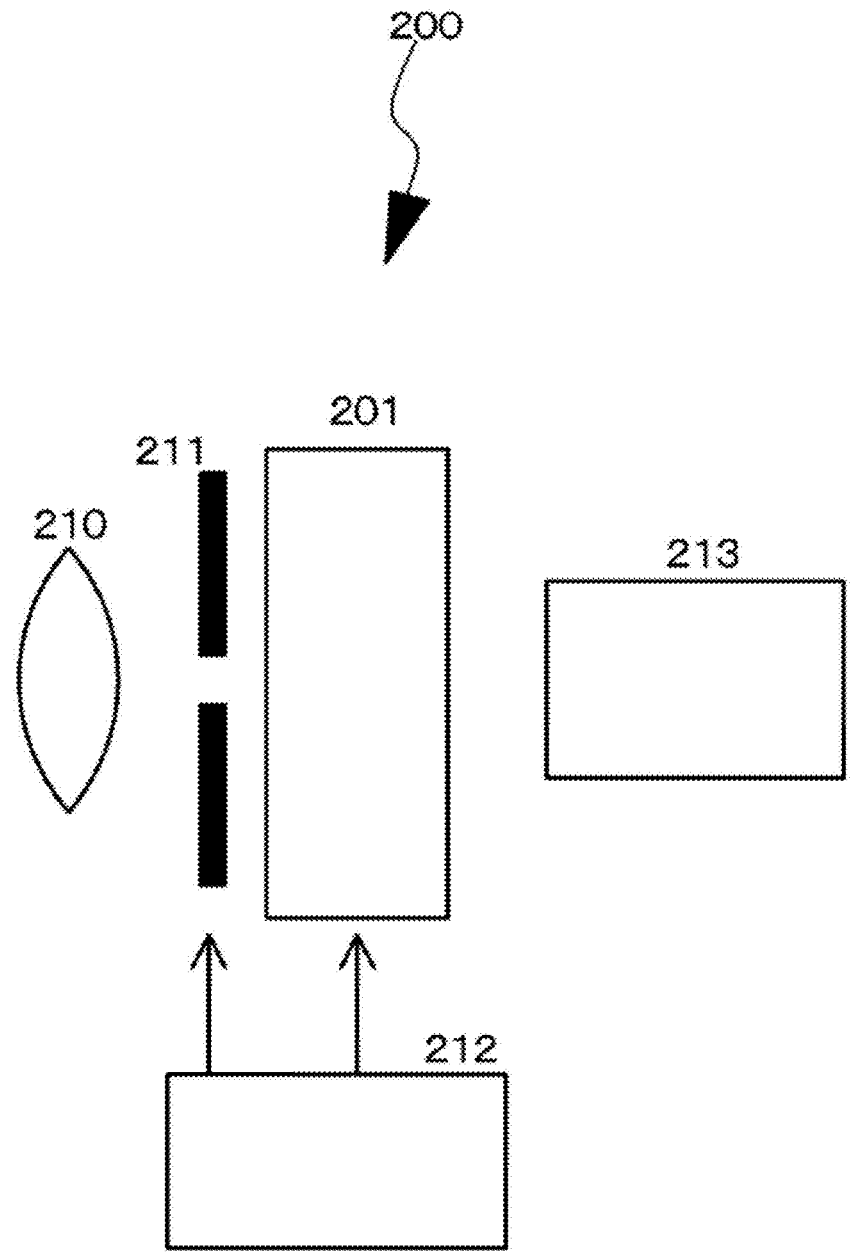

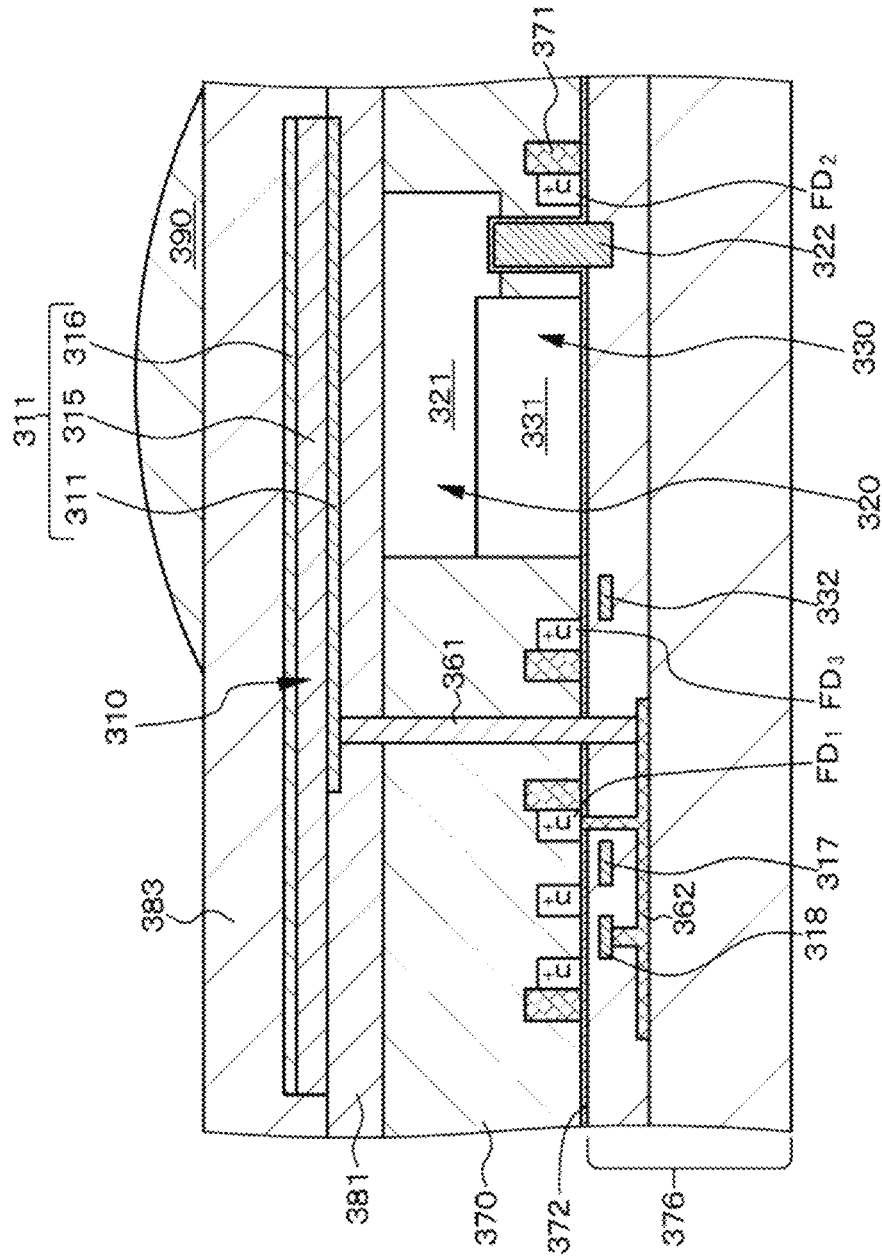

IMAGING ELEMENT, STACKED TYPE IMAGING ELEMENT AND SOLID-STATE IMAGING APPARATUS

CROSS REFERENCE TO RELATED APPLICATIONS

This application is a national stage application under 35 U.S.C. 371 and claims the benefit of PCT Application No. PCT/JP2017/040938 having an international filing date of 14 Nov. 2017, which designated the United States, which PCT application claimed the benefit of Japanese Patent Application No. 2016-226658 filed 22 Nov. 2016, the entire disclosures of each of which are incorporated herein by reference.

TECHNICAL FIELD

The present disclosure relates to an imaging element, a stacked-type imaging element and a solid-state imaging apparatus.

BACKGROUND ART

An imaging element using an organic semiconductor material for a photoelectric conversion layer can photoelectrically convert a specific color (wavelength band). Further, due to having this characteristic, in a case where it is used as an imaging element in a solid-state imaging apparatus, a structure of stacking subpixels (stacked-type imaging element) in which subpixels are formed of a combination of an on-chip color filter (OCCF) and an imaging element, and are two-dimensionally arranged, which is not possible in a conventional solid-state imaging apparatus, can be obtained (e.g., see JP 2011-138927A). Furthermore, since a demosaicing process is not necessary, there is an advantage in that false colors do not occur. Further, in the following description, an imaging element including a photoelectric conversion unit provided on or above a semiconductor substrate will be referred to as a "first-type imaging element" for the sake of convenience, a photoelectric conversion unit forming the first-type imaging element will be referred to as a "first-type photoelectric conversion unit" for the sake of convenience, an imaging element provided in the semiconductor substrate will be referred to as a "second-type imaging element" for the sake of convenience, and the photoelectric conversion unit forming the second-type imaging element will be referred to as a "second-type photoelectric conversion unit" for the sake of convenience.

FIG. 60 shows a structural example of a conventional stacked-type imaging element (stacked-type solid-state imaging apparatus). In the example shown in FIG. 60, a third imaging element 330 which is a second-type imaging element, a third photoelectric conversion unit 331 which is a second-type photoelectric conversion unit forming a second imaging element 320, and a second photoelectric conversion unit 321 are stacked and formed. Furthermore, a first photoelectric conversion unit 311 which is a first-type photoelectric conversion unit is disposed above a semiconductor substrate 370 (specifically, above the second imaging element 320). Here, the first photoelectric conversion unit 311 includes a first electrode 311, a photoelectric conversion layer 315 formed of an organic material, and a second electrode 316, and forms a first imaging element 310 which is a first-type imaging element. For example, blue and red light are photoelectrically converted respectively in the second photoelectric conversion unit 321 and the third photoelectric conversion unit 331 due to a difference in absorption coefficient. Furthermore, for example, green light is photoelectrically converted in the first photoelectric conversion unit 311.

Charges generated by photoelectric conversion in the second photoelectric conversion unit 321 and the third photoelectric conversion unit 331 are temporarily stored in the second photoelectric conversion unit 321 and the third photoelectric conversion unit 331, and then are transferred to a second floating diffusion layer $FD_2$ and a third floating diffusion layer $FD_3$ by a vertical transistor (gate section 322 is shown) and a transfer transistor (gate section 332 is shown), respectively, and further output to an external readout circuit (not shown). These transistors and floating diffusion layers $FD_2$ and $FD_3$ are also formed in the semiconductor substrate 370.

Charges generated by photoelectric conversion in the first photoelectric conversion unit 311 are stored in the first floating diffusion layer $FD_1$ formed in a semiconductor substrate 370 via a contact hole portion 361 and a wiring layer 362. Furthermore, the first photoelectric conversion unit 311 is also connected to a gate section 318 of an amplification transistor that converts the charge amount into a voltage via the contact hole portion 361 and the wiring layer 362. Further, the first floating diffusion layer $FD_1$ forms a part of a reset transistor (gate section 317 is shown). Further, reference number 371 is an element separation region, reference number 372 is an oxide film formed on a surface of the semiconductor substrate 370, reference numbers 376 and 381 are interlayer insulating layers, reference number 383 is a protective layer, and reference number 390 is an on-chip microlens.

CITATION LIST

Patent Literature

PTL 1: JP 2011-138927A

SUMMARY

Technical Problem

Charges generated by the photoelectric conversion in the second photoelectric conversion unit 321 and the third photoelectric conversion unit 331 are temporarily stored in the second photoelectric conversion unit 321 and the third photoelectric conversion unit 331, and then transferred to the second floating diffusion layer $FD_2$ and the third floating diffusion layer $FD_3$. Therefore, the second photoelectric conversion unit 321 and the third photoelectric conversion unit 331 can be completely depleted. However, charges generated by photoelectric conversion in the first photoelectric conversion unit 311 are directly stored in the first floating diffusion layer $FD_1$. Thus, it is difficult for the first photoelectric conversion unit 311 to be completely depleted. Further, as a result of the above, kTC noise increases, random noise worsens, and the image quality of the captured image deteriorates. Furthermore, there is also a strong demand for more easily and reliably transferring charges generated by photoelectric conversion in the first photoelectric conversion unit 311. Moreover, there is also a strong demand for simplification and miniaturization of the configuration and structure in a pixel region in which a plurality of imaging elements are arranged.

Accordingly, it is desirable to provide an imaging element in which a photoelectric conversion unit is disposed on or above a semiconductor substrate and which has a configuration and structure that can suppress degradation of image quality and transfer charges generated by photoelectric conversion more easily and reliably, and a stacked-type imaging element formed of the imaging element, and a solid-state imaging apparatus having the imaging element or the stacked-type imaging element. Furthermore, it is desirable to provide a solid-state imaging apparatus having a plurality of imaging elements in which a photoelectric conversion unit is disposed on or above a semiconductor substrate and which can suppress degradation of image quality, and capable of simplifying and miniaturizing a configuration and a structure in a pixel area where a plurality of the imaging elements are arranged.

Solution to Problem

According to a first aspect to a sixth aspect of the present disclosure, an imaging element includes a photoelectric conversion unit formed by stacking a first electrode, a photoelectric conversion layer and a second electrode, in which the photoelectric conversion unit further includes a charge storage electrode which is disposed to be spaced apart from the first electrode and disposed opposite to the photoelectric conversion layer via an insulating layer, the photoelectric conversion unit is formed of N (where N≥2) number of photoelectric conversion unit segments, the photoelectric conversion layer is formed of N number of photoelectric conversion layer segments, and the insulating layer is formed of N number of insulating layer segments.

In the imaging element according to the first aspect to the third aspect of the present disclosure, the charge storage electrode is formed of N number of charge storage electrode segments.

In the imaging element according to the forth aspect to fifth aspect of the present disclosure, the charge storage electrode is formed of N number of charge storage electrode segments which are disposed to be spaced apart from each other, an $n^{th}$ (where n=1, 2, 3 . . . , N) photoelectric conversion unit segment is formed of an $n^{th}$ charge storage electrode segment, an $n^{th}$ insulating layer segment and an $n^{th}$ photoelectric conversion layer segment, and as a value of n increases, the $n^{th}$ photoelectric conversion unit segment is located farther from the first electrode.

In the imaging element according to the first aspect of the present disclosure, a thickness of the insulating layer segment gradually changes from a first photoelectric conversion unit segment to an $N^{th}$ photoelectric conversion unit segment.

In the imaging element according to the second aspect of the present disclosure, a thickness of the photoelectric conversion layer segment gradually changes from a first photoelectric conversion unit segment to a $N^{th}$ photoelectric conversion unit segment.

In the imaging element according to the third aspect of the present disclosure, materials forming the insulating layer segments are different in adjacent photoelectric conversion unit segments.

In the imaging element according to the fourth aspect of the present disclosure, materials forming the charge storage electrode segments are different in adjacent photoelectric conversion unit segments.

In the imaging element according to the fifth aspect of the present disclosure, an area of the charge storage electrode segment gradually decreases from a first photoelectric conversion unit segment to an $N^{th}$ photoelectric conversion unit segment. Further, the area may be reduced continuously or in steps.

According to the sixth aspect of the present disclosure, an imaging element includes a photoelectric conversion unit formed by stacking a first electrode, a photoelectric conversion layer and a second electrode, the photoelectric conversion unit further includes a charge storage electrode which is disposed to be spaced apart from the first electrode and disposed opposite to the photoelectric conversion layer via an insulating layer, in a case in which a stacking direction of the charge storage electrode, the insulating layer, and the photoelectric conversion layer is defined as a Z direction and a direction away from the first electrode is defined as an X direction, a cross-sectional area of a stacked portion when the stacked portion in which the charge storage electrode, the insulating layer, and the photoelectric conversion layer are stacked is cut in a YZ virtual plane varies depending on a distance from the first electrode.

Further, the cross sectional area may vary continuously or in steps.

A stacked-type imaging element according to an aspect of the present disclosure includes at least one imaging element according to the first aspect to the sixth aspect of the present disclosure.

According to the first aspect of the present disclosure, a solid-state imaging apparatus includes a photoelectric conversion unit formed by stacking a first electrode, a photoelectric conversion layer and a second electrode, the photoelectric conversion unit further includes a plurality of imaging elements each of which includes a charge storage electrode which is disposed to be spaced apart from the first electrode and disposed opposite to the photoelectric conversion layer via an insulating layer, an imaging element block is formed of a plurality of the imaging elements, and the first electrode is shared by a plurality of the imaging elements forming the imaging element block.

A solid-state imaging apparatus according to the second aspect includes a plurality of the imaging elements according to the first to the seventh aspect of the present disclosure, an imaging element block is formed of a plurality of the imaging elements, and the first electrode is shared by a plurality of the imaging elements forming the imaging element block.

A solid-state imaging apparatus according to the third aspect includes a plurality of the imaging elements according to the first aspect to the sixth aspect of the present disclosure. In addition, a solid-state imaging apparatus according to the fourth aspect of the present disclosure includes a plurality of the stacked-type imaging element according an aspect of the present disclosure.

In accordance with embodiments of the present disclosure, an imaging element includes a photoelectric conversion unit. The photoelectric conversion unit may include a first electrode, a photoelectric conversion layer, a second electrode, an insulating layer including N number of insulating layer segments, wherein N is greater than or equal to two, and a charge storage electrode spaced apart from the first electrode and disposed such that the insulating layer is between the charge storage electrode and the photoelectric conversion layer. The photoelectric conversion unit may include N number of photoelectric conversion unit segments, where an $n^{th}$ (where n=1, 2, 3 . . . , N) photoelectric conversion unit segment includes the charge storage electrode, an $n^{th}$ insulating layer segment, and the photoelectric conversion layer. As a value of n increases, the $n^{th}$ photoelectric conversion unit segment is located farther from the first electrode, and a thickness of the insulating layer segment in a first photoelectric conversion unit segment is different from a thickness of the insulating layer segment in an $N^{th}$ photoelectric conversion unit segment.

In accordance with embodiments of the present disclosure an imaging element includes a photoelectric conversion unit. The photoelectric conversion unit includes a first electrode, a photoelectric conversion layer including N number of photoelectric conversion unit segments, wherein N is greater than or equal to two, a second electrode, an insulating layer, and a charge storage electrode spaced apart from the first electrode and disposed such that the insulating layer is between the charge storage electrode and the photoelectric conversion layer. The photoelectric conversion unit may include N number of photoelectric conversion unit segments, where an $n^{th}$ (where n=1, 2, 3 . . . , N) photoelectric conversion unit segment is formed the charge storage electrode, an $n^{th}$ photoelectric conversion layer segment, and the insulating layer. As a value of n increases, the $n^{th}$ photoelectric conversion unit segment is located farther from the first electrode, and a thickness of the photoelectric conversion layer segment in a first photoelectric conversion unit segment is different from a thickness of the photoelectric conversion layer segment in an $N^{th}$ photoelectric conversion unit segment.

In accordance with embodiments of the present disclosure an imaging element includes a photoelectric conversion unit. The photoelectric conversion unit includes a first electrode, a photoelectric conversion layer, a second electrode, an insulating layer including N number of insulating layer segments, wherein N is greater than or equal to two, and a charge storage electrode spaced apart from the first electrode and disposed such that the insulating layer is between the charge storage electrode and the photoelectric conversion layer. The photoelectric conversion unit may include N number of photoelectric conversion unit segments, where an $n^{th}$ (where n=1, 2, 3 . . . , N) photoelectric conversion unit segment is formed of the charge storage electrode, an $n^{th}$ insulating layer segment, and the photoelectric conversion layer segment. As a value of n increases, the $n^{th}$ photoelectric conversion unit segment is located farther from the first electrode, and materials forming the insulating layer segments are different in adjacent photoelectric conversion unit segments.

In accordance with embodiments of the present disclosure, an imaging element includes a photoelectric conversion unit. The photoelectric conversion unit may include a first electrode, a photoelectric conversion layer, a second electrode, an insulating layer, and a charge storage electrode spaced apart from the first electrode and disposed such that the insulating layer is between the charge storage electrode and the photoelectric conversion layer. The charge storage electrode may include N number of charge storage segments spaced apart from each other, where N is greater than or equal to two. The photoelectric conversion unit may include N number of photoelectric conversion unit segments, where an $n^{th}$ (where n=1, 2, 3 . . . , N) photoelectric conversion unit segment is formed of an $n^{th}$ charge storage electrode segment, the insulating layer, and the photoelectric conversion layer segment. As a value of n increases, the $n^{th}$ photoelectric conversion unit segment is located farther from the first electrode, and materials forming the charge storage electrode segments are different in adjacent photoelectric conversion unit segments.

In accordance with embodiments of the present disclosure, an imaging element may include a photoelectric conversion unit. The photoelectric conversion unit may include a first electrode, a photoelectric conversion layer, a second electrode, an insulating layer, and a charge storage electrode spaced apart from the first electrode and disposed such that the insulating layer is between the charge storage electrode and the photoelectric conversion layer. The charge storage electrode may include N number of charge storage segments, where N is greater than or equal to two. The photoelectric conversion unit may include N number of photoelectric conversion unit segments. An $n^{th}$ (where n=1, 2, 3 . . . , N) photoelectric conversion unit segment is formed of an $n^{th}$ charge storage electrode segment, the insulating layer, and the photoelectric conversion layer. As a value of n increases, the $n^{th}$ photoelectric conversion unit segment is located farther from the first electrode, and an area of the charge storage electrode segment in a first photoelectric conversion unit segment is different from an area of the charge storage electrode segment in an $N^{th}$ photoelectric conversion unit segment.

In accordance with embodiments of the present disclosure, an imaging element includes a photoelectric conversion unit. The photoelectric conversion unit includes a first electrode, a photoelectric conversion layer, a second electrode, an insulating layer, and a charge storage electrode spaced apart from the first electrode and disposed such that the insulating layer is between the charge storage electrode and the photoelectric conversion layer via. In a case in which a stacking direction of the charge storage electrode, the insulating layer, and the photoelectric conversion layer is defined as a Z direction and a direction away from the first electrode is defined as an X direction, a cross-sectional area of a stacked portion including the charge storage electrode, the insulating layer, and the photoelectric conversion layer in a YZ virtual plane varies based on a distance from the first electrode.

In accordance with embodiments of the present disclosure, an imaging apparatus includes a photoelectric conversion unit. The photoelectric conversion unit may include a first electrode, a photoelectric conversion layer, a second electrode, insulating layer, and a plurality of imaging elements each of which includes a charge storage electrode which is spaced apart from the first electrode and disposed such that the insulating layer is between the charge storage electrode and the photoelectric conversion layer, An imaging element block may include the plurality of the imaging elements and the first electrode is shared by the plurality of the imaging elements of the imaging element block.

Advantageous Effects of Invention

The imaging element according to the first to sixth aspects of the present disclosure, the imaging element according to an aspect of the present disclosure forming the stacked-type imaging element according to an aspect of the present disclosure, and the imaging element forming the solid-state imaging apparatus according to the first to fourth aspects of the present disclosure include a charge storage electrode which is disposed to be spaced apart from the first electrode and is disposed opposite to the photoelectric conversion layer via an insulating layer, and thus when the photoelectric conversion unit is irradiated with light and photoelectric conversion occurs in the photoelectric conversion unit, charges of the photoelectric conversion layer can be stored. Therefore, at the start of exposure, it becomes possible to completely deplete the charge storage portion and remove charges. As a result, it is possible to suppress occurrence of a phenomenon in which the kTC noise increases, the random noise worsens, and degradation of the image quality is caused. Furthermore, in the imaging element according to the first to sixth aspects of the present disclosure, the stacked-type imaging element according to an aspect of the present disclosure to which the imaging element is applied, and the solid-state imaging apparatus according to the first to fourth aspects of the present disclosure, the thickness of the insulating layer segment is defined, or the thickness of the photoelectric conversion layer segment is defined, or materials forming the insulating layer segments are different, or the materials forming the charge storage electrode segment are different, or the area of the charge storage electrode segment is defined, or the cross sectional area of the stacked portion is defined, and thus a type of charge transfer gradient is formed, and charges generated by photoelectric conversion can be transferred to the first electrode more easily and reliably. Further, as a result, it is possible to prevent the occurrence of afterimages and transfer residues. Moreover, in the solid-state imaging apparatus according to the first to second aspects of the present disclosure, since the first electrode is shared by a plurality of the imaging elements forming the imaging element block, the configuration and structure of a pixel area in which a plurality of imaging elements are arranged can be simplified and miniaturized. Further, the effects described in this specification are merely examples and are not limited, and additional effects may be provided.

BRIEF DESCRIPTION OF DRAWINGS

FIG. 1 is schematic partial sectional view of an imaging element and stacked-type imaging element of Embodiment 1.

FIG. 2 is a schematic partial sectional view of an expanded part in which a charge storage electrode, a photoelectric conversion layer and a second electrode are stacked in the imaging element of Embodiment 1.

FIG. 3 is an equivalent circuit diagram of the imaging element and stacked-type imaging element of Embodiment 1.

FIG. 4 is an equivalent circuit diagram of the imaging element and stacked-type imaging element of Embodiment 1.

FIG. 5 is a schematic arrangement view of a first electrode and a charge storage electrode forming the imaging element of Embodiment 1 and a transistor forming a control unit.

FIG. 6 is a view schematically showing a state of a potential at each part during operation of the imaging element of Embodiment 1.

FIG. 7 is a schematic arrangement view of the first electrode and charge storage electrode forming the imaging element of Embodiment 1.

FIG. 8 is a schematic perspective view of the first electrode, the charge storage electrode, a second electrode and a contact hole portion forming the imaging element of Embodiment 1.

FIG. 9 is a conceptual diagram of a solid-state imaging apparatus of Embodiment 1.

FIG. 10 is an equivalent circuit diagram of a modified example of the imaging element and stacked-type imaging element of Embodiment 1.

FIG. 11 is a schematic arrangement view of the first electrode and the charge storage electrode forming the modified example of the imaging element of Embodiment 1 shown in FIG. 10, and a transistor forming a control unit.

FIG. 12 is a schematic partial sectional view of an expanded part in which a charge storage electrode, a photoelectric conversion layer and a second electrode are stacked in an imaging element of Embodiment 2.

FIG. 13 is a schematic partial sectional view of an imaging element and a stacked-type imaging element of Embodiment 3.

FIG. 14 is a schematic partial sectional view of imaging elements and stacked-type imaging elements of Embodiments 4 and 5.

FIG. 15A shows a schematic plan view of a charge storage electrode segment in Embodiment 5.

FIG. 15B shows a schematic plan view of a charge storage electrode segment in Embodiment 5.

FIG. 16A shows a schematic plan view of a charge storage electrode segment in Embodiment 5.

FIG. 16B shows a schematic plan view of a charge storage electrode segment in Embodiment 5.

FIG. 17 is an equivalent circuit diagram of the imaging element and the stacked-type imaging element of Embodiment 5.

FIG. 18 is an equivalent circuit diagram of the imaging element and the stacked-type imaging element of Embodiment 5.

FIG. 19 is a schematic arrangement view of a first electrode and a charge storage electrode forming the imaging element of Embodiment 5 and a transistor forming a control unit.

FIG. 20 is a view schematically showing a state of a potential at each part during operation of the imaging element of Embodiment 5.

FIG. 21 is a view schematically showing a state of a potential at each part during other operation (transferring or the like) of the imaging element of Embodiment 5.

FIG. 22 is a schematic arrangement view of a first electrode and a charge storage electrode forming a modified example of the imaging element of Embodiment 5.

FIG. 23 is a schematic partial sectional view of imaging elements and stacked-type imaging elements of Embodiments 6 and 5.

FIG. 24A shows a schematic plan view of a charge storage electrode segment in Embodiment 6.

FIG. 24B shows a schematic plan view of a charge storage electrode segment in Embodiment 6.

FIG. 25 is a schematic plan view of a first electrode and a charge storage electrode segment in a solid-state imaging apparatus of Embodiment 7.

FIG. 26 is a schematic plan view of a first modified example of the first electrode and charge storage electrode segment in the solid-state imaging apparatus of Embodiment 7.

FIG. 27 is a schematic plan view of a second modified example of the first electrode and charge storage electrode segment in the solid-state imaging apparatus of Embodiment 7.

FIG. 28 is a schematic plan view of a third modified example of the first electrode and charge storage electrode segment in the solid-state imaging apparatus of Embodiment 7.

FIG. 29 is a schematic plan view of a fourth modified example of the first electrode and charge storage electrode segment in the solid-state imaging apparatus of Embodiment 7.

FIG. 30 is a schematic plan view of a fifth modified example of the first electrode and charge storage electrode segment in the solid-state imaging apparatus of Embodiment 7.

FIG. 31 is a schematic plan view of a sixth modified example of the first electrode and charge storage electrode segment in the solid-state imaging apparatus of Embodiment 7.

FIG. 32 is a schematic plan view of a seventh modified example of the first electrode and charge storage electrode segment in the solid-state imaging apparatus of Embodiment 7.

FIG. 33 is a schematic plan view of a eighth modified example of the first electrode and charge storage electrode segment in the solid-state imaging apparatus of Embodiment 7.

FIG. 34 is a schematic plan view of a ninth modified example of the first electrode and charge storage electrode segment in the solid-state imaging apparatus of Embodiment 7.

FIG. 35A is a flow chart showing a readout driving example in an imaging element block of Embodiment 7.

FIG. 35B is a flow chart showing a readout driving example in an imaging element block of Embodiment 7.

FIG. 35C is a flow chart showing a readout driving example in an imaging element block of Embodiment 7.

FIG. 36 is a schematic plan view of a first electrode and a charge storage electrode segment in a solid-state imaging apparatus of Embodiment 8.

FIG. 37 is a schematic plan view of a first electrode and a charge storage electrode segment in a solid-state imaging apparatus according to a modification of Embodiment 8.

FIG. 38 is a schematic plan view of a first electrode and a charge storage electrode segment in a solid-state imaging apparatus according to a modification of Embodiment 8.

FIG. 39 is a schematic plan view of a first electrode and a charge storage electrode segment in a solid-state imaging apparatus according to a modification of Embodiment 8.

FIG. 40 is a schematic partial sectional view of an imaging element and a stacked-type imaging element of Embodiment 9.

FIG. 41 is a schematic partial sectional view of an imaging element and a stacked-type imaging element of Embodiment 10.

FIG. 42 is a schematic partial sectional view of a modified example of an imaging element and a stacked-type imaging element of Embodiment 10.

FIG. 43 is a schematic partial sectional view of another modified example of the imaging element of Embodiment 10.

FIG. 44 is a schematic partial sectional view of still another modified example of the imaging element of Embodiment 10.

FIG. 45 is a schematic partial sectional view of a part of an imaging element and a stacked-type imaging element of Embodiment 11.

FIG. 46 is a schematic arrangement view of a first electrode, a charge storage electrode and a charge discharge electrode forming the imaging element of Embodiment 11.

FIG. 47 is a schematic perspective view of a first electrode, a charge storage electrode, a charge discharge electrode, a second electrode and a contact hole portion forming the imaging element of Embodiment 11.

FIG. 48 is a schematic partial sectional view of another modified example of the imaging element and stacked-type imaging element of Embodiment 1.

FIG. 49 is a schematic partial sectional view of still another modified example of the imaging element and stacked-type imaging element of Embodiment 1.

FIG. 50A shows a schematic partial sectional view of an expanded part or the like of a first electrode of still another modified example of the imaging element and stacked-type imaging element of Embodiment 1.

FIG. 50B shows a schematic partial sectional view of an expanded part or the like of a first electrode of still another modified example of the imaging element and stacked-type imaging element of Embodiment 1.

FIG. 50C shows a schematic partial sectional view of an expanded part or the like of a first electrode of still another modified example of the imaging element and stacked-type imaging element of Embodiment 1.

FIG. 51 is a schematic partial sectional view of an expanded part or the like of a charge discharge electrode of still another modified example of the imaging element and stacked-type imaging element of Embodiment 1.

FIG. 52 is a schematic partial sectional view of still another modified example of the imaging element and stacked-type imaging element of Embodiment 1.

FIG. 53 is a schematic partial sectional view of still another modified example of the imaging element and stacked-type imaging element of Embodiment 1.

FIG. 54 is a schematic partial sectional view of still another modified example of the imaging element and stacked-type imaging element of Embodiment 1.

FIG. 55 is a schematic partial sectional view of still another modified example of the imaging element and stacked-type imaging element of Embodiment 1.

FIG. 56 is a schematic partial sectional view of still another modified example of the imaging element and stacked-type imaging element of Embodiment 1.

FIG. 57 is a schematic partial sectional view of an expanded part in which a charge storage electrode, a photoelectric conversion layer and a second electrode are stacked in the modified example of the imaging element of Embodiment 1.

FIG. 58 is a schematic partial sectional view of an expanded part in which a charge storage electrode, a photoelectric conversion layer and a second electrode are stacked in the modified example of the imaging element of Embodiment 2.

FIG. 59 is a conceptual diagram of an example in which a solid-state imaging apparatus formed of the imaging element and stacked-type imaging element according to an embodiment of the present disclosure is used in an electronic device (camera) 200.

FIG. 60 is a conceptual diagram of a conventional stacked-type imaging element (stacked-type solid-state imaging apparatus).

DESCRIPTION OF EMBODIMENTS

Hereinafter, embodiments of the present disclosure will be described based on examples with reference to the drawings, but the present disclosure is not limited to the examples, and various numerical values and materials in the examples are illustrative only. Further, the description will be given in the following order.

1. Overall description of imaging elements according to first to sixth aspects of the present disclosure, a stacked-type imaging element according to an aspect of the present disclosure, and solid-state imaging apparatuses according to the first to fourth aspects of the present disclosure.

2. Embodiment 1 (imaging elements according to the first aspect of the present disclosure and the sixth aspect of the present disclosure, a stacked-type imaging element according to an aspect of the present disclosure and a solid-state imaging apparatus according to the fourth aspect of the present disclosure)

3. Embodiment 2 (imaging elements according to the second aspect of the present disclosure and the sixth aspect of the present disclosure)

4. Embodiment 3 (an imaging element according to the third aspect of the present disclosure)

5. Embodiment 4 (an imaging element according to the fourth aspect of the present disclosure)

6. Embodiment 5 (an imaging element according to the fifth aspect of the present disclosure)

7. Embodiment 6 (an imaging element according to the sixth aspect of the present disclosure)

8. Embodiment 7 (solid-state imaging apparatuses according to the first to second aspects of the present disclosure)

9. Embodiment 8 (modification of Embodiment 7)

9. Embodiment 9 (modification of Embodiments 1 to 6)

10. Embodiment 10 (modification of Embodiments 1 to 6 and 9)

11. Embodiment 11 (modification of Embodiments 1 to 6 and 9 to 10)

12. Others (Overall description of imaging elements according to first to sixth aspects of the present disclosure, a stacked-type imaging element according to an aspect of the present disclosure, and solid-state imaging apparatuses according to the first to fourth aspects of the present disclosure)

In the solid-state imaging apparatus according to the first to second aspects of the present disclosure, a transfer control electrode may be disposed between a plurality of imaging elements forming an imaging element block.

The transfer control electrode may be formed on a first electrode side at the same level as the first electrode or the charge storage electrode, or may be formed at a different level. Alternatively, the transfer control electrode may be formed on the second electrode side at the same level as the second electrode, or may be formed at a different level. Furthermore, in the solid-state imaging apparatus according to the first to second aspects of the present disclosure including this preferred embodiment, one on-chip microlens may be disposed above one imaging element, alternatively, an imaging element block may be formed of two imaging elements, and one on-chip microlens may be disposed above one imaging element block.

In the solid-state imaging apparatus according to the first to second aspects of the present disclosure, one floating diffusion layer is provided for a plurality of imaging elements. Here, a plurality of the imaging elements provided for one floating diffusion layer may be formed of a plurality of a first-type imaging element to be described below, or may be formed of at least one first-type imaging element and one or two or more second-type imaging elements to be described below. Further, a plurality of imaging elements may share one floating diffusion layer by suitably controlling the timing of the charge transfer period. A plurality of imaging elements are operated in association with each other and are connected to a drive circuit to be described below as an imaging element block. That is, a plurality of imaging elements forming an imaging element block are connected to one drive circuit. However, control of the charge storage electrode is performed for each imaging element. Furthermore, a plurality of imaging elements may share one contact hole portion. The arrangement relationship between a first electrode shared by a plurality of imaging elements and the charge storage electrode of each imaging element may be such that the first electrode is disposed adjacent to the charge storage electrode of each imaging element. Alternatively, the first electrode may be disposed adjacent to a part of the charge storage electrodes of the plurality of imaging elements, and may not be disposed adjacent to the remaining charge storage electrodes of the plurality of imaging elements. In this case, the movement of charge from the rest of a plurality of the imaging elements to the first electrode is a movement through a part of a plurality of the imaging elements. It is preferable that a distance (referred to as "distance A" for convenience) between the charge storage electrode forming the imaging element and the charge storage electrode forming the imaging element be longer than a distance (referred to as "distance B" for convenience) between the first electrode and the charge storage electrode in the imaging element adjacent to the first electrode because the movement of charge from each imaging element to the first electrode can be ensured. Furthermore, it is preferable to increase the value of the distance A for the imaging element positioned farther from the first electrode.

In the imaging element according to the first to fifth aspects of the present disclosure, a photoelectric conversion unit segment having a larger value of n is located farther from the first electrode, but whether it is located away from the first electrode or not is determined based on an X direction. Furthermore, in the imaging element according to the sixth aspect of the present disclosure, a direction away from the first electrode is defined as the X direction. That is, a pixel region in which a plurality of imaging elements or stacked-type imaging elements are arrayed is formed of a plurality of pixels regularly arranged in a two-dimensional array, that is, in the X direction and a Y direction. In a case where the planar shape of the pixel is a rectangle, a direction in which the side closest to the first electrode extends is defined as the Y direction and the direction orthogonal to the Y direction is defined as the X direction. Alternatively, in a case where the planar shape of the pixel is an arbitrary shape, the overall direction in which the line segment or curve closest to the first electrode is included is defined as the Y direction and the direction orthogonal to the Y direction is defined as the X direction.

It is preferable that the second electrode positioned on the light incident side be shared by a plurality of imaging elements. That is, the second electrode may be a so-called solid electrode. The photoelectric conversion layer may be shared by a plurality of imaging elements, that is, one layer of the photoelectric conversion layer may be formed in a plurality of imaging elements, or the photoelectric conversion layer may be provided for each imaging element.

In the imaging elements according to the first to second aspects of the present disclosure, N photoelectric conversion layer segments are provided in series, N insulating layer segments are also provided in series, and N storage electrode segments are also provided in series. In the imaging elements according to the third to fifth aspects of the present disclosure, N photoelectric conversion layer segments are provided in series. Furthermore, in the imaging elements according to the fourth and fifth aspects of the present disclosure, N insulating layer segments are provided in series, while N insulating layer segments are provided to correspond to each photoelectric conversion unit segment in the imaging element according to the third aspect of the present disclosure. Moreover, in the imaging element according to the fourth to fifth aspects of the present disclosure, and in some cases in the imaging element according to the third aspect of the present disclosure, N charge storage electrode segments are provided to correspond to each photoelectric conversion unit segment. Further, in the imaging elements according to the first to sixth aspects of the present disclosure, the same potential is applied to all of the charge storage electrode segments. Alternatively, in the imaging elements according to the fourth to fifth aspects of the present disclosure, and in some cases in the imaging elements according to the third aspect of the present disclosure, a different potential may be applied to each of the N charge storage electrode segments.

The imaging elements according to the first to sixth aspects of the present disclosure or the imaging elements according to the first to sixth aspects forming the stacked-type imaging element according to an embodiment of the present disclosure, the solid-state imaging apparatuses according to the first to second aspects of the disclosure including the above-described preferred embodiments, the imaging element forming the solid-state imaging apparatus according to the third to fourth aspects of the present disclosure (hereinafter, these imaging elements are collectively referred to as an "imaging element or the like according to an embodiment of the present disclosure") may further include a semiconductor substrate, in which the photoelectric conversion unit may be disposed above the semiconductor substrate. Further, the first electrode, the charge storage electrode, and the second electrode are connected to a drive circuit to be described below.

Moreover, in the imaging element or the like according to an embodiment of the present disclosure including various preferred embodiments described above, the first electrode may extend in an opening provided in the insulating layer and may be connected to the photoelectric conversion layer. Alternatively, the photoelectric conversion layer may extend in the opening provided in the insulating layer and may be connected to the first electrode, and in this case, the edge of the top surface of the first electrode is covered with an insulating layer, the first electrode is exposed on the bottom surface of the opening, when the surface of the insulating layer in contact with the top surface of the first electrode is defined as the first surface and the surface of the insulating layer in contact with a part of the photoelectric conversion layer opposite to the charge storage electrode is defined as the second surface, the side surface of the opening may have an inclination extending from the first surface toward the second surface, and moreover, the side surface of the opening having an inclination extending from the first surface toward the second surface may be positioned on the charge storage electrode side. Further, an embodiment in which another layer is formed between the photoelectric conversion layer and the first electrode (for example, an embodiment in which a material layer suitable for charge storage is formed between the photoelectric conversion layer and the first electrode) is included.

Moreover, the imaging element or the like according to an embodiment of the present disclosure including the various preferred embodiments described above may further include a drive circuit provided on the semiconductor substrate and having a drive circuit, in which the first electrode and the charge storage electrode may be connected to the drive circuit, in a charge storage period, a potential $V_{11}$ may be applied to the first electrode, and a potential $V_{12}$ may be applied to the charge storage electrode from the drive circuit, charge may be stored in the photoelectric conversion layer, in a charge transfer period, a potential $V_{21}$ may be applied to the first electrode and a potential $V_{22}$ may be applied to the charge storage electrode from the drive circuit, and charges stored in the photoelectric conversion layer may be read by the control unit through the first electrode. Here, in a case where the potential of the first electrode is higher than the potential of the second electrode, $V_{12} \geq V_{11}$ and $V_{22} < V_{21}$, in a case where the potential of the first electrode is lower than that of the second electrode, $V_{12} \leq V_{11}$ and $V_{22} > V_{21}$.

Hereinafter, a case where the potential of the first electrode is higher than the potential of the second electrode will be described. Here, in a case where the potential of the first electrode is lower than the potential of the second electrode, it is only necessary to invert the potential level.

In the imaging element according to the first aspect of the present disclosure, the thickness of the insulating layer segment gradually changes from the first photoelectric conversion unit segment to the $N^{th}$ photoelectric conversion unit segment, but the thickness of the insulation layer segments may gradually increase or decrease, and thereby a type of charge transfer gradient is formed.

In a case where the charge to be stored is an electron, a configuration in which the thickness of the insulating layer segment gradually increases may be adopted, and in a case where the charge to be stored is a hole, a configuration in which the thickness of the insulating layer segment gradually decreases may be adopted. In this case, in the state of $|V_{12}| \geq |V_{11}|$ in the charge storage period, the $n^{th}$ photoelectric conversion unit segment may store more charges than the $(n+1)^{th}$ photoelectric conversion unit segment, and a strong electric field may be applied thereto, thereby reliably preventing the charge flow from the first photoelectric conversion unit segment to the first electrode. Further, in the state of $|V_{22}| < |V_{21}|$ in the charge transfer period, the charge flow from the first photoelectric conversion unit segment to the first electrode, and the charge flow from the $(n+1)^{th}$ photoelectric conversion unit segment to the $n^{th}$ photoelectric conversion unit segment can be reliably secured.

In the imaging element according to the second aspect of the present disclosure, the thickness of the photoelectric conversion layer segment gradually changes from the first photoelectric conversion unit segment to the $N^{th}$ photoelectric conversion unit segment, but the thickness of the photoelectric conversion layer segment may gradually increase or decrease, and thereby a type of charge transfer gradient is formed.

In a case where the charge to be stored is an electron, a configuration in which the thickness of the photoelectric conversion layer segment gradually increases may be adopted, and in a case where the charge to be stored is a hole, a configuration in which the thickness of the photoelectric conversion layer segment gradually decreases may be adopted. Further, in a case where the thickness of the photoelectric conversion layer segment gradually increases and $V_{12} \geq V_{11}$ in the charge storage period, and in a case where the thickness of the photoelectric conversion layer segment gradually decreases and $V_{12} \leq V_{11}$ in the charge transfer period, the $n^{th}$ photoelectric conversion unit segment is applied with a stronger electric field than the $(n+1)^{th}$ photoelectric conversion unit segment, thereby reliably preventing the charge flow from the first photoelectric conversion unit segment to the first electrode. Further, in a case where the thickness of the photoelectric conversion layer segment gradually increases and $V_{22} < V_{21}$ in the charge storage period, and in a case where the thickness of the photoelectric conversion layer segment gradually decreases and $V_{22} > V_{21}$ in the charge transfer period, the charge flow from the first photoelectric conversion unit segment to the first electrode, and the charge flow from the $(n+1)^{th}$ photoelectric conversion unit segment to the $n^{th}$ photoelectric conversion unit segment can be reliably secured.

In the imaging element according to the third aspect of the present disclosure, the material forming the insulating layer segment is different in adjacent photoelectric conversion unit segments, thereby forming a charge transfer gradient, but it is preferable that the value of the relative dielectric constant of the material forming the insulating layer segment gradually decreases from the first photoelectric conversion unit segment to the $N^{th}$ photoelectric conversion unit segment. When such a configuration is adopted, in the state of $V_{12} \geq V_{11}$ during the charge storage period, the $n^{th}$ photoelectric conversion unit segment may store a larger amount of charge than the $(n+1)^{th}$ photoelectric conversion unit segment. Further, in the state of $V_{22} < V_{21}$ during the charge transfer period, the charge flow from the first photoelectric conversion unit segment to the first electrode and the charge flow from the $(n+1)^{th}$ photoelectric conversion unit segment to the $n^{th}$ photoelectric conversion unit segment can be reliably ensured.

In the imaging element according to the fourth aspect of the present disclosure, materials forming the charge storage electrode segment are different in adjacent photoelectric conversion unit segments, thereby forming a charge transfer gradient, but it is preferable that the value of the work function of the material forming the insulating layer segment gradually increases from the first photoelectric conversion unit segment to the $N^{th}$ photoelectric conversion unit segment. Further, when such a configuration is adopted, a potential gradient advantageous to signal charge transfer can be formed without depending on a positive/negative polarity of a voltage.

In the imaging element according to the fifth aspect of the present disclosure, an area of the charge storage electrode segment gradually decreases from the first photoelectric conversion unit segment to the $N^{th}$ photoelectric conversion unit segment. As a result, a type of charge transfer gradient is formed, and thus, when $V_{12} \geq V_{11}$ in the charge storage period, the $n^{th}$ photoelectric conversion unit segment stores a larger amount of charge than the $(n+1)^{th}$ photoelectric conversion unit segment. Further, when $V_{22} < V_{21}$ in the charge transfer period, the charge flow from the first photoelectric conversion unit segment to the first electrode and the charge flow from the $(n+1)^{th}$ photoelectric conversion unit segment to the $n^{th}$ photoelectric conversion unit segment can be reliably ensured. Further, in the state of $V_{22} < V_{21}$ during the charge transfer period, the charge flow from the first photoelectric conversion unit segment to the first electrode and the charge flow from the $(n+1)^{th}$ photoelectric conversion unit segment to the $n^{th}$ photoelectric conversion unit segment can be reliably ensured.

In the imaging element according to the sixth aspect of the present disclosure, a cross-sectional area of the stacked portion varies depending on the distance from the first electrode, thereby forming a charge transfer gradient. Specifically, when a configuration in which the thickness of the cross section of the stacked portion is constant and the width of the cross section of the stacked portion decreases as being away from the first electrode is adopted, as explained in the imaging element according to the fifth aspect of the present disclosure, when $V_{12} \geq V_{11}$ in the charge storage period, a larger amount of charge can be stored in the region close to the first electrode than in the region far from the first electrode. Accordingly, when $V_{22} < V_{21}$ in the charge transfer period, the charge flow from the region close to the first electrode to the first electrode, and the charge flow from the region far from the first electrode to the region close to the first electrode can be reliably ensured. On the other hand, when a configuration in which the width of the cross section of the stacked portion is constant and the thickness of the cross section of the stacked portion, specifically, the thickness of the insulating layer segment gradually increases is adopted, as explained in the imaging element according to the first aspect of the present disclosure, when $V_{12} \geq V_{11}$ in the charge storage period, the region close to the first electrode can store a larger amount of charge than the region far from the first electrode, and a strong electric field can be applied thereto, and thus the charge flow from the region close to the first electrode to the first electrode can be reliably prevented. Further, when $V_{22} < V_{21}$ in the charge transfer period, the charge flow from the region close to the first electrode to the first electrode and the charge flow from the region far from the first electrode to the region close to the first electrode can be reliably ensured. Furthermore, when a configuration in which the thickness of the photoelectric conversion layer segment gradually increases, as explained in the imaging element according to the second aspect of the present disclosure, when $V_{12} \geq V_{11}$ in the charge storage period, the region close to the first electrode is applied with a stronger electric field than the region far from the first electrode, and thus the charge flow from the region close to the first electrode to the first electrode can be reliably prevented. Further, when $V_{22} < V_{21}$ in the charge transfer period, the charge flow from the region close to the first electrode to the first electrode and the charge flow from the region far from the first electrode to the region close to the first electrode can be reliably ensured.

Further, in the imaging elements according to the fourth to fifth aspects of the present disclosure, in some cases, in the imaging element according to the third aspect of the present disclosure, in a case where a different potential is applied to each of the N charge storage electrode segments, in a case where the potential of the first electrode is higher than the potential of the second electrode, in the charge transfer period, the potential applied to the charge storage electrode segment (the first photoelectric conversion unit segment) positioned closest to the first electrode may be higher than the potential of the charge storage electrode segment (the $N^{th}$ photoelectric conversion unit segment) positioned farthest from the first electrode, in a case where the potential of the first electrode is lower than the potential of the second electrode, in the charge transfer period, the potential applied to the charge storage electrode segment (the first photoelectric conversion unit segment) positioned closest to the first electrode may be lower than the potential of the charge storage electrode segment (the $N^{th}$ photoelectric conversion unit segment) positioned farthest from the first electrode.

Moreover, in the imaging element or the like according to an embodiment of the present disclosure including various preferred embodiments and configurations described above, a charge discharge electrode which is connected to the photoelectric conversion layer and disposed to be spaced apart from the first electrode and the charge storage electrode may be further included. Further, for convenience, the imaging element or the like of the present disclosure according to such an embodiment will be referred to as an "imaging element or the like according to an embodiment of the present disclosure provided with a charge discharge electrode." Further, in the imaging element or the like according to an embodiment of the present disclosure provided with a charge discharge electrode, the charge discharge electrode may be disposed to surround the first electrode and the charge storage electrode (that is, in a frame form). The charge discharge electrode may be shared by a plurality of the imaging element. Further, in this case, the photoelectric conversion layer may extend in a second opening provided in the insulating layer and may be connected to the charge discharge electrode, the edge of the top surface of charge discharge electrode may be covered with the insulating layer, the charge discharge electrode may be exposed on the bottom surface of the second opening, when the surface of the insulating layer in contact with the top surface of the charge discharge electrode is defined as a third surface, and the surface of the insulating layer in contact with a part of the photoelectric conversion layer opposite to the charge storage electrode is defined as a second surface, the side surface of the second opening may have an inclination extending from the third surface toward the second surface.

Moreover, the imaging element or the like according to an embodiment of the present disclosure provided with a charge discharge electrode may further include a control unit which is provided on the semiconductor substrate and have a drive circuit, in which the first electrode, the charge storage electrode and the charge discharge electrode may be connected to the drive circuit, in a charge storage period, a potential $V_{11}$ may be applied to the first electrode, a potential $V_{12}$ may be applied to the charge storage electrode, and a potential $V_{14}$ may be applied to the charge discharge electrode from the drive circuit, charge may be stored in the photoelectric conversion layer, in a charge transfer period, a potential $V_{21}$ may be applied to the first electrode, a potential $V_{22}$ may be applied from the drive circuit to the charge storage electrode, and a potential $V_{24}$ may be applied to the charge discharge electrode from the drive circuit, and charges stored in the photoelectric conversion layer may be read by the control unit through the first electrode.

Here, in a case where the potential of the first electrode is higher than the potential of the second electrode, $V_{14}>V_{11}$ and $V_{24}<V_{21}$, in a case where the potential of the first electrode is lower than that of the second electrode, $V_{14}<V_{11}$ and $V_{24}>V_{21}$.

In the imaging element or the like according to an embodiment of the present disclosure including various preferred embodiments and configurations described above, at least a floating diffusion layer and an amplification transistor forming a control unit may be provided with the semiconductor substrate, and the first electrode may be connected to a gate section of the floating diffusion layer and the amplification transistor. Further, in this case, the semiconductor substrate may be provided with a reset transistor and a select transistor forming a control unit, the floating diffusion layer may be connected to a source/drain region of one side of the reset transistor, the source/drain region of one side of the amplification transistor may be connected to the source/drain region of one side of the select transistor, and the source/drain region of another side of the select transistor may be connected to a signal line.

Moreover, in the imaging element or the like according to an embodiment of the present disclosure including various preferred embodiments and configurations described above, the size of the charge storage electrode may be larger than that of the first electrode. When the area of the charge storage electrode is defined as S1', and the area of the first electrode is defined as S1, it is preferable to satisfy 4≤S1'/S1, but the present disclosure is not limited thereto.

Moreover, in the imaging element or the like according to an embodiment of the present disclosure including various preferred embodiments and configurations described above, light may enter from the second electrode side and a light shielding layer may be formed on the light incident side from the second electrode. Alternatively, light may be incident from the second electrode side, and no light may be incident on the first electrode, and in this case, a light shielding layer may be formed above the first electrode, which is a light incident side from the second electrode. Alternatively, an on-chip microlens may be provided above the charge storage electrode and the second electrode, light incident on the on-chip microlens may be collected to the charge storage electrode. Here, the light shielding layer may be disposed above the surface on the light incident side of the second electrode or may be disposed on the light incident side surface of the second electrode. In some cases, the light shielding layer may be formed on the second electrode. Examples of materials forming the light shielding layer include chromium (Cr), copper (Cu), aluminum (Al), tungsten (W), and a light proof resin (e.g., polyimide resin).

Specific examples of the imaging element according to an embodiment of the present disclosure include an imaging element (for convenience, referred to as a "first-type blue imaging element") having a photoelectric conversion layer which absorbs blue light (light of 425 nm to 495 nm) (for convenience, referred to as a "first-type blue photoelectric conversion layer") and having sensitivity to blue, an imaging element (for convenience, referred to as a "first-type green imaging element") having a photoelectric conversion layer which absorbs green light (light of 495 nm to 570 nm) (for convenience, referred to as a "first-type green photoelectric conversion layer") and having sensitivity to green, and an imaging element (for convenience, referred to as a "first-type red imaging element") having a photoelectric conversion layer which absorbs red light (light of 620 nm to 750 nm) (for convenience, referred to as a "first-type red photoelectric conversion layer") and having sensitivity to red. Further, in the conventional imaging element without the charge storage electrode, an imaging element sensitive to blue is, for convenience, referred to as "second type blue imaging element", and an imaging element sensitive to green is, for convenience, referred to as "second type green imaging element", an imaging element sensitive to red is, for convenience, referred to as "second type red imaging element", a photoelectric conversion layer forming the second type blue imaging element is, for convenience, referred to as "second type blue photoelectric conversion layer", a photoelectric conversion layer forming the second type green imaging element is, for convenience, referred to as "second type green photoelectric conversion layer", and a photoelectric conversion layer forming the second type red imaging element is, for convenience, referred to as "second type red photoelectric conversion layer."

The stacked-type imaging element according to an embodiment of the present disclosure includes at least one imaging element (photoelectric conversion element) according to an embodiment of the present disclosure, and specific examples thereof include:

(A) the configuration and structure in which the first type blue photoelectric conversion unit, the first type green photoelectric conversion unit and the first type red photoelectric conversion unit are stacked in the vertical direction, and each of the control units of the first type blue imaging element, the first type green imaging element, and the first type red imaging element is provided on the semiconductor substrate;

(B) the configuration and structure in which the first type blue photoelectric conversion unit and the first type green photoelectric conversion unit are stacked in the vertical direction, the second-type red photoelectric conversion unit is disposed below these two layers of the first type photoelectric conversion units, and each of the control units of the first type blue imaging element, the first type green imaging element, and the second type red imaging element is provided on the semiconductor substrate;

(C) the configuration and structure in which the second-type blue photoelectric conversion unit and the second-type red photoelectric conversion unit are disposed below the first-type green photoelectric conversion unit, and each of the control units of the first type green imaging element, the second type blue imaging element, and the second type red imaging element is provided on the semiconductor substrate; and (D) the configuration and structure in which the second-type green photoelectric conversion unit and the second-type red photoelectric conversion unit are disposed below the first-type blue photoelectric conversion unit, and each of the control units of the first type blue imaging element, the second type green imaging element, and the second type red imaging element is provided on the semiconductor substrate.

Further, the arrangement order of the photoelectric conversion units of these imaging elements in the vertical direction is preferably an order of the blue photoelectric conversion unit, the green photoelectric conversion unit, and the red photoelectric conversion unit from the light incidence direction, or an order of the green photoelectric conversion unit, the blue photoelectric conversion unit, and the red photoelectric conversion unit from the light incidence direction. This is because shorter wavelength light is more efficiently absorbed on the incident surface side. Since red is the longest wavelength among the three colors, it is preferable to locate the red photoelectric conversion section at the lowermost layer as viewed from the light incidence surface. One pixel is formed by the stacked structure of these imaging elements. Furthermore, the first-type infrared photoelectric conversion unit may be provided. Here, it is preferable that the photoelectric conversion layer of the first-type infrared photoelectric conversion unit is, for example, formed of an organic material, and is the lowermost layer of the stacked structure of the first-type imaging element, and is disposed above the second-type imaging element. Alternatively, the second-type infrared photoelectric conversion unit may be provided below the first-type infrared photoelectric conversion unit.

In the first type imaging element, for example, the first electrode is formed on the interlayer insulating layer provided on the semiconductor substrate. The imaging element formed on the semiconductor substrate may be of a back surface illuminated type or of a front surface illuminated type.

In a case where the photoelectric conversion layer is formed of organic materials, the photoelectric conversion layer is formed according to the following four embodiments: The photoelectric conversion layer is formed of (1) a p-type organic semiconductor. The photoelectric conversion layer is formed of (2) an n-type organic semiconductor. The photoelectric conversion layer is formed of (3) a stacked structure of a p-type organic semiconductor layer/an n-type organic semiconductor layer. The photoelectric conversion layer is formed of a stacked structure of a p-type organic semiconductor layer/a mixed layer (bulk hetero structure) of a p-type organic semiconductor and an n-type organic semiconductor/an n-type organic semiconductor layer. The photoelectric conversion layer is formed of a stacked structure of a p-type organic semiconductor layer/a mixed layer (bulk hetero structure) of a p-type organic semiconductor and an n-type organic semiconductor. The photoelectric conversion layer is formed of a stacked structure of an n-type organic semiconductor layer/a mixed layer (bulk hetero structure) of a p-type organic semiconductor and an n-type organic semiconductor. The photoelectric conversion layer is formed of (4) a mixture (bulk hetero structure) of a p-type organic semiconductor and an n-type organic semiconductor. However, the stacking order may be arbitrarily exchanged.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, a polyfluorene derivative, etc. Examples of the n-type organic semiconductor include fullerenes and fullerene derivatives (e.g., fullerenes (higher fullerene) such as $C_{60}$, $C_{70}$, $C_{74}$ fullerenes or the like, endohedral fullerene or the like, or fullerene derivatives (e.g., fullerene fluoride, PCBM fullerene compound, fullerene polymer, etc.)), organic semiconductors with larger (deeper) HOMO and LUMO than those of p-type organic semiconductors, and transparent inorganic metal oxides. Specific examples of the n-type organic semiconductor include a heterocyclic compound containing a nitrogen atom, an oxygen atom and a sulfur atom, for example, organic molecules and organometallic complexes having pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, benzimidazole derivatives, benzotriazole derivatives, benzoxazole derivatives, carbazole derivatives, benzofuran derivatives, dibenzofuran derivatives, subporphyrazine derivative, polyphenylene vinylene derivatives, polybenzothiadiazole derivatives, polyfluorene derivatives and the like a part of the molecular skeleton, and subphthalocyanine derivatives. Examples of a functional group or the like included in fullerene derivatives include a halogen atom; a linear, branched or cyclic alkyl group or phenyl group; a functional group having a linear or condensed aromatic compound; a functional group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfanyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a functional group having a chalcogenide; a phosphine group; a phosphonic group; derivatives thereof. The thickness of the photoelectric conversion layer (may be referred to as "organic photoelectric conversion layer") formed of an organic material may be, without being limited to, $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, and still more preferably $1\times10^{-7}$ m to $1.8\times10^{-7}$ m. Further, an organic semiconductor is often classified as p-type or n-type, but p-type indicates that holes can be easily transported, and n-type indicates that electrons can be easily transported, and an organic semiconductor is not limited to the interpretation that it has holes or electrons as majority carriers of thermal excitation as in inorganic semiconductors.

Alternatively, examples of the material forming an organic photoelectric conversion layer that photoelectrically converts light of green wavelength include rhodamine-based pigment, melacyanine-based pigment, quinacridone-based derivative, subphthalocyanine-based pigment (subphthalocyanine derivative), etc. Examples of the material forming an organic photoelectric conversion layer that photoelectrically converts light of blue wavelength include coumarinic acid pigment, tris-8-hydricoxyquinoline aluminum (Alq3), melacyanin-based pigment, etc. Examples of the material forming an organic photoelectric conversion layer that photoelectrically converts light of red wavelength include phthalocyanine-based pigment and subphthalocyanine-based pigment (subphthalocyanine derivative).

Alternatively, examples of the inorganic material forming the photoelectric conversion layer include crystalline silicon, amorphous silicon, microcrystalline silicon, crystalline selenium, amorphous selenium, chalcopyrite compounds such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, AgInSe$_2$ (AgInSe$_2$), or compound semiconductors such as GaAs, InP, AlGaAs, InGaP, AlGaInP, InGaAsP, and group III-V compounds such as CdSe, CdS, In$_2$Se$_3$, In$_2$S$_3$, Bi$_2$Se$_3$, Bi$_2$S$_3$, ZnSe, ZnS, PbSe, PbS, etc. In addition, quantum dots formed of these materials may be used in the photoelectric conversion layer.

Alternatively, the photoelectric conversion layer may have a stacked structure of a lower semiconductor layer and an upper photoelectric conversion layer. When the lower semiconductor layer is provided as described above, the recombination during charge storage can be prevented, the efficiency of transfer of charge stored in the photoelectric conversion layer to the first electrode can be increased, and the generation of dark current can be suppressed. The material forming the upper photoelectric conversion layer may be suitably selected from various materials forming the photoelectric conversion layer. On the other hand, it is preferable to use a material having a large band gap energy value (e.g., a band gap energy value of 3.0 eV or more) and having a higher mobility than a material forming the photoelectric conversion layer as a material forming the lower semiconductor layer. Specific examples thereof include organic semiconductor materials such as oxide semiconductor materials such as IGZO; transition metal dichalcogenide; silicon carbide; diamond; graphene; carbon nanotube; condensed polycyclic hydrocarbon compounds, condensed heterocyclic compounds, etc. Alternatively, in a case where the charge to be stored is an electron, an example of the material forming the lower layer semiconductor layer may be a material having the ionization potential larger than the ionization potential of the material forming the photoelectric conversion layer. In a case where the charge to be stored is a hole, an example of the material forming the lower layer semiconductor layer may be a material having the electron affinity smaller than the electron affinity of the material forming the photoelectric conversion layer. Alternatively, the impurity concentration in the material forming the lower layer semiconductor layer is preferably $1 \times 10^{18}$ cm$^{-3}$ or less. The lower semiconductor layer may have a single layer configuration or a multilayer configuration. Furthermore, a material forming the lower semiconductor layer located above the charge storage electrode and a material forming the lower semiconductor layer located above the first electrode may be different from each other.

With the solid-state imaging apparatus according to the first to fourth aspects of the present disclosure, a single-plate type color solid-state imaging apparatus may be formed.

In the solid-state imaging apparatus according to the second or fourth aspect of the present disclosure including the stacked-type imaging element, unlike the solid-state imaging apparatus including the Bayer-array imaging element (i.e., spectroscopy for blue, green, and red is not performed using a color filter), elements having sensitivity to light of plural types of wavelengths are stacked in the light incidence direction in the same pixel to form one pixel, and thus improvement of sensitivity and pixel density per unit volume can be achieve. Furthermore, since an organic material has a high absorption coefficient, a film thickness of a photoelectric conversion layer can be thinner as compared to a conventional Si-based photoelectric conversion layer, and light leakage from adjacent pixels and restriction on the light incidence angle can be alleviated. Moreover, since the conventional Si-based imaging element produces color signals by performing interpolation processing among three-color pixels, false color is generated, but false color can be suppressed in the solid-state imaging apparatus according to the second or fourth aspect of the present disclosure including the stacked-type imaging element. Further, since the organic photoelectric conversion layer itself functions as a color filter, color separation can be performed without disposing a color filter.

On the other hand, in the solid-state imaging apparatus according to the first, second or third aspect of the present disclosure, due to using a color filter, the request for spectral characteristics of blue, green and red can be alleviated, and moreover, mass productivity is high. Examples of the arrangement of the imaging element in the solid-state imaging apparatus according to the first, second or third aspect of the present disclosure include an interline arrangement, a G stripe-RB checkered array, a G stripe-RB full-checkered array, a checkered complementary color array, a stripe array, a diagonal stripe array, a primary color difference array, a field color difference sequential array, a frame color difference sequential array, an MOS-type array, a modified MOS-type array, a frame interleave array and a field interleave array in addition to a Bayer array. Here, one pixel (or subpixel) is formed by one imaging element.

A pixel region in which a plurality of the imaging elements according to an embodiment of the present disclosure or the stacked-type imaging elements according to an embodiment of the present disclosure are arrayed is formed of a plurality of pixels regularly arranged in a two-dimensional array. Generally, the pixel region includes an effective pixel region which actually receives light, amplifies the signal charges generated by photoelectric conversion and reads it out to the drive circuit, and a black reference pixel region for outputting optical black serving as a reference of a black level. The black reference pixel region is generally disposed at the outer peripheral portion of the effective pixel region.

In the imaging element or the like according to an embodiment of the present disclosure including various preferred embodiments and configurations described above, light is radiated, photoelectric conversion is generated at the photoelectric conversion layer, carriers including holes and electrons are separated. Further, an electrode from which holes are extracted is referred to as an anode, and an electrode from which electrons are extracted is defined as a cathode. The first electrode may form an anode, and the second electrode may form a cathode, or reversely, the first electrode may form a cathode, and the second electrode may form an anode.

In the case of forming a stacked-type imaging element, the first electrode, the charge storage electrode, the transfer control electrode, the charge ejection electrode and the second electrode can be formed of a transparent conductive material. Further, the first electrode, the charge storage electrode, the transfer control electrode and the charge discharge electrode may be collectively referred to as a "first electrode or the like". Alternatively, in a case where the image imaging element or the like according to an embodiment of the present disclosure is arranged on a plane, for example, as in a Bayer array, the second electrode may be formed of a transparent conductive material and the first electrode or the like may be formed of a metal material. In this case, specifically, the second electrode located on the light incident side may be formed of a transparent conductive material and the first electrode or the like may be formed of, for example, Al—Nd (alloy of aluminum and neodymium) or ASC (alloy of aluminum, samarium and copper). Further, an electrode formed of a transparent conductive material may be referred to as a "transparent electrode." Here, the band gap energy of the transparent conductive material is 2.5 eV or more, and preferably, 3.1 eV or more. Examples of a transparent conductive material forming an transparent electrode include conductive metal oxides, and specific examples thereof include indium oxide, indium-tin oxide (ITO including Sn-doped $In_2O_3$, crystalline ITO and amorphous ITO), indium-zinc oxide (IZO) in which indium is added to zinc oxide as a dopant, indium-gallium oxide (IGO) in which indium is added to gallium oxide as a dopant, indium-gallium-zinc oxide (IGZO, In—$GaZnO_4$) in which indium and gallium are added to zinc oxide as a dopant, IFO (F-doped $In_2O_3$), tin oxide ($SnO_2$), ATO (Sb-doped $SnO_2$), FTO (F-doped $SnO_2$), zinc oxide (including ZnO doped with other elements), aluminum-zinc oxide (AZO) in which aluminum is added to zinc oxide as a dopant, gallium-zinc oxide (GZO) in which gallium is added to zinc oxide as a dopant, titanium oxide ($TiO_2$), antimony oxide, spinel type oxide, an oxide having a $YbFe_2O_4$ structure. Alternatively, a transparent electrode having a base layer of gallium oxide, titanium oxide, niobium oxide, nickel oxide or the like may be given as an example. The thickness of the transparent electrode may be $2\times10^{-8}$ m to $2\times10^{-7}$ m, preferably $3\times10^{-8}$ m to $1\times10^{-7}$ m. When transparency is necessary for the first electrode, it is preferable that the charge discharge electrode also be formed of a transparent conductive material from the viewpoint of simplifying the manufacturing process.

Alternatively, in a case where transparency is unnecessary, a conductive material forming an anode having a function as an electrode for extracting holes is preferably a conductive material having a high work function (e.g., $\varphi=4.5$ eV to 5.5 eV), and specific examples thereof include gold (Au), silver (Ag), chromium (Cr), nickel (Ni), palladium (Pd), platinum (Pt), iron (Fe), iridium (Ir), germanium (Ge), osmium (Os), rhenium (Re), tellurium (Te). On the other hand, a conductive material forming a cathode having a function as an electrode for extracting electrons is preferably a conductive material having a low work function (e.g., $\varphi=3.5$ eV to 4.5 eV), and specific examples thereof include alkali metals (e.g., Li, Na, K, etc.) and the fluorides or oxides thereof, alkaline earth metals (e.g., Mg, Ca, etc.) and the fluorides or oxides thereof, aluminum (Al), zinc (Zn), tin (Sn), thallium (Tl), a sodium-potassium alloy, an aluminum-lithium alloy, a magnesium-silver alloy, indium and rare earth metals such as ytterbium, or alloys thereof. Alternatively, examples of the material forming an anode or cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo) or the like, or alloys including these metal elements, as conductive particles formed of these metals, conductive particles of alloys containing these metals, polysilicon containing impurities, carbon-based materials, oxide semiconductors, conductive materials such carbon nanotubes, graphene and the like, and a laminated structure of layers containing these elements. Furthermore, examples of the material forming an anode or cathode include organic materials (conductive polymers) such as poly(3,4-ethylenedioxythiophene)/polystyrenesulfonic acid (PEDOT/PSS). Further, a paste or ink prepared by mixing these conductive materials into a binder (polymer) may be cured to be used as an electrode.

A dry method or wet method may be used as a film-forming method of the first electrode or the like (anode) and the second electrode (cathode). Examples of the dry method include a physical vapor deposition method (PVD method) and a chemical vapor deposition method (CVD) method. Examples of the film-forming method using the principle of PVD method include a vacuum evaporation method using resistance heating or high frequency heating, an electron beam (EB) evaporation method, various sputtering methods (magnetron sputtering method, RF-DC coupled bias sputtering method, ECR sputtering method, facing-target sputtering method and high frequency sputtering method), an ion plating method, a laser ablation method, a molecular beam epitaxy method, and a laser transfer method. Furthermore, examples of the CVD method include a plasma CVD method, a thermal CVD method, an organic metal (MO) CVD method, and a photo CVD method. On the other hand, examples of the wet method include an electrolytic plating method and an electroless plating method, a spin coating method, an ink jet method, a spray coating method, a stamping method, a micro contact printing method, a flexographic printing method, an offset printing method, a gravure printing method, a dipping method, etc. As for patterning, chemical etching such as shadow mask, laser transfer, photolithography and the like, physical etching by ultraviolet light, laser and the like may be used. Examples of a planarization technique for the first electrode and second electrode include a laser planarization method, a reflow method, a chemical mechanical polishing (CMP) method, etc.

Examples of materials forming the insulating layer include inorganic insulating materials exemplified by silicon oxide-based materials; silicon nitride ($SiN_Y$); a metal oxide high-dielectric constant insulating film such as aluminum oxide ($Al_2O_3$) or the like as well as organic insulating materials (organic polymers) exemplified by polymethyl methacrylate (PMMA); polyvinyl phenol (PVP); polyvinyl alcohol ($PV_A$); polyimide, polycarbonate (PC); polyethylene terephthalate (PET); polystyrene; silanol derivatives (silane coupling agents) such as N-2(aminoethyl)3-aminopropyltrimethoxysilane (AEAPTMS), 3-mercaptopropyltrimethoxysilane (MPTMS), octadecyltrichlorosilane (OTS) or the like; straight-chain hydrocarbons having a functional group capable of bonding to the control electrode at one end such as octadecanethiol, dodecyl isocyanate and the like, and combinations thereof. In addition, examples of the silicon oxide-based materials include silicon oxide ($SiO_X$), BPSG, PSG, BSG, AsSG, PbSG, silicon oxynitride (SiON), spin-on-glass (SOG), and low dielectric constant materials (e.g., polyaryl ether, cycloperfluorocarbon polymers and benzocyclobutene, cyclic fluoro resins, polytetrafluoroethylene, fluoroaryl ether, fluorinated polyimide, amorphous carbon and organic SOG). Materials forming various interlayer insulating layers and insulating films may be suitably selected from these materials.

The configuration and structure of the floating diffusion layer, amplification transistor, reset transistor and select transistor forming the control unit may be the same as the conventional floating diffusion layer, amplification transistor, reset transistor and select transistor. Also, the drive circuit may have a well-known configuration and structure.

The first electrode is connected to the floating diffusion layer and the gate section of the amplification transistor, and a contact hole portion may be formed to connect the first electrode to the floating diffusion layer and the gate section of the amplification transistor. Examples of a material forming the contact hole portion include a high melting point metal such as tungsten, Ti, Pt, Pd, Cu, TiW, TiN, TiNW, $WSi_2$, $MoSi_2$ or the like, metal silicide, or a stacked structure of layers formed of these materials (e.g., Ti/TiN/W).

A first carrier blocking layer may be provided between the organic photoelectric conversion layer and the first electrode, or a second carrier blocking layer may be provided between the organic photoelectric conversion layer and the second electrode. Furthermore, a first charge injection layer may be provided between the first carrier blocking layer and the first electrode, or a second charge injection layer may be provided between the second carrier blocking layer and the second electrode. Examples of a material forming the charge injection layer include alkali metals such as lithium (Li), sodium (Na), and potassium (K), fluorides and oxides thereof, alkaline earth metals such as magnesium (Mg) and calcium (Ca), fluorides and oxides thereof.

A dry film formation method and a wet film formation method may be given as examples of a film-forming method for various organic layers. Examples of the dry film formation method include a vacuum deposition method using resistance heating, high frequency or electron beam heating, a flash deposition method, a plasma deposition method, an EB deposition method, various sputtering method (bipolar sputtering method, direct current sputtering method, DC magnetron sputtering method, RF-DC coupled bias sputtering method, ECR sputtering method, facing-target sputtering method, high frequency sputtering method and ion beam sputtering method), a DC (direct current) method, an RF method, a multi-cathode method, an activation reaction method, an electric field vapor deposition method, a high-frequency ion plating method and a reactive ion plating method, a laser ablation method, a molecular beam epitaxy method, a laser transfer method, and a molecular beam epitaxy (MBE) method. Furthermore, examples of a chemical vapor deposition (CVD) method include a plasma CVD method, a thermal CVD method, an MOCVD method, and a photo CVD method. On the other hand, as a wet method, a spin coating method; a dipping method; a casting method; a micro contact printing method; a drop casting method; various printing methods such as a screen printing method, an ink jet printing method, an offset printing method, a gravure printing method and a flexographic printing method; a stamping method; a spray coating method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method and a calendar coater method. Further, examples of a solvent in the coating method include a nonpolar or low polar organic solvents such as toluene, chloroform, hexane, and ethanol. As for patterning, chemical etching such as shadow mask, laser transfer, photolithography and the like, physical etching by ultraviolet light, laser and the like may be used. Examples of a planarization technique for various organic layers include a laser planarization method, a reflow method, etc.

In the imaging element or the solid-state imaging apparatus, as described above, as necessary, an on-chip microlens or a light shielding layer may be provided, or a drive circuit and wiring for driving the imaging element are provided. A shutter for controlling the incidence of light to the imaging element may be provided as necessary, or an optical cut filter may be provided according to the purpose of the solid-state imaging apparatus.

For example, in a case where the solid-state imaging apparatus is stacked with a readout integrated circuit (ROIC), the stacking may be performed by overlaying a drive substrate on which a readout integrated circuit and a connection portion formed of copper (Cu) are formed and an imaging element on which a connection portion is formed such that the connection portions are in contact with each other, and joining the connection portions, and it is also possible to join the connection portions using a solder bump or the like.

Embodiment 1

Embodiment 1 relates to the imaging elements according to the first aspect of the present disclosure and the sixth aspect of the present disclosure, the stacked-type imaging element according to an aspect of the present disclosure, and the solid-state imaging apparatus according to the fourth aspect of the present disclosure.

FIG. 1 shows a schematic partial sectional view of the imaging element and stacked-type imaging element of Embodiment 1; FIG. 2 shows a schematic partial sectional view of an expanded part in which the charge storage electrode, the photoelectric conversion layer and the second electrode are stacked in the imaging element of Embodiment 1; FIGS. 3 and 4 shows an equivalent circuit diagram of the imaging element and stacked-type imaging element of Embodiment 1; FIG. 5 shows a schematic arrangement view of the first electrode and the charge storage electrode forming the imaging element of Embodiment 1 and the transistor forming the control unit; and FIG. 6 schematically shows a state of a potential at each part during operation of the imaging element of Embodiment 1. Furthermore, FIG. 7 shows a schematic arrangement view of the first electrode and charge storage electrode forming the imaging element of Embodiment 1; FIG. 8 shows a schematic perspective view of the first electrode, the charge storage electrode, a second electrode and a contact hole portion forming the imaging element of Embodiment 1; and FIG. 9 shows a conceptual diagram of a solid-state imaging apparatus of Embodiment 1. Further, the thickness of the insulating layer segment is illustrated as a fixed thickness for the simplification of the drawing in FIGS. 3 and 4.

The imaging element of Embodiment 1 (e.g., green imaging element to be described below) or the imaging elements of Embodiments 2 to 6 and 9 to 11 which will be described below include a photoelectric conversion unit in which a first electrode 11, a photoelectric conversion layer 15 and a second electrode 16 are stacked, and the photoelectric conversion unit further includes a charge storage electrode 12 which is disposed to be spaced apart from the first electrode 11 and is disposed to face the photoelectric conversion layer 15 through an insulating layer 82.

Furthermore, the stacked-type imaging element of Embodiment 1 includes at least one of the imaging element of Embodiments 1 to 6, and includes one imaging element of Embodiment 1 in Embodiments 1 to 6.

Moreover, the solid-state imaging apparatus of Embodiment 1 includes a plurality of the stacked-type imaging elements of Embodiment 1.

Here, in the imaging element of Embodiment 1 or the imaging elements of Embodiments 2 to 6, and 9 to 11 to be described below, the photoelectric conversion unit is formed of N (where N≥2) photoelectric conversion unit segments (specifically, three photoelectric conversion unit segments $10_1$, $10_2$ and $10_3$ in each embodiment), the photoelectric conversion layer 15 is formed of N photoelectric conversion layer segments (specifically, three photoelectric conversion layer segments $15_1$, $15_2$ and $15_3$ in each embodiment), the insulating layer 82 is formed of N insulating layer segments (specifically, three insulating layer segments $82_1$, $82_2$ and $82_3$ in each embodiment), in Embodiments 1 to 3, the charge storage electrode 12 is formed of N charge storage electrode segments (specifically, three charge storage electrode segments $12_1$, $12_2$ and $12_3$ in each embodiment), in Embodiments 4 to 5, in some cases, in Embodiment 3, the charge storage electrode 12 is formed of N charge storage electrode segments (specifically, three charge storage electrode segments $12_1$, $12_2$ and $12_3$ in each embodiment) disposed to be spaced apart from each other, the $n^{th}$ (where n=1, 2, 3 . . . , N) photoelectric conversion unit segment $10n$ is formed of the $n^{th}$ charge storage electrode segment $12n$, the $n^{th}$ insulating layer segment $82n$ and the $n^{th}$ photoelectric conversion layer segment $15n$, the photoelectric conversion unit segment having a larger value of n is located farther from the first electrode 11. In accordance with embodiments of the present disclosure, a charge storage segment in the $N^{th}$ photoelectric conversion unit segment may refer to the $N^{th}$ charge storage segment. For example, a charge storage segment in the first photoelectric conversion unit segment may refer to $12_1$.

Alternatively, the imaging element of Embodiment 1 or the imaging elements of Embodiments 2 and 5 to be described below further includes a photoelectric conversion unit in which the first electrode 11, the photoelectric conversion layer 15 and the second electrode 16 are stacked, in which the photoelectric conversion unit further includes a charge storage electrode 12 which is disposed to be spaced apart from the first electrode 11 and disposed opposite to the photoelectric conversion layer 15 via an insulating layer 82, in a case in which a stacking direction of the charge storage electrode 12, the insulating layer 82, and the photoelectric conversion layer 15 is defined as a Z direction and a direction away from the first electrode 11 is defined as an X direction, when a stacked portion in which the charge storage electrode 12, the insulating layer 82, and the photoelectric conversion layer 15 are stacked is cut in a YZ virtual plane, a cross-sectional area of the stacked portion varies depending on a distance from the first electrode.

Furthermore, in the imaging element of Embodiment 1, the thickness of the insulating layer segment gradually changes from the first photoelectric conversion unit segment $10_1$ to the $N^{th}$ photoelectric conversion unit segment $10_N$. Specifically, the thickness of the insulating layer segment gradually increases. Alternatively, in the imaging element of Embodiment 1, the width of the cross section of the stacked portion is constant and the thickness of the cross section of the stacked portion, specifically, the thickness of the insulating layer segment gradually increases depending on the distance from the first electrode 11. Further, the thickness of the insulating layer segment increases in a stepwise manner. The thickness of the insulating layer segment $82n$ in the $n^{th}$ photoelectric conversion unit segment $10n$ is constant. When the thickness of the insulating layer segment $82n$ in the $n^{th}$ photoelectric conversion unit segment $10n$ is defined as "1", the thickness of the insulating layer segment $82_{(n+1)}$ in the $(n+1)^{th}$ photoelectric conversion unit segment $10_{(n+1)}$ may be 2 to 10, but are not limited thereto. In Embodiment 1, the thickness of the insulating layer segments $82_1$, $82_2$ and $82_3$ gradually increases by gradually decreasing the thickness of the charge storage electrode segments $12_1$, $12_2$ and $12_3$. The thickness of the photoelectric conversion layer segments $15_1$, $15_2$ and $15_3$ is constant.

Further, in the imaging element of Embodiment 1 or in Embodiments 2 to 6 and 9 to 11, the semiconductor substrate (more specifically, silicon semiconductor layer) 70 is further included, and the photoelectric conversion unit is disposed above the semiconductor substrate 70. Furthermore, a control unit which is disposed on the semiconductor substrate 70 and has a drive circuit connected to the first electrode 11 is further included. Here, the light incidence surface of the semiconductor substrate 70 is defined as an above side, and the opposite side of the semiconductor substrate 70 is defined as a below side. A wiring layer 62 formed of a plurality of wirings is disposed below the semiconductor substrate 70. Furthermore, the semiconductor substrate 70 further includes at least a floating diffusion layer $FD_1$ and an amplification transistor $TR1_{amp}$ forming the control unit, and the first electrode 11 is connected to the gate section of the floating diffusion layer $FD_1$ and the amplification transistor $TR1_{amp}$. The semiconductor substrate 70 further includes a reset transistor $TR1_{rst}$ and select transistor $TR1_{sel}$ forming the control unit. Furthermore, the floating diffusion layer $FD_1$ is connected to a source/drain region of one side of the reset transistor $TR1_{rst}$, and a source/drain region of one side of the amplification transistor $TR1_{amp}$ is connected to a source/drain region of one side of the select transistor $TR1_{sel}$, and a source/drain region of another side of the select transistor $TR1_{sel}$ is connected to the signal line $VSL_1$. The above-described amplification transistor $TR1_{amp}$, reset transistor $TR1_{rst}$ and select transistor $TR1_{sel}$ form the drive circuit.

Specifically, the imaging element and stacked-type imaging element of Embodiment 1 are back surface illuminated type imaging element and stacked-type imaging element, and have a structure in which a first-type green imaging element of Embodiment 1 (hereinafter, referred to as "first imaging element") having a first-type photoelectric conversion layer which absorbs green light and having sensitivity to green, a second-type conventional blue imaging element (hereinafter, referred to as "second imaging element") having a second-type photoelectric conversion layer which absorbs blue light and having sensitivity to blue, and a second-type conventional red imaging element (hereinafter, referred to as "third imaging element") having a second-type photoelectric conversion layer which absorbs red light and having sensitivity to red are stacked. Here, the red imaging element (third imaging element) and the blue imaging element (second imaging element) are provided in the semiconductor substrate 70, and the second imaging element is located more closer to the light incident side as compared to the third imaging element. Furthermore, the green imaging element (first imaging element) is provided above the blue imaging element (second imaging element). One pixel is formed by the stacked structure of the first imaging element, the second imaging element, and the third imaging element. No color filter is provided.

In the first imaging element, the first electrode 11 and the charge storage electrode 12 are formed apart from each other on the interlayer insulating layer 81. The interlayer insulating layer 81 and the charge accumulating electrode 12 are covered with an insulating layer 82. The photoelectric conversion layer 15 is formed on the insulating layer 82 and the second electrode 16 is formed on the photoelectric conversion layer 15. A protective layer 83 is formed on the entire surface including the second electrode 16, and an on-chip microlens 90 is provided on the protective layer 83. The first electrode 11, the charge storage electrode 12, and the second electrode 16 are, for example, formed of a transparent electrode formed of, for example, ITO (work function: about 4.4 eV). The photoelectric conversion layer 15 is formed of a layer containing at least a known organic photoelectric conversion material sensitive to green (e.g., organic material such as rhodamine-based pigment, melacyanine-based pigment, quinacridone or the like). Furthermore, the photoelectric conversion layer 15 may further include a material layer suitable for charge storage. In other words, a material layer suitable for charge storage may be formed between the photoelectric conversion layer 15 and the first electrode 11 (e.g., in the connection portion 67). The interlayer insulating layer 81, the insulating layer 82, and the protective layer 83 are formed of a known insulating material (e.g., $SiO_2$ or SiN). The photoelectric conversion layer 15 and the first electrode 11 are connected by the connection portion 67 provided on the insulating layer 82. The photoelectric conversion layer 15 extends in the connection portion 67. That is, the photoelectric conversion layer 15 extends in an opening 84 provided in the insulating layer 82 and is connected to the first electrode 11.

The charge storage electrode 12 is connected to the drive circuit. Specifically, the charge storage electrode 12 is connected to a vertical drive circuit 112 forming the drive circuit via a connection hole 66, a pad portion 64 and a wiring $V_{OA}$ provided in the interlayer insulating layer 81.

The size of the charge storage electrode 12 is larger than that of the first electrode 11. When an area of the charge storage electrode 12 is defined as S1' and an area of the first electrode 11 is defined as S1, it is preferable to satisfy 4≤S1'/S1, but the present disclosure is not limited thereto, and in Embodiment 1, for example, S1'/S1=8, but the present disclosure is not limited thereto. Further, in Embodiment 1 or Embodiments 2 to 4 which will be described below, three photoelectric conversion unit segments $10_1$, $10_2$ and $10_3$ have the same size and have the same planar shape.

An element separation region 71 is formed on the side of the first surface (front surface) 70A of the semiconductor substrate 70, and an oxide film 72 is formed on the first surface 70A of the semiconductor substrate 70. Moreover, a reset transistor $TR1_{rst}$, an amplification transistor $TR1_{amp}$ and select transistor $TR1_{sel}$ forming the control unit of the first imaging element are provided on the side of the first surface of the semiconductor substrate 70, and a first floating diffusion layer $FD_1$ is further provided.

The reset transistor $TR1_{rst}$ is formed of a gate section 51, a channel forming region 51A and source/drain regions 51B and 51C. The gate section 51 of the reset transistor $TR1_{rst}$ is connected to the reset line $RST_1$, and the source/drain region 51C of one side of the reset transistor $TR1_{rst}$ also functions as the first floating diffusion layer $FD_1$, and the source/drain region 51B of another side is connected to the power supply $V_{DD}$.

The first electrode 11 is connected to a source/drain region 51C (first floating diffusion layer $FD_1$) of one side of the reset transistor $TR1_{rst}$ via a connection hole 65 and a pad portion 63 provided in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ is formed of the gate section 52, the channel forming region 52A and the source/drain regions 52B and 52C. The gate section 52 is connected to the first electrode 11 and the source/drain region 51C (first floating diffusion layer $FD_1$) of one side of the reset transistor $TR1_{rst}$ through the wiring layer 62. Furthermore, the source/drain region 52B of one side shares a region with the source/drain region 51B of another side forming the reset transistor $TR1_{rst}$, and is connected to power supply $V_{DD}$.

The select transistor $TR1_{sel}$ is formed of the gate section 53, the channel forming region 53A and the source/drain regions 53B and 53C. The gate section 53 is connected to the select line $SEL_1$. Furthermore, the source/drain region 53B of one side shares a region with the source/drain region 52C of another side forming the amplification transistor $TR1_{amp}$, and the source/drain region 53C is connected to the signal line (data output line) $VSL_1$ 117.

The second imaging element includes an n-type semiconductor region 41 provided in the semiconductor substrate 70 as a photoelectric conversion layer. The gate portion 45 of the transfer transistor $TR2_{trs}$ formed of the vertical transistor extends to the n-type semiconductor region 41 and is connected to the transfer gate line $TG_2$. Furthermore, a second floating diffusion layer $FD_2$ is provided in a region 45C of the semiconductor substrate 70 near the gate section 45 of the transfer transistor $TR2_{trs}$. Charges stored in the n-type semiconductor region 41 are read out to the second floating diffusion layer $FD_2$ via a transfer channel formed along the gate section 45.

In the second imaging element, the reset transistor $TR2_{trs}$, the amplification transistor $TR2_{amp}$ p and the select transistor $TR2_{sel}$ forming the control unit of the second imaging element are further provided on the first surface side of the semiconductor substrate 70.

The reset transistor $TR2_{trs}$ is formed of the gate section, the channel forming region and the source/drain region. The gate section of the reset transistor $TR2_{trs}$ is connected to the reset line $RST_2$, and a source/drain region of one side of the reset transistor $TR2_{trs}$ is connected to the power supply $V_{DD}$, and a source/drain region of another side also functions as a second a floating diffusion layer $FD_2$.

The amplification transistor $TR2_{amp}$ is formed of the gate section, the channel forming region and the source/drain region. The gate section is connected to a source/drain region (second floating diffusion layer $FD_2$) of another side of the reset transistor $TR2_{trs}$. Furthermore, a source/drain region of one side shares a region with a source/drain region of one side forming the reset transistor $TR2_{trs}$, and is connected to the power supply $V_{DD}$.

The select transistor $TR2_{sel}$ is formed of the gate section, the channel forming region and the source/drain region. The gate section is connected to the select line $SEL_2$. Furthermore, a source/drain region of one side shares a region with a source/drain region of another side forming the amplification transistor $TR2_{amp}$, and a source/drain region of another side is connected to the signal line (data output line) $VSL_2$.

The third imaging element has an n-type semiconductor region 43 provided in the semiconductor substrate 70 as a photoelectric conversion layer. The gate section 46 of the transfer transistor $TR3_{trs}$ is connected to the transfer gate line $TG_3$. Furthermore, a third floating diffusion layer $FD_3$ is provided in a region 46C of the semiconductor substrate 70 near the gate section 46 of the transfer transistor $TR3_{trs}$. Charges stored in the n-type semiconductor region 43 are read out to the third floating diffusion layer $FD_3$ via a transfer channel 46A formed along the gate section 46.

In the third imaging element, the reset transistor $TR3_{rst}$, the amplification transistor $TR3_{amp}$ and the select transistor $TR3_{SEL}$ forming the control unit of the third imaging element are further provided on the first surface side of the semiconductor substrate 70.

The reset transistor $TR3_{rst}$ is formed of the gate section, the channel forming region and the source/drain region. The gate section of the reset transistor $TR3_{rst}$ is connected to the reset line $RST_3$, and a source/drain region of one side of the reset transistor $TR3_{rst}$ is connected to the power supply $V_{DD}$, and a source/drain region of another side also functions as the third floating diffusion layer $FD_3$.

The amplification transistor $TR3_{amp}$ is formed of the gate section, the channel forming region and the source/drain region. The gate section is connected to the source/drain region (third floating diffusion layer $FD_3$) of another side of the reset transistor $TR3_{rst}$. Furthermore, a source/drain region of one side shares a region with a source/drain region of one side forming the reset transistor $TR3_{rst}$, and is connected to the power supply $V_{DD}$.

The select transistor $TR3_{SEL}$ is formed of the gate section, the channel forming region and the source/drain region. The gate section is connected to the select line $SEL_3$. Furthermore, a source/drain region of one side shares a region with a source/drain region of another side forming the amplification transistor $TR3_{amp}$, and a source/drain region of another side is connected to the signal line (data output line) $VSL_3$.

Reset lines $RST_1$, $RST_2$ and $RST_3$, select lines $SEL_1$, $SEL_2$ and $SEL_3$, and transfer gate lines $TG_2$ and $TG_3$ are connected to the vertical drive circuit 112 forming the drive circuit, and signal lines (data output lines) $VSL_1$, $VSL_2$ and $VSL_3$ are connected to a column signal processing circuit 113 forming the drive circuit.

A $p^+$ layer 44 is provided between the n-type semiconductor region 43 and the surface 70A of the semiconductor substrate 70 to suppress generation of dark current. A $p^+$ layer 42 is formed between the n-type semiconductor region 41 and the n-type semiconductor region 43, and a part of the side surface of the n-type semiconductor region 43 is surrounded by the $p^+$ layer 42. A $p^+$ layer 73 is formed on the side of the back surface 70B of the semiconductor substrate 70, and an $HfO_2$ film 74 and an insulating film 75 are formed in a portion of the semiconductor substrate 70 where the contact hole portion 61 is to be formed from the $p^+$ layer 73. In the interlayer insulating layer 76, wirings are formed over a plurality of layers, but are omitted from illustration.

The $HfO_2$ film 74 is a film having a negative fixed charge, and generation of dark current can be suppressed by providing such a film. Further, instead of the $HfO_2$ film, an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, a europium oxide ($Eu_2O_3$) film, a gadolinium oxide ($Gd_2O_3$) film, a terbium oxide ($TB_2O_3$) film, a dysprosium oxide ($Dy_2O_3$) film, a holmium oxide ($Ho_2O_3$) film, a thulium oxide ($Tm_2O_3$) film, a ytterbium oxide ($YB_2O_3$) film, a lutetium oxide ($Lu_2O_3$) film, a yttrium oxide ($Y_2O_3$) film, a hafnium nitride film, an aluminum nitride film, a hafnium oxynitride film and an aluminum oxynitride film may be used. Examples of the film forming method of these films include a CVD method, a PVD method and an ALD method.

Hereinafter, the operation of the imaging element (first imaging element), of Embodiment 1 will be described with reference to FIG. 6. Here, the potential of the first electrode 11 is higher than the potential of the second electrode. That is, for example, the first electrode 11 is set to a positive potential and the second electrode is set to a negative potential, and photoelectric conversion is performed in the photoelectric conversion layer 15, and electrons are read out to the floating diffusion layer. This also applies to other embodiments. Further, in an aspect in which the first electrode 11 is set to a negative potential and the second electrode is set to a positive potential and holes generated based on photoelectric conversion in the photoelectric conversion layer 15 are read out to the floating diffusion layer, it is only necessary to invert the height of the potential described below.

The reference symbols used in FIGS. 6, 20 and 21 in Embodiment 5 to be described below are as follows.

PA: a potential at point PA in the region of the photoelectric conversion layer 15 opposite to the charge storage electrode 12, or, a potential at point PA in the region of the photoelectric conversion layer 15 opposite to the charge storage electrode segment $123$;

PB: a potential at point PB of the region of the photoelectric conversion layer 15 opposite to the region located between the charge storage electrode 12 and the first electrode 11, or, a potential at point PB in the region of the photoelectric conversion layer 15 opposite to the charge storage electrode segment $122$;

PC: a potential at point PC in the region of the photoelectric conversion layer 15 opposite to the first electrode 11, or, a potential at point PC in the region of the photoelectric conversion layer 15 opposite to the charge storage electrode segment $121$ PD: a potential at point PD in the region of the photoelectric conversion layer 15 opposite to the region located between the charge storage electrode segment $123$ and the first electrode 11;

FD: a potential of the first floating diffusion layer $FD_1$:

VOA: a potential of the charge storage electrode 12;

VOA1: a potential of the first charge storage electrode segment $12_1$;

VOA2: a potential of the second charge storage electrode segment $12_2$;

VOA3: a potential of the third charge storage electrode segment $12_3$;

RST: a potential of the gate section 51 of the reset transistor $TR1_{rst}$;

VDD: a potential of the power supply;

VSL_1: the signal line (data output line) $VSL_1$;

TR1_rst: the reset transistor $TR1_{rst}$;

TR1_amp: the amplification transistor $TR1_{amp}$; and

TR1_sel: the select transistor $TR1_{sel}$.

In the charge storage period, the potential $V_{11}$ is applied to the first electrode 11 and the potential $V_{12}$ is applied to the charge storage electrode 12 from the drive circuit. Photoelectric conversion occurs in the photoelectric conversion layer 15 by light incident on the photoelectric conversion layer 15. The holes generated by the photoelectric conversion are sent from the second electrode 16 to the drive circuit via the wiring $V_{OU}$. On the other hand, since the potential of the first electrode 11 is higher than the potential of the second electrode 16, that is, for example, a positive potential is applied to the first electrode 11 and a negative potential is applied to the second electrode 16, and thus $V_{12} \geq V_{11}$ or preferably $V_{12} > V_{11}$. As a result, the electrons generated by the photoelectric conversion are attracted to the charge storage electrode 12 and stop at the region of the photoelectric conversion layer 15 opposite to the charge storage electrode 12. That is, charges are stored in the photoelectric conversion layer 15. Since $V_{12} > V_{11}$, electrons generated in the photoelectric conversion layer 15 do not move toward the first electrode 11. As the photoelectric conversion time elapses, the potential in the region of the photoelectric conversion layer 15 opposite to the charge storage electrode 12 becomes a more negative value.

In the imaging element of Embodiment 1, since the configuration in which the thickness of the insulating layer segment gradually increases adopted, when $V_{12} \geq V_{11}$ in the charge storage period, the $n^{th}$ photoelectric conversion unit segment $10_n$ can store a larger amount of charge as compared to the $(n+1)^{th}$ photoelectric conversion unit segment $10_{(n+1)}$, and a strong electric field can be applied thereto, and thus can reliably prevent the charge flow from the first photoelectric conversion unit segment $10_1$ to the first electrode 11.

A reset operation is performed at the latter stage of the charge storage period. As a result, the potential of the first floating diffusion layer $FD_1$ is reset such that the potential of the first floating diffusion layer $FD_1$ becomes the potential $V_{DD}$ of the power supply.

After the reset operation is completed, charges are read out. That is, in the charge transfer period, the potential $V_{21}$ is applied to the first electrode 11 and the potential $V_{22}$ is applied to the charge storage electrode 12 from the drive circuit. Here, it is assumed that $V_{22} < V_{21}$. As a result, electrons that have stopped in the region of the photoelectric conversion layer 15 opposite to the charge storage electrode 12 are read out to the first electrode 11 and further to the first floating diffusion layer $FD_1$. That is, the charges stored in the photoelectric conversion layer 15 are read out to the control unit.

More specifically, when $V_{22} < V_{21}$ in the charge transfer period, the charge flow from the first photoelectric conversion section segment $10_1$ to the first electrode 11, the charge flow from the $(n+1)^{th}$ photoelectric conversion section segment $10_{(n+1)}$ to the $n^{th}$ photoelectric conversion unit segment $10_n$ can be reliably secured.

Thus, a series of operations including charge storage, reset operation, charge transfer and the like are completed.

The operation of the amplification transistor $TR1_{amp}$ and the select transistor $TR1_{sel}$ after the electrons are read out to the first floating diffusion layer $FD_1$ are the same as that of the conventional transistors. A series of operations such as charge storage, reset operation, and charge transfer of the second imaging element and the third imaging element are the same as a series of conventional operations such as charge storage, reset operation, and charge transfer. Furthermore, the reset noise of the first floating diffusion layer $FD_1$ can be removed by a correlated double sampling (CDS) process as in the related art.

As described above, in Embodiment 1, or in the imaging element of Embodiments 1 to 6 and 9 to 11 which will be described below, a charge storage electrode which is disposed to be spaced apart from the first electrode and disposed opposite to the photoelectric conversion layer via an insulating layer is included, and thus, when the photoelectric conversion unit is irradiated with light such that photoelectric conversion occurs in the photoelectric conversion unit, a type of capacitor is formed by the photoelectric conversion layer, the insulating layer, and charge the photoelectric conversion layer can be stored. Therefore, at the start of exposure, it becomes possible to completely deplete the charge storage portion and remove charge. As a result, it is possible to suppress occurrence of a phenomenon in which the kTC noise becomes large, the random noise worsens, and degradation of the image quality is caused. Furthermore, since all the pixels can be reset simultaneously, a so-called global shutter function can be realized.

In addition, in the imaging element of Embodiment 1, since the thickness of the insulating layer segments gradually changes from the first photoelectric conversion unit segment to the $N^{th}$ photoelectric conversion unit segment, or, since the cross-sectional area of the stacked portion when the stacked portion in which the charge storage electrode, the insulating layer, and the photoelectric conversion layer are stacked is cut in a YZ virtual plane changes depending on the distance from the first electrode, a type of charge transfer gradient is formed, and charges generated by photoelectric conversion can be transferred more easily and reliably.

FIG. 9 shows a conceptual diagram of a solid-state imaging apparatus of Embodiment 1. The solid-state imaging apparatus 100 of Embodiment 1 is formed of an imaging region 111 in which the stacked-type imaging elements 101 are arranged in a two-dimensional array, a vertical drive circuit 112 as a drive circuit (peripheral circuit), a column signal processing circuit 113, a horizontal drive circuit 114, an output circuit 115, a drive control circuit 116, etc. These circuits may be formed by well-known circuits, and moreover, may be formed by using other circuit configurations (e.g., various circuits used in a conventional CCD type solid-state imaging apparatus or CMOS type solid-state imaging apparatus). Further, in FIG. 9, the reference number "101" of the stacked-type imaging element 101 is only shown in one row.

The drive control circuit 116 generates a clock signal and a control signal which are the basis of the operations of the vertical drive circuit 112, the column signal processing circuit 113, and the horizontal drive circuit 114 based on a vertical synchronization signal, a horizontal synchronization signal, and a master clock. Further, the generated clock signal and control signal are input to the vertical drive circuit 112, the column signal processing circuit 113, and the horizontal drive circuit 114.

The vertical drive circuit 112 is formed of, for example, a shift register, and selectively scans each stacked-type imaging element 101 in the imaging area 111 in the vertical direction in units of rows. Further, a pixel signal (image signal) based on the current (signal) generated according to the amount of light received by each stacked-type imaging element 101 is sent to the column signal processing circuit 113 via the signal lines (data output lines) 117, VSL.

For example, the column signal processing circuit 113 is arranged for each column of the stacked-type imaging element 101, and signal processing for noise removal and signal amplification is performed on image signal output from the stacked-type imaging element 101 for one row in each stacked-type imaging element 101 by a signal from a black reference pixel (not shown, but formed around the effective pixel area). A horizontal selection switch (not shown) is provided in the output stage of the column signal processing circuit 113 so as to be connected to the horizontal signal line 118.

The horizontal drive circuit 114 is formed of, for example, a shift register, and sequentially selects each of the column signal processing circuits 113 by sequentially outputting horizontal scanning pulses, and outputs signals from each of the column signal processing circuits 113 to the horizontal signal line 118.

The output circuit 115 is output by performing signal processing on the signals sequentially supplied from each of the column signal processing circuits 113 via the horizontal signal line 118.

As shown in FIG. 10 showing an equivalent circuit diagram of a modified example of the imaging element and stacked-type imaging element of Embodiment 1 and in FIG. 11 showing the schematic arrangement of the first electrode, the charge storage electrode, and the transistor forming the control unit forming a modified example of the imaging element according to Embodiment 1, and the source/drain region 51B of another side of the reset transistor $TR1_{rst}$ may be grounded instead of being connected to the power supply $V_{DD}$.

The imaging element and stacked-type imaging element of Embodiment 1 may be manufactured by, for example, the following method. That is, first, an SOI substrate is prepared. Then, a first silicon layer is formed on the surface of the SOI substrate by an epitaxial growth method, and a p$^+$ layer 73 and an n-type semiconductor region 41 are formed in the first silicon layer. Next, a second silicon layer is formed on the first silicon layer by an epitaxial growth method, and the element separation region 71, the oxide film 72, the p$^+$ layer 42, the n-type semiconductor region 43, and the p$^+$ layer 44 are formed on the second silicon layer. Furthermore, various transistors and the like forming the control unit of the imaging element are formed on the second silicon layer, and the wiring layer 62, an interlayer insulating layer 76, and various wirings are further formed thereon, and then the interlayer insulating layer 76 and the supporting substrate (not shown) are bonded to each other. Thereafter, the SOI substrate is removed to expose the first silicon layer. Further, the surface of the second silicon layer corresponds to the surface 70A of the semiconductor substrate 70, and the surface of the first silicon layer corresponds to the back surface 70B of the semiconductor substrate 70. Furthermore, the first silicon layer and the second silicon layer are collectively referred to as the semiconductor substrate 70. Next, an opening for forming the contact hole portion 61 is formed on the side of the back surface 70B of the semiconductor substrate 70, and the HfO$_2$ film 74, the insulating film 75 and the contact hole portion 61 are formed, and the pad portions 63 and 64, the interlayer insulating layer 81, the connection holes 65 and 66, the first electrode 11, the charge storage electrode 12, and the insulating layer 82 are further formed. Next, the connection portion 67 is opened to form the photoelectric conversion layer 15, the second electrode 16, the protective layer 83, and the on-chip microlens 90. Accordingly, the imaging element and the stacked-type imaging element of Embodiment 1 may be obtained.

In the imaging element of Embodiment 1, in the formation of the first electrode 11, the charge storage electrode 12 and the insulating layer 82, first, a conductive material for forming the charge storage electrode 123 is formed on the interlayer insulating layer 81 and the conductive material layer is patterned to leave the conductive material layer in the region where the photoelectric conversion unit segments 10$_1$, 10$_2$, and 10$_3$ and the first electrode 11 are to be formed, whereby a part of the first electrode 11 and the charge storage electrode 123 $m$ may be obtained. Next, an insulating layer for forming the insulating layer segment 82$_3$ is formed on the entire surface, the insulating layer is patterned, and a flattening treatment is performed thereon, and thereby the insulating layer segment 82$_3$ may be obtained. Next, a conductive material layer for forming the charge storage electrode 122 is formed on the entire surface, and the conductive material layer is patterned to leave the conductive material layer in the region where the photoelectric conversion unit segments 10$_1$ and 10$_2$ and the first electrode 11 are to be formed, and thereby a part of the first electrode 11 and the charge storage electrode 122 may be obtained. Next, an insulating layer for forming the insulating layer segment 82$_2$ is formed on the entire surface, the insulating layer is patterned, and planarization treatment is performed thereon, and thereby the insulating layer segment 82$_2$ may be obtained. Next, a conductive material layer for forming the charge storage electrode 121 is formed on the entire surface, and the conductive material layer is patterned to leave the conductive material layer in the region where the photoelectric conversion unit segment 10$_1$ and the first electrode 11 are to be formed, and thereby the first electrode 11 and the charge storage electrode 121 may be obtained. Next, the insulating layer is formed on the entire surface, and planarization treatment is performed thereon, and thereby the insulating layer segment 82$_1$ (insulating layer 82) may be obtained. Then, the photoelectric conversion layer 15 is formed on the insulating layer 82. Thus, the photoelectric conversion unit segments 10$_1$, 10$_2$ and 10$_3$ may be obtained.

Embodiment 2

The imaging element of Embodiment 2 relates to an imaging element according to the second and sixth aspects. As shown in FIG. 12 which is a schematic partial sectional view of an expanded part in which a charge storage electrode, a photoelectric conversion layer and a second electrode are stacked in an imaging element of Embodiment 2, in the imaging element of Embodiment 2, the thickness of the photoelectric conversion layer segment gradually changes from the first photoelectric conversion unit segment 10$_1$ to the N$^{th}$ photoelectric conversion unit segment 10$_N$. Alternatively, in the imaging element of Embodiment 2, the width of the cross section of the stacked portion is constant and the thickness of the cross section of the stacked portion, specifically the thickness of the photoelectric conversion layer segment gradually increases depending on the distance from the first electrode 11. More specifically, the thickness of the photoelectric conversion layer segment gradually increases. Further, the thickness of the photoelectric conversion layer segment increases in a stepwise manner. The thickness of the photoelectric conversion layer segment 15$n$ in the n$^{th}$ photoelectric conversion unit segment 10$n$ is constant. When the thickness of the photoelectric conversion layer segment 15$n$ in the n$^{th}$ photoelectric conversion unit segment 10$n$ is defined as "1", the photoelectric conversion layer segment 15$_{(n+1)}$ in the (n+1)$^{th}$ photoelectric conversion unit segment 10$_{(n+1)}$ may be exemplified as 2 to 10, but it is not limited to such values. In Embodiment 2, the thicknesses of the photoelectric conversion layer segments 15$_1$, 15$_2$ and 15$_3$ are gradually increased by gradually decreasing the thickness of the charge storage electrode segments 12$_1$, 12$_2$ and 12$_3$. The thickness of the insulating layer segments 82$_1$, 82$_2$ and 82$_3$ is constant.

In the imaging element of Embodiment 2, since the thickness of the photoelectric conversion layer segment gradually increases, when $V_{12} \geq V_{11}$ in the charge storage period, the n$^{th}$ photoelectric conversion unit segment 10$n$ is applied with a stronger electric field than the (n+1)$^{th}$ photoelectric conversion unit segment 10$_{(n+1)}$, and thereby the charge flow from the first photoelectric conversion unit segment 10$_1$ to the first electrode 11 may be reliably prevented. Further, when $V_{22} < V_{21}$ in the charge transfer period, the charge flow from the first photoelectric conversion section segment 10$_1$ to the first electrode 11, and the charge flow from the $(n+1)^{th}$ photoelectric conversion unit segment $10_{(n+1)}$ to the $n^{th}$ photoelectric conversion unit segment $10n$ may be reliably ensured.

As such, in the imaging element of Embodiment 2, the thickness of the photoelectric conversion layer segment gradually changes from the first photoelectric conversion unit segment to the $N^{th}$ photoelectric conversion unit segment, or, the cross sectional area of the stacked portion when the stacked portion in which the charge storage electrode, the insulating layer, and the photoelectric conversion layer are stacked is cut in a YZ virtual plane changes depending on the distance from the first electrode, a type of charge transfer gradient is formed, and charges generated by photoelectric conversion can be transferred more easily and reliably.

In the imaging element of Embodiment 2, in the formation of the first electrode 11, the charge storage electrode 12 and the insulating layer 82, first, a conductive material for forming the charge storage electrode 123 is formed on the interlayer insulating layer 81 and the conductive material layer is patterned to leave the conductive material layer in the region where the photoelectric conversion unit segments $10_1$, $10_2$, and $10_3$ and the first electrode 11 are to be formed, whereby a part of the first electrode 11 and the charge storage electrode 123 may be obtained. Next, a conductive material layer for forming the charge storage electrode 123 is formed on the entire surface, the conductive material layer is patterned to leave the conductive material layer in the region where the photoelectric conversion unit segments $10_1$ and $10_2$ and the first electrode 11 are to be formed, and thereby a part of the first electrode 11 and the charge storage electrode 122 may be obtained. Next, a conductive material layer for forming the charge storage electrode 121 is formed on the entire surface, the conductive material layer is patterned to leave the conductive material layer in the region where the photoelectric conversion unit segment $10_1$ and the first electrode 11 are to be formed, and thereby the first electrode 11 and the charge storage electrode 121 may be obtained. Then, an insulating layer 82 is conformally deposited on the entire surface. Then, the photoelectric conversion layer 15 is formed on the insulating layer 82, and the photoelectric conversion layer 15 is subjected to planarization processing. Thus, the photoelectric conversion unit segments $10_1$, $10_2$ and $10_3$ may be obtained.

Embodiment 3

Embodiment 3 relates to the imaging element according to the third aspect of the present disclosure. A schematic partial sectional view of an imaging element and a stacked-type imaging element of Embodiment 3 is shown in FIG. 13. In the imaging element of Embodiment 3, materials forming the insulating layer segments are different in the adjacent photoelectric conversion unit segments. Here, the value of the relative dielectric constant of the material forming the insulating layer segment gradually decreases from the first photoelectric conversion unit segment $10_1$ to the $N^{th}$ photoelectric conversion unit segment $10_N$. In the imaging element of Embodiment 3, the same electric potential may be applied to all of the N charge-storage electrode segments or different electric potentials may be added to each of the N charge-storage electrode segments. In the latter case, as described in Embodiment 4, the charge storage electrode segments $12_1$, $12_2$, and $12_3$, which are disposed to be spaced apart from each other, may be connected to the vertical drive circuit 112 forming the drive circuit via pad portions $64_1$, $64_2$ and $64_3$.

Further, when such a configuration is adopted, a type of charge transfer gradient is formed, and thus, when $V_{12} \geq V_{11}$ in the charge storage period, the $n^{th}$ photoelectric conversion unit segment stores a larger amount of charge than the $(n+1)^{th}$ photoelectric conversion unit segment. Further, in the state of $V_{22} < V_{21}$ during the charge storage period, the charge flow from the first photoelectric conversion unit segment to the first electrode, and the charge flow from the $(n+1)^{th}$ photoelectric conversion unit segment to the $n^{th}$ photoelectric conversion unit segment can be reliably ensured.

Embodiment 4

Embodiment 4 relates the imaging element according to the fourth aspect of the present disclosure. A schematic partial sectional view of imaging elements and stacked-type imaging elements of Embodiment 4 is illustrated in FIG. 14. In the imaging element of Embodiment 4, materials forming the charge storage electrode segments are different in adjacent photoelectric conversion unit segments. Here, the value of the work function of the material forming the insulating layer segment gradually increases from the first photoelectric conversion unit segment $10_1$ to the $N^{th}$ photoelectric conversion unit segment $10_N$. In the imaging element of Embodiment 4, the same electric potential may be applied to all of the N charge storage electrode segments, or different electric potentials may be added to each of the N charge storage electrode segments. In the latter case, the charge storage electrode segments $12_1$, $12_2$, and $12_3$ are connected to the vertical drive circuit 112 forming the drive circuit via the pad portions $64_1$, $64_2$, and $64_3$.

Embodiment 5

The imaging element of Embodiment 5 relates to the imaging element according to the fifth aspect of the present disclosure. Schematic plan views of the charge storage electrode segment of Embodiment 5 are shown in FIGS. 15A, 15B, 16A and 16B. Furthermore, equivalent circuit diagrams of the imaging element and stacked-type imaging element of Embodiment 5 are shown in FIGS. 17 and 18, and a schematic arrangement view of a first electrode, a charge storage electrode and a control unit forming the imaging element of Embodiment 5 is shown in FIG. 19, and the state of the potential at each part during the operation of the imaging element of Embodiment 5 is schematically shown in FIGS. 20 and 21. Schematic partial sectional views of the imaging element and the stacked-type imaging element of Embodiment 5 are the same as those shown in FIG. 14 or 23. In the imaging element of Embodiment 5, the area of the charge storage electrode segment gradually decreases from the first photoelectric conversion unit segment $10_1$ to the $N^{th}$ photoelectric conversion unit segment $10_N$. In the imaging element of Embodiment 5, the same electric potential may be applied to all of the N charge storage electrode segments, or different electric potentials may be added to each of the N charge storage electrode segments. In the latter case, as described in Embodiment 4, the charge storage electrode segments $12_1$, $12_2$, and $12_3$ disposed to be spaced apart from each other may be connected to the vertical drive circuit 112 via pad portions $64_1$, $64_2$, and $64_3$.

In Embodiment 5, the charge storage electrode 12 is formed of a plurality of the charge storage electrode segments $12_1$, $12_2$, and $12_3$. In accordance with embodiments of the present disclosure, a charge storage segment in the Nth photoelectric conversion unit segment may refer to the Nth charge storage segment. For example, a charge storage segment in the first photoelectric conversion unit segment may refer to 121. The number of the charge storage electrode segments may be 2 or more, and is set to "3" in Embodiment 5. Further, in the imaging element and the stacked-type imaging element of Embodiment 5, since the potential of the first electrode 11 is higher than the potential of the second electrode 16, that is, for example, a positive potential is applied to the first electrode 11, the negative potential is applied to the second electrode 16, and thus, in the charge transfer period, the potential applied to the charge storage electrode segment $12_1$ located closest to the first electrode 11 is higher than the potential applied to the charge storage electrode segment $12_3$ located farthest from the first electrode 11. In this way, electrons that have stopped in the region of the photoelectric conversion layer 15 opposite to the charge storage electrode 12 are transferred to the first electrode 11, and further reliably read out to the first floating diffusion layer $FD_1$ by imparting a potential gradient to the charge storage electrode 12. That is, charges stored in the photoelectric conversion layer 15 are read out to the control unit.

In an example shown in FIG. 20, when the potential of charge storage electrode segment $12_3$<the potential of charge storage electrode segment $12_2$<the potential of charge storage electrode segment $12_1$ in the charge transfer period, electrons that have stopped in the region of the photoelectric conversion layer 15 are simultaneously transferred to the first floating diffusion layer $FD_1$. On the other hand, in an example shown in FIG. 21, when the potential of the charge storage electrode segment $12_3$, the potential of the charge storage electrode segment $12_2$, and the potential of the charge storage electrode segment $12_1$ are gradually changed (that is, changed in a step manner or in a slope manner) in the charge transfer period, the electrons that have stopped in the region of the photoelectric conversion layer 15 opposite to the charge storage electrode segment $12_3$ are moved to the region of the photoelectric conversion layer 15 opposite to the charge storage electrode segment $12_2$, and subsequently, the electrons that have stopped in the region of the photoelectric conversion layer 15 opposite to the charge storage electrode segment $12_2$ are moved to the region of the photoelectric conversion layer 15 opposite to the charge storage electrode segment $12_1$, and subsequently, the electrons that have stopped in the region of the photoelectric conversion layer 15 opposite to the charge storage electrode segment $12_1$ are reliably read out to the first floating diffusion layer $FD_1$.

As a schematic arrangement view of a first electrode and a charge storage electrode forming a modified example of the imaging element of Embodiment 5 and a transistor forming a control unit shown in FIG. 22, a source/drain region 51B of another side of the reset transistor $TR1_{rst}$ may be grounded instead of being connected to the power supply $V_{DD}$.

Even in the imaging element of Embodiment 5, a type of charge transfer gradient is formed by adopting such a configuration. That is, since the area of the charge storage electrode segment gradually decreases from the first photoelectric conversion section segment $10_1$ to the $N^{th}$ photoelectric conversion section segment $10_N$, when $V_{12} \geq V_{11}$ in the charge storage period, the $n^{th}$ photoelectric conversion unit segment can store a larger amount of charge than the $(n+1)^{th}$ photoelectric conversion unit segment. Further, when $V_{22} < V_{21}$ in a charge transfer period, the charge flow from the first photoelectric conversion unit segment to the first electrode and the charge flow from the $(n+1)^{th}$ photoelectric conversion unit segment to the $n^{th}$ photoelectric conversion unit segment can be reliably secured.

Embodiment 6

Embodiment 6 relates to the imaging element according to the sixth aspect of the present disclosure. A schematic partial sectional view of the imaging element and the stacked-type imaging element of Embodiment 6 is shown in FIG. 23. Furthermore, schematic plan views of the charge storage electrode segments of Embodiment 6 are shown in FIGS. 24A and 24B. The imaging element of Embodiment 6 includes a photoelectric conversion unit formed by stacking a first electrode 11, a photoelectric conversion layer 15, and a second electrode 16, and the photoelectric conversion unit further includes a charge storage electrode 12 which is disposed to be spaced apart from the first electrode 11 and is disposed to face the photoelectric conversion layer 15 via the insulating layer 82. Further, in a case in which a stacking direction of the charge storage electrode 12, the insulating layer 82, and the photoelectric conversion layer 15 is defined as a Z direction and a direction away from the first electrode 11 is defined as an X direction, the cross-sectional area of the stacked portion when the stacked portion in which the charge storage electrode 12, the insulating layer 82, and the photoelectric conversion layer 15 are stacked is cut in a YZ virtual plane changes depending on the distance from the first electrode 11.

Specifically, in the imaging element of Embodiment 6, the thickness of the cross section of the stacked portion is constant, and the width of the cross section of the stacked portion is narrowed as being away from the first electrode 11. Further, the width may be continuously narrowed (see FIG. 24A), or may be narrowed in a stepwise manner (see FIG. 24B). In accordance with embodiments of the present disclosure, and as illustrated in FIG. 24A and FIG. 24B, a plurality of charge storage electrode segments $12_1$, $12_2$, and $12_3$ may be formed with a charge storage electrode segment that is common to each of the plurality of charge storage electrode segments $12_1$, $12_2$, and $12_3$. Thus, a common portion of a charge storage electrode may be common to each of the plurality of charge storage electrode segments. As the photoelectric conversion unit segment may still be described in a direction away from the first electrode, (e.g., Nth photoelectric conversion unit segment in a direction in which n increases), each of the photoelectric conversion unit segments may include a plurality of charge storage electrode portions, where each charge storage electrode portion may be described in a direction that is perpendicular to a direction in which n increases.

As described above, in the imaging element of Embodiment 5, since the cross-sectional area of the stacked portion when the stacked portion in which the charge storage electrode 12, the insulating layer 82, and the photoelectric conversion layer 15 are stacked is cut in the YZ virtual plane varies depending on the distance from the first electrode, a type of charge transfer gradient is formed, and the charges generated by photoelectric conversion can be transferred more easily and reliably.

Embodiment 7

Embodiment 7 relates to the solid-state imaging apparatus according to the first and second aspects of the present disclosure.

The solid-state imaging apparatus of Embodiment 7 includes a photoelectric conversion unit formed by stacking a first electrode 11', a photoelectric conversion layer 15 and a second electrode 16, the photoelectric conversion unit further includes a plurality of imaging elements including a charge storage electrode 12' which is disposed to be spaced apart from the first electrode 11' and disposed to face the photoelectric conversion layer 15 via the insulating layer 82, an imaging element block is formed of a plurality of the imaging elements, and the first electrode 11' is shared by a plurality of the imaging elements forming the imaging element block.

Alternatively, the solid-state imaging apparatus of Embodiment 7 includes a plurality of imaging elements described in Embodiments 1 to 6.

In Embodiment 7, one floating diffusion layer is provided for a plurality of the imaging element. Further, a plurality of the imaging elements may share one floating diffusion layer by suitably controlling the timing of the charge transfer period. Further, in this case, a plurality of imaging elements may share one contact hole portion.

Further, the solid-state imaging apparatus of Embodiment 7 substantially has the same configuration and structure as those of the solid-state imaging apparatus described in Embodiments 1 to 6 except that the first electrode 11' is shared by a plurality of the imaging elements forming the imaging element block.

The arrangement state of the first electrode 11' and the charge storage electrode 12' in the solid-state imaging apparatus of Embodiment 7 is schematically shown in FIG. 25 (Embodiment 7), FIG. 26 (first modified example of Embodiment 7), FIG. 27 (second modified example of Embodiment 7), FIG. 28 (third modified example of Embodiment 7) and FIG. 29 (fourth modified example of Embodiment 7). Sixteen imaging elements are shown in FIGS. 25, 26, 29 and 30, and twelve imaging elements are shown in FIGS. 27 and 28. Further, an imaging element block is formed of two imaging elements. The imaging element block is surrounded by a dotted line. The suffix attached to the first electrode 11' and the charge storage electrode 12' is for distinguishing the first electrode 11' from the charge storage electrode 12'. This also applies to the following description. Furthermore, one on-chip microlens (not shown in FIGS. 25 to 34] is disposed above one imaging element. Further, in one imaging element block, two charge storage electrodes 12' are disposed with the first electrode 11' interposed therebetween (see FIGS. 25 and 26). Alternatively, one first electrode 11' is disposed to face two juxtaposed charge storage electrodes 12' (see FIGS. 29 and 30). That is, the first electrode is disposed adjacent to the charge storage electrode of each imaging element. Alternatively, the first electrode is disposed adjacent to a part of the charge storage electrodes of a plurality of the imaging elements and is not disposed adjacent to the remaining charge storage electrodes of a plurality of the imaging elements (see FIGS. 27 and 28). In this case, the movement of charge from the rest of a plurality of the imaging elements to the first electrode is a movement through a part of a plurality of the imaging elements. It is preferable that the distance A between the charge storage electrode forming the imaging element and the charge storage electrode forming the imaging element is shorter than the distance B between the first electrode and the charge storage electrode in the imaging element adjacent to the first electrode in order to ensure the movement of charge from each imaging element to the first electrode. Furthermore, it is preferable that the imaging element located farther from the first electrode has a larger value of the distance A. Moreover, in examples shown in FIGS. 26, 28 and 30, a transfer control electrode 13' is disposed between a plurality of the imaging elements forming the imaging element block. It is possible to reliably suppress the movement of charge in the imaging element block across the transfer control electrode 13' by disposing the transfer control electrode 13'. Further, when a potential applied to the transfer control electrode 13' is set as $V_{13}$, it can be set as $V_{12} > V_{13}$ (e.g., $V_{12-2} > V_{13}$).

The transfer control electrode 13' may be formed at the same level as the first electrode 11' or the charge storage electrode 12' on the side of the first electrode or at a different level (specifically, at a level lower than first electrode 11' or charge storage electrode 12'). In the former case, since the distance between the transfer control electrode 13' and the photoelectric conversion layer can be shortened, the potential can be easily controlled. On the other hand, in the latter case, since the distance between the transfer control electrode 13' and the charge storage electrode 12' can be shorted, it is advantageous for miniaturization.

Hereinafter, the operation of the imaging element block formed of the first electrode $11'_2$ and two charge storage electrodes $12'_{21}$ and $12'_{22}$ will be described.

In the charge storage period, the potential $V_a$ is applied to the first electrode $11'_2$ and the potential $V_A$ is applied to the charge storage electrodes $12'_{21}$ and $12'_{22}$ from the drive circuit. Photoelectric conversion occurs in the photoelectric conversion layer 15 by light incident on the photoelectric conversion layer 15. The holes generated by the photoelectric conversion are sent from the second electrode 16 to the drive circuit via the wiring $V_{OU}$. On the other hand, since the potential of the first electrode $11'_2$ is higher than the potential of the second electrode 16, that is, for example, a positive potential is applied to the first electrode $11'_2$ and a negative potential is applied to the second electrode 16, and thus $V_A \geq V_a$, or preferably $V_A > V_a$. As a result, the electrons generated by the photoelectric conversion are attracted to the charge storage electrodes $12'_{21}$ and $12'_{22}$ and stop at the region of the photoelectric conversion layer 15 opposite to the charge storage electrodes $12'_{21}$ and $12'_{22}$. That is, charges are stored in the photoelectric conversion layer 15. Since $V_A \geq V_a$, electrons generated in the photoelectric conversion layer 15 do not move toward the first electrode $11'_2$. As the photoelectric conversion time elapses, the potential in the region of the photoelectric conversion layer 15 opposite to the charge storage electrodes $12'_{21}$ and $12'_{22}$ becomes a more negative value.

The reset operation is performed at the latter stage of the charge storage period. As a result, the potential of the first floating diffusion layer is reset, and the potential of the first floating diffusion layer becomes the potential $V_{DD}$ of the power supply.

After the reset operation is completed, charges are read out. That is, in the charge transfer period, the potential $V_b$ is applied to the first electrode $11'_2$, the potential $V_{21-B}$ is applied to the charge storage electrode $12'_{21}$, and the potential $V_{22-B}$ is applied to the charge storage electrode $12'_{22}$ from the drive circuit. Here, it is assumed that $V_{21-B} < V_b < V_{22-B}$. As a result, electrons that have stopped in the region of the photoelectric conversion layer 15 opposite to the charge storage electrode $12'_{21}$ are read out to the first electrode $11'_2$ and further to the first floating diffusion layer. That is, the charges stored in the region of the photoelectric conversion layer 15 opposite to the charge storage electrode $12'_{21}$ are read out to the control unit. When the readout is completed, it is assumed that $V_{22-B} \leq V_{21-B} < V_b$. Further, in examples shown in FIGS. 29 and 30, it may be assumed that $V_{22-B} < V_b < V_{21-B}$. Accordingly, electrons that have stopped in the region of the photoelectric conversion layer 15 opposite to the charge storage electrode 12'$_{22}$ are read out to the first electrode 11'$_2$, and further to the first floating diffusion layer. That is, the charges stored in the photoelectric conversion layer 15 are read out to the control unit. Furthermore, in examples shown in FIGS. 27 and 28, electrons that have stopped in the region of the photoelectric conversion layer 15 opposite to the charge storage electrode 12'$_{22}$ may be read out to the first floating diffusion layer via the first electrode 11'$_3$ adjacent to the charge storage electrode 12'$_{22}$. In this manner, the charges stored in the region of the photoelectric conversion layer 15 opposite to the charge storage electrode 12'$_{22}$ are read out to the control unit. Further, when the readout of charges stored in the region of the photoelectric conversion layer 15 opposite to the charge storage electrode 12'$_{21}$ to the control unit is completed, the potential of the first floating diffusion layer may be reset.

FIG. 35A shows readout driving examples in the imaging element block of Embodiment 7.

(Step A)

Auto zero signal input to comparator (Step B)

Reset operation of one shared floating diffusion layer (Step C)

P-phase readout in imaging element corresponding to charge storage electrode 12'$_{21}$ and charge movement to first electrode 11'$_2$ (Step D)

D-phase readout in imaging element corresponding to charge storage electrode 12'$_{21}$ and charge movement to first electrode 11'$_2$ (Step E)

Reset operation of one shared floating diffusion layer (Step F)

Auto zero signal input to comparator (Step G)

P-phase readout in imaging element corresponding to charge storage electrode 12'$_{22}$ and charge movement to first electrode 11'$_2$ (Step H)

Signals from two imaging elements corresponding to the charge storage electrode 12'$_{21}$ and charge storage electrode 12'$_{22}$ are read out in accordance with the flow of D-phase readout in the imaging element corresponding to the charge storage electrode 12'$_{22}$ and the movement of charge to the first electrode 11'$_2$. On the basis of the correlated double sampling (CDS) processing, the difference between the P-phase readout in Step C and the D-phase readout in Step D is a signal from the imaging element corresponding to the charge storage electrode 12'$_{21}$, and the difference between the P-phase readout in Step G and the D-phase readout in Step H is a signal from the imaging element corresponding to the charge storage electrode 12'$_{22}$.

Further, the operation of Step E may be omitted (see FIG. 35B). Furthermore, the operation of Step F may be omitted, and in this case, Step G can be omitted (see FIG. 35C), and a difference between the P-phase readout in Step C and the D-phase readout in Step D is a signal from the imaging element corresponding to the charge storage electrode 12'$_{21}$, and a difference between the D-phase readout in Step D and the D-phase readout in Step H is a signal from the imaging element corresponding to the charge storage electrode 12'$_{22}$.

In modified examples of the arrangement state of the first electrode 11' and the charge storage electrode 12' schematically shown in FIG. 31 (sixth modified example of Embodiment 7) and FIG. 32 (seventh modified example of Embodiment 7), an imaging element block is formed of four imaging elements. The operation of these solid-state imaging apparatuses may be substantially the same as the operation of the solid-state imaging apparatuses shown in FIGS. 25 to 30.

In modified examples 8 and 9 of the arrangement state of the first electrode 11' and the charge storage electrode 12' schematically shown in FIGS. 33 and 34, an imaging element block is formed of sixteen imaging elements. As shown in FIGS. 33 and 34, transfer control electrode 13'A$_1$, 13'A$_2$ and 13'A$_3$ are interposed between the charge storage electrode 12'$_{11}$ and the charge storage electrode 12'$_{12}$, between the charge storage electrode 12'$_{12}$ and the charge storage electrode 12'$_{13}$, and between the charge storage electrode 12'$_{13}$ and the charge storage electrode 12'$_{14}$. Furthermore, as shown in FIG. 34, transfer control electrodes 13'B$_1$, 13'B$_2$ and 13'B$_3$ are interposed between the charge storage electrodes 12'$_{21}$, 12'$_{31}$, 13'$_{41}$ and the charge storage electrodes 12'$_{22}$, 12'$_{32}$ and 13'42, between the charge storage electrodes 12'$_{22}$, 12'$_{32}$ and 13'42 and the charge storage electrodes 12'$_{23}$, 12'$_{33}$ and 13'$_{43}$, and between the charge storage electrodes 12'$_{23}$, 12'$_{33}$ and 13'$_{43}$ and the charge storage electrodes 12'$_{24}$, 12'$_{34}$ and 13'$_{44}$. Moreover, a transfer control electrode 13'C is interposed between the imaging element block and the imaging element block. Further, in these solid-state imaging apparatuses, the charges stored in the photoelectric conversion layer 15 can be read out from the first electrode 11' by controlling the sixteen the charge storage electrodes 12'.

(Step 10)

Specifically, first, the charges stored in the region of the photoelectric conversion layer 15 opposite to the charge storage electrode 12'$_{11}$ are read out from the first electrode 11'. Next, the charges stored in the region of the photoelectric conversion layer 15 opposite to the charge storage electrode 12'$_{12}$ is read from the first electrode 11' via the region of the photoelectric conversion layer 15 opposite to the charge storage electrode 12'$_{11}$. Next, the charges stored in the region of the photoelectric conversion layer 15 opposite to the charge accumulation electrode 12'$_{13}$ are read out from the first electrode 11' via the region of the photoelectric conversion layer 15 opposite to the charge storage electrode 12'$_{12}$ and the charge storage electrode 12'$_{11}$.

(Step 20)

Thereafter, the charges stored in the region of the photoelectric conversion layer 15 opposite to the charge storage electrode 12'$_{21}$ are moved to the region of the photoelectric conversion layer 15 opposite to the charge storage electrode 12'$_{11}$. The charges stored in the region of the photoelectric conversion layer 15 opposite to the charge storage electrode 12'$_{22}$ are moved to the region of the photoelectric conversion layer 15 opposite to the charge storage electrode 12'$_{12}$. The charges stored in the region of the photoelectric conversion layer 15 opposite to the charge storage electrode 12'$_{23}$ are moved to the region of the photoelectric conversion layer 15 facing the charge storage electrode 12'$_{13}$. The charges stored in the region of the photoelectric conversion layer 15 opposite to the charge storage electrode 12'$_{24}$ are moved to the region of the photoelectric conversion layer 15 opposite to the charge storage electrode 12'$_{14}$.

(Step 21)

The charges stored in the region of the photoelectric conversion layer 15 opposite to the charge storage electrode 12'$_{31}$ are moved to the region of the photoelectric conversion layer 15 opposite to the charge storage electrode 12'$_{21}$. The charges stored in the region of the photoelectric conversion layer 15 opposite to the charge storage electrode $12'_{32}$ are moved to the region of the photoelectric conversion layer 15 opposite to the charge storage electrode $12'_{22}$. The charges stored in the region of the photoelectric conversion layer 15 opposite to the charge storage electrode $12'_{33}$ are moved to the region of the photoelectric conversion layer 15 opposite to the charge storage electrode $12'_{23}$. The charges stored in the region of the photoelectric conversion layer 15 opposite to the charge storage electrode $12'_{34}$ are moved to the region of the photoelectric conversion layer 15 opposite to the charge storage electrode $12'_{24}$.

(Step 22)

The charges stored in the region of the photoelectric conversion layer 15 opposite to the charge storage electrode $12'_{41}$ are moved to the region of the photoelectric conversion layer 15 opposite to the charge storage electrode $12'_{31}$. The charges stored in the region of the photoelectric conversion layer 15 opposite to the charge storage electrode $12'_{42}$ are moved to the region of the photoelectric conversion layer 15 opposite to the charge storage electrode $12'_{32}$. The charges stored in the region of the photoelectric conversion layer 15 opposite to the charge storage electrode $12'_{43}$ are moved to the region of the photoelectric conversion layer 15 opposite to the charge storage electrode $12'_{33}$. The charges stored in the region of the photoelectric conversion layer 15 opposite to the charge storage electrode $12'_{44}$ are moved to the region of the photoelectric conversion layer 15 opposite to the charge storage electrode $12'_{34}$.

(Step 30)

Further, Step 10 is performed again, whereby charges stored in the region of the photoelectric conversion layer 15 opposite to the charge storage electrode $12'_{21}$, charges stored in the region of the photoelectric conversion layer 15 opposite to the charge storage electrode $12'_{22}$, charges stored in the region of the photoelectric conversion layer 15 opposite to the charge storage electrode $12'_{23}$, and charges stored in the region of the photoelectric conversion layer 15 opposite to the charge storage electrode $12'_{24}$ can be read out via the first electrode 11'.

(Step 40)

Thereafter, the charges stored in the region of the photoelectric conversion layer 15 opposite to the charge storage electrode $12'_{21}$ are moved to the region of the photoelectric conversion layer 15 opposite to the charge storage electrode $12'_{11}$. The charges stored in the region of the photoelectric conversion layer 15 opposite to the charge storage electrode $12'_{22}$ are moved to the region of the photoelectric conversion layer 15 opposite to the charge storage electrode $12'_{12}$. The charges stored in the region of the photoelectric conversion layer 15 opposite to the charge storage electrode $12'_{23}$ are moved to the region of the photoelectric conversion layer 15 opposite to the charge storage electrode $12'_{13}$. The charges stored in the region of the photoelectric conversion layer 15 opposite to the charge storage electrode $12'_{24}$ are moved to the region of the photoelectric conversion layer 15 opposite to the charge storage electrode $12'_{14}$.

(Step 41)

The charges stored in the region of the photoelectric conversion layer 15 opposite to the charge storage electrode $12'_{31}$ are moved to the region of the photoelectric conversion layer 15 opposite to the charge storage electrode $12'_{21}$. The charges stored in the region of the photoelectric conversion layer 15 opposite to the charge storage electrode $12'_{32}$ are moved to the region of the photoelectric conversion layer 15 opposite to the charge storage electrode $12'_{22}$. The charges stored in the region of the photoelectric conversion layer 15 opposite to the charge storage electrode $12'_{33}$ are moved to the region of the photoelectric conversion layer 15 opposite to the charge storage electrode $12'_{23}$. The charges stored in the region of the photoelectric conversion layer 15 opposite to the charge storage electrode $12'_{34}$ are moved to the region of the photoelectric conversion layer 15 opposite to the charge storage electrode $12'_{24}$.

(Step 50)

Further, Step 10 is performed again, whereby charges stored in the region of the photoelectric conversion layer 15 opposite to the charge storage electrode $12'_{31}$, charges stored in the region of the photoelectric conversion layer 15 opposite to the charge storage electrode $12'_{32}$, charges stored in the region of the photoelectric conversion layer 15 opposite to the charge storage electrode $12'_{33}$, and charges stored in the region of the photoelectric conversion layer 15 opposite to the charge storage electrode $12'_{34}$ can be read out via the first electrode 11'.

(Step 60)

Thereafter, the charges stored in the region of the photoelectric conversion layer 15 opposite to the charge storage electrode $12'_{21}$ are moved to the region of the photoelectric conversion layer 15 opposite to the charge storage electrode $12'_{11}$. The charges stored in the region of the photoelectric conversion layer 15 opposite to the charge storage electrode $12'_{22}$ are moved to the region of the photoelectric conversion layer 15 opposite to the charge storage electrode $12'_{12}$. The charges stored in the region of the photoelectric conversion layer 15 opposite to the charge storage electrode $12'_{23}$ are moved to the region of the photoelectric conversion layer 15 opposite to the charge storage electrode $12'_{13}$. The charges stored in the region of the photoelectric conversion layer 15 opposite to the charge storage electrode $12'_{24}$ are moved to the region of the photoelectric conversion layer 15 opposite to the charge storage electrode $12'_{14}$.

(Step 70)

Further, Step 10 is performed again, whereby charges stored in the region of the photoelectric conversion layer 15 opposite to the charge storage electrode $12'_{41}$, charges stored in the region of the photoelectric conversion layer 15 opposite to the charge storage electrode $12'_{42}$, charges stored in the region of the photoelectric conversion layer 15 opposite to the charge storage electrode $12'_{43}$, and charges stored in the region of the photoelectric conversion layer 15 opposite to the charge storage electrode $12'_{44}$ can be read out via the first electrode 11'.

In the solid-state imaging apparatus of Embodiment 7, the first electrode is shared by a plurality of the imaging elements forming the imaging element block, and thus the configuration and structure of a pixel area in which a plurality of imaging elements are arranged can be simplified and miniaturized. Further, a plurality of imaging elements provided for one floating diffusion layer may be formed of a plurality of the first type imaging elements or may be formed of at least one first type imaging element and one or two or more second type imaging elements.

Embodiment 8

Embodiment 8 is the modification of Embodiment 7. In the solid-state imaging apparatus of Embodiment 8 shown in FIGS. 36, 37, 38 and 39 that schematically show the arrangement state of the first electrode 11' and the charge storage electrode 12', an imaging element block is formed of two imaging elements. Further, one on-chip microlens 90 is disposed above the imaging element block. Further, a transfer control electrode 13' is interposed between a plurality of imaging elements forming an imaging element block in examples shown in FIGS. 37 and 39.

For example, the photoelectric conversion layers corresponding to the charge storage electrodes $12'_{11}$, $12'_{21}$, $12'_{31}$ and $12'_{41}$ forming the imaging element block have high sensitivity to incident light from obliquely upper right in the drawing. Further, the photoelectric conversion layers corresponding to the charge storage electrodes $12'_{12}$, $12'_{22}$, $12'_{32}$ and $12'_{42}$ forming the imaging element block have high sensitivity to incident light from obliquely upper left in the drawing. Furthermore, the photoelectric conversion layers corresponding to the charge storage electrodes $12'_{12}$, $12'_{22}$, $12'_{32}$ and $12'_{42}$ forming the imaging element block have high sensitivity to incident light from obliquely upper left in the drawing. Accordingly, for example, it is possible to acquire an image-plane phase difference signal by combining an imaging element having the charge storage electrode $12'_{11}$ and an imaging element having the charge storage electrode $12'_{12}$. Furthermore, when a signal from an imaging element having the charge storage electrode $12'_{11}$ and a signal from an imaging element having the charge storage electrode $12'_{12}$ are added, one imaging element may be formed by a combination of these imaging elements. In an example shown in FIG. 36, the first electrode $11'_1$ is interposed between the charge storage electrode $12'_{11}$ and the charge storage electrode $12'_{12}$, but sensitivity can be further improved by disposing one first electrode $11'_1$ in opposition to two juxtaposed charge storage electrodes $12'_{11}$ and $12'_{12}$ as an example shown in FIG. 38.

Embodiment 9

Embodiment 9 is the modification of Embodiments 1 to 6. The imaging element and stacked-type imaging element of Embodiment 9 schematically shown in FIG. 40 are front-surface illuminated type imaging element and stacked-type imaging element, and have a structure in which a first-type green imaging element of Embodiments 1 to 6 (first imaging element) having a first-type photoelectric conversion layer which absorbs green light and having sensitivity to green, a second-type conventional blue imaging element (second imaging element) having a second-type photoelectric conversion layer which absorbs blue light and having sensitivity to blue, and a second-type conventional red imaging element (third imaging element) having a second-type photoelectric conversion layer which absorbs red light and having sensitivity to red are stacked. Here, the red imaging element (third imaging element) and the blue imaging element (second imaging element) are provided in the semiconductor substrate 70, and the second imaging element is located closer to the light incident side as compared to the third imaging element. Furthermore, the green imaging element (first imaging element) is provided above the blue imaging element (second imaging element).

Further, in FIGS. 40, 41, 42, 43, 44, 45, 48, 49, 51, 52, 53, 54, 55 and 56, illustration of the photoelectric conversion unit segments is omitted, while the charge storage electrode 12, the insulating layer 82, and the photoelectric conversion layer 15 are illustrated in order to simplify the drawing.

Various transistors forming the control unit are provided on the surface 70A of the semiconductor substrate 70, as in Embodiment 1. These transistors may have the substantially same configuration and structure of transistors described in Embodiment 1. Furthermore, the second imaging element and the third imaging element are provided on the semiconductor substrate 70, and these imaging elements also may have the substantially same configuration and structure of the second imaging element and the third imaging element described in Embodiment 1.

The interlayer insulating layers 77 and 78 are formed on the surface 70A of the semiconductor substrate 70, and the photoelectric conversion unit (first electrode 11, photoelectric conversion layer 15 and second electrode 16), the charge storage electrode 12 and the like forming the imaging element of Embodiments 1 to 6 are formed on the interlayer insulating layer 78.

As described above, the configuration and structure of the imaging element and the stacked-type imaging element of Embodiment 9 are the same as those of the imaging element and the stacked-type imaging element of Examples 1 to 6 except for being the front-surface illuminated type imaging element and stacked-type imaging element, and thus detailed description will be omitted.

Embodiment 10

Embodiment 10 is the modification of Embodiments 1 to 9.

The imaging element and stacked-type imaging element of Embodiment 10 schematically shown in FIG. 41 are back-surface illuminated type imaging element and stacked-type imaging element, and have a structure in which the first imaging element of the first type of Embodiments 1 to 6 and two second imaging elements of the second type are stacked. Further, modified examples of the imaging element of Embodiment 10 and stacked-type imaging element of which partial cross sectional views are shown in FIG. 42 are front-surface illuminated type imaging element and stacked-type imaging element, and have a structure in which the first imaging element of the first type of Embodiments 1 to 6 and two second imaging elements of the second type are stacked. Here, the first imaging element absorbs primary color of light, and the second imaging element absorbs complementary color of light. Alternatively, the first imaging element absorbs white light and the second imaging element absorbs infrared light.

A modified example of the imaging element of Embodiment 10 of which a schematic partial sectional view is shown in FIG. 43 is a back-surface illuminated type imaging element, and is formed of the first imaging element of the first type of Embodiments 1 to 6. Furthermore, a modified example of the imaging element of Embodiment 10 of which a schematic partial sectional view is shown in FIG. 44 is a front-surface illuminated type imaging element, and is formed of the first imaging element of the first type of Embodiments 1 to 6. Here, the first imaging element is formed of three types of imaging elements including an imaging element absorbing red light, an imaging element absorbing green light and an imaging element absorbing blue light. Moreover, the solid-state imaging apparatus according to the third aspect of the present disclosure is formed of a plurality of these imaging elements. An example of the arrangement of a plurality of the imaging elements includes a Bayer array. Color filters for performing spectral division of blue, green, and red are provided as necessary at the light incident side of each imaging element.

Further, the form in which two first-type imaging element of Embodiments 1 to 6 are stacked (i.e., form in which two photoelectric conversion units are stacked and control units of two imaging elements are provided on semiconductor substrate), or, the form in which three first-type imaging element of Embodiments 1 to 6 are stacked (i.e., form in which three photoelectric conversion units are stacked and control units of three imaging elements are provided on semiconductor substrate) may be adopted instead of providing one imaging first-type element of Embodiments 1 to 6. An example of a stacked structure of the first-type imaging element and the second-type imaging element is exemplified in the following table.

TABLE 1

| First type | Second type | Reference drawing |
|---|---|---|
| 1 | 2 | FIG. 1 |
| Green | Blue + red | FIG. 11 |
| 1 | 1 | FIG. 12 |
| Primary color | Complementary color | FIG. 13 |
| 1 | 1 | |
| White | Infrared ray | |
| 1 | 0 | FIG. 14 |
| Blue or green or red | | FIG. 15A |
| 2 | 2 | FIG. 15B |
| Green + infrared light | Blue + red | |
| 2 | 1 | |
| Green + blue | Red | |
| 2 | 0 | |
| White + infrared light | | |
| 3 | 2 | |
| Green + blue + red | Blue-green (emerald color) + Infrared light | |
| 3 | 1 | |
| Green + blue + red | Infrared light | |
| 3 | 0 | |
| Blue + green + red | | |

Embodiment 11

Embodiment 11 is the modification of Embodiments 1 to 10, and relates to the imaging element or the like having the charge discharge electrode according to an embodiment of the present disclosure. A schematic partial sectional view of a part of the imaging element and the stacked-type imaging element of Embodiment 11 is shown in FIG. 45, a schematic arrangement view of the first electrode, charge storage electrode and charge discharge electrode forming the imaging element of Embodiment 11 is shown in FIG. 46, and the first electrode, charge storage electrode, charge discharge electrode, second electrode and contact hole portion forming the imaging element of Embodiment 11 is shown in FIG. 47.

The imaging element and stacked-type imaging element of Embodiment 11 further include a charge discharge electrode 14 that is connected to the photoelectric conversion layer 15 via the connection portion 69 and is disposed to be spaced apart from the first electrode 11 and the charge storage electrode 12. Here, the charge discharge electrode 14 is disposed to surround the first electrode 11 and the charge storage electrode 12 (i.e., in a frame form). The charge discharge electrode 14 is connected to a pixel drive circuit forming a drive circuit. The photoelectric conversion layer 15 extends in the connection portion 69. In other word, the photoelectric conversion layer 15 extends in a second opening 85 provided in an insulating layer 82, and is connected to the charge discharge electrode 14. The charge discharge electrode 14 is shared by a plurality of imaging elements.

In Embodiment 11, in the charge storage period, the potential $V_{11}$ is applied to the first electrode 11, the potential $V_{12}$ is applied to the charge storage electrode 12 and the potential $V_{14}$ is applied to the charge discharge electrode 14 from the drive circuit, and charges are stored in the photoelectric conversion layer 15. Photoelectric conversion occurs in the photoelectric conversion layer 15 by light incident on the photoelectric conversion layer 15. The holes generated by the photoelectric conversion are sent from the second electrode 16 to the drive circuit via the wiring $V_{OU}$. On the other hand, since the potential of the first electrode 11 is higher than the potential of the second electrode 16, that is, for example, a positive potential is applied to the first electrode 11 and a negative potential is applied to the second electrode 16, and thus $V_{14} > V_{11}$ (e.g., $V_{12} > V_{14} > V_{11}$). As a result, the electrons generated by the photoelectric conversion are attracted to the charge storage electrode 12 and stop at the region of the photoelectric conversion layer 15 opposite to the charge storage electrode 12, and is reliably prevented from moving toward the first electrode 11. However, electrons (so-called overflowed electrons) that are not sufficiently attracted by the charge storage electrode 12 or are not stored in the photoelectric conversion layer 15 are sent to the drive circuit via the charge discharge electrode 14.

The reset operation is performed at the latter stage of the charge storage period. As a result, the potential of the first floating diffusion layer $FD_1$ is reset, and the potential of the first floating diffusion layer $FD_1$ becomes the potential $V_{DD}$ of the power supply.

After the reset operation is completed, charges are read out. That is, in the charge transfer period, the potential $V_{21}$ is applied to the first electrode 11, the potential $V_{22}$ is applied to the charge storage electrode 12, and the potential $V_{24}$ is applied to the charge storage electrode 14 from the drive circuit. Here, it is assumed that $V_{24} < V_{21}$ (e.g., $V_{24} < V_{22} < V_{21}$). As a result, electrons that have stopped in the region of the photoelectric conversion layer 15 opposite to the charge storage electrode 12 are certainly read out to the first electrode 11 and further read out to the first floating diffusion layer $FD_1$. That is, the charges stored in the photoelectric conversion layer 15 are read out to the control unit.

Thus, a series of operations including charge storage, reset operation, charge transfer and the like are completed.

The operation of the amplification transistor $TR1_{amp}$ and the select transistor $TR1_{sel}$ after the electrons are read out to the first floating diffusion layer $FD_1$ are the same as that of the conventional transistors. Furthermore, for example, a series of operations such as charge storage, reset operation, and charge transfer of the second imaging element and the third imaging element are the same as a series of conventional operations such as charge storage, reset operation, and charge transfer.

In Embodiment 11, so-called overflowed electrons are sent to the drive circuit via the charge discharge electrode 14, and thus leakage of adjacent pixels to the charge storage portion can be suppressed and occurrence of blooming can be suppressed. Further, as a result, the imaging performance of the imaging element can be improved.

Although the present disclosure has been described based on preferred embodiments, the present disclosure is not limited to these embodiments. The structure and configuration, the manufacturing conditions, the manufacturing method and the used materials of the imaging element, stacked-type imaging element and solid-state imaging apparatus described in the embodiments are illustrative and may be suitably changed. The imaging element of Embodiment 1, the imaging element of Embodiment 2, the imaging element of Embodiment 3, the imaging element of Embodiment 4 and the imaging element of Embodiment 5 may be arbitrarily combined, and the imaging element of Embodiment 1, the imaging element of Embodiment 2, the imaging element of Embodiment 3, the imaging element of Embodiment 4 and the imaging element of Embodiment 6 may be arbitrarily combined.

In some cases, floating diffusion layers $FD_1$, $FD_2$, $FD_3$, 51C, 45C and 46C may be shared.

For example, as an modified example of the imaging element and stacked-type imaging element described in Embodiment 1 shown in FIG. 48, the first electrode 11 may extend in the opening 84A provided in the insulating layer 82 and may be connected to the photoelectric conversion layer 15.

Alternatively, as a modified example of the imaging element and stacked-type imaging element described in Embodiment 1 shown in FIG. 49, and a schematic partial sectional view of a partially expanded part of the first electrode shown in FIG. 50A, the edge of the top surface pf the first electrode 11 is covered with the insulating layer 82, and the first electrode 11 is exposed on the bottom surface of the opening 84B. When the surface of the insulating layer 82 in contact with the top surface of the first electrode 11 is defined as the first surface 82a and the surface of the insulating layer 82 in contact with the portion of the photoelectric conversion layer 15 opposite to the charge storage electrode 12 is defined as the second surface 82b, the side surface of the opening 84B has an inclination that expands from the first surface 82a toward the second surface 82b. As described above, the movement of charges from the photoelectric conversion layer 15 to the first electrode 11 becomes smoother by inclining the side surface of the opening 84B. Further, the side surface of the opening 84B is rotationally symmetric about the axis of the opening 84B in an example shown in FIG. 50A, but the opening 84C may be provided such that the side surface the opening 84C having an inclination expanding from the first surface 82a towards the second surface 82b is positioned on the side of the charge storage electrode 12 as shown in FIG. 50B. As a result, it becomes difficult to transfer charges from a part of the photoelectric conversion layer 15 on the side opposite to the charge storage electrode 12 across the opening 84. Furthermore, the side surface of the opening 84B has an inclination that expands from the first surface 82a toward the second surface 82b, but the edge portion of the side surface of the opening 84B in the second surface 82b may be located outside the edge of the first electrode 11 as shown in FIG. 50A or may be located inside the edge of the first electrode 11 as shown in FIG. 50C. When the former configuration is adopted, transfer of charges becomes further easier, and when the latter configuration is adopted, it is possible to reduce variations in shape at the time of forming an opening.

These openings 84B and 84C may be formed by inclining an opening side surface of an etching mask by reflowing an etching mask formed of a resist material formed when an opening is formed in an insulating layer by an etching method, and etching the insulating layer 82 using the etching mask.

Alternatively, as for the charge discharge electrode 14 described in Embodiment 11, as shown in FIG. 51, the photoelectric conversion layer 15 may extend in the second opening 85A provided in the insulating layer 82 and may be connected to the charge discharge electrode 14, the edge of the top surface of the charge discharge electrode 14 may be covered with the insulating layer 82, and the charge discharge electrode 14 may be exposed on the bottom surface of the second opening 85A. When the surface of the insulating layer 82 in contact with the top surface of the charge discharge electrode 14 is defined as a third surface 82c and the surface of the insulating layer 82 in contact with a part of the photoelectric conversion layer 15 opposite to the charge storage electrode 12 is defined as a second surface 82b, the side surface of the second opening 85A may have an inclination that expands from the third surface 82c toward the second surface 82b.

Furthermore, for example, as a modified example of the imaging element and stacked-type imaging element described in Embodiment 1 shown in FIG. 52, light may be incident from the side of the second electrode 16 and a light shielding layer 92 may be formed on the light incident side from the second electrode 16. Further, various wirings provided closer to the light incident side than the photoelectric conversion layer may also function as a light shielding layer.

Further, in an example shown in FIG. 52, the light shielding layer 92 is formed above the second electrode 16, that is, the light shielding layer 92 is formed at the light incidence side from the second electrode 16 and above the first electrode 11, but may be disposed on the light incident surface side of the second electrode 16 as shown in FIG. 53. Furthermore, in some cases, as shown in FIG. 54, the light shielding layer 92 may be formed on the second electrode 16.

Alternatively, light may enter from the second electrode 16 side and light may not enter the first electrode 11. Specifically, as shown in FIG. 52, the light shielding layer 92 is formed on the light incident side from the second electrode 16 and above the first electrode 11. Alternatively, as shown in FIG. 55, an on-chip microlens 90 may be provided above the charge storage electrode 12 and the second electrode 16, and light incident on the on-chip microlens 90 may be focused on the charge storage electrode 12, and may not reach the first electrode 11. Alternatively, light incident on the on-chip microlens 90 may not reach the first electrode 11.

When these structures and structures are adopted, or the light shielding layer 92 is provided such that light enters only the photoelectric conversion layer 15 located above the charge storage electrode 12, or the on-chip microlens 90 is provided, a part of the photoelectric conversion layer 15 located above the first electrode 11 does not contribute to photoelectric conversion, and thus all the pixels can be more reliably reset simultaneously, and a global shutter function can be realized more easily. That is, in a driving method of a solid-state imaging apparatus having a plurality of imaging elements having such configurations and structures, in all the imaging elements, the charge in the first electrode 11 is simultaneously discharged out of the system while charges are stored in the photoelectric conversion layer 15, and then, in all the imaging elements, electrons stored in the photoelectric conversion layer 15 are simultaneously transferred to the first electrode 11. After the transfer is completed, the charges transferred to the first electrode 11 are sequentially read out in each imaging element. Each process is repeated.

In such a driving method of a solid-state imaging apparatus, each imaging element has a structure in which light incident from the second electrode side does not enter the first electrode, and in all the imaging elements, charges in the first electrode is simultaneously discharged to the outside of the system while charges are stored in the photoelectric conversion layer, and thus the reset of the first electrode can be reliably performed simultaneously in all the imaging elements. Further, thereafter, in all the imaging elements, the charges stored in the photoelectric conversion layer are simultaneously transferred to the first electrode, and after completion of the transfer, the charges transferred to the first electrode in each imaging element are sequentially read out. Therefore, a so-called global shutter function can be easily realized.

The photoelectric conversion layer is not limited to one-layer configuration. For example, as a modified example of the imaging element and stacked-type imaging element described in Embodiment 1 shown in FIG. 56, the photoelectric conversion layer 15 may have a stacked structure of a lower semiconductor layer 15A formed of, for example, IGZO and an upper photoelectric conversion layer 15B formed of a material forming a photoelectric conversion layer 15 described in Embodiment 1. When the lower semiconductor layer 15A is provided in this manner, recombination at the time of charge storage can be prevented, the transfer efficiency of the charge stored in the photoelectric conversion layer 15 to the first electrode 11 can be increased, and generation of dark current can be suppressed.

In Embodiment 1 shown in FIGS. 1 and 2, the thickness of the insulating layer segments $82_1$, $82_2$, and $82_3$ is gradually increased by gradually reducing the thicknesses of the charge storage electrode segments $12_1$, $12_2$, and $12_3$. On the other hand, as shown in FIG. 57 which is a schematic partial sectional view of an expanded part in which a charge storage electrode, a photoelectric conversion layer and a second electrode are stacked in the modified example of the imaging element of Embodiment 1, the thicknesses of the charge storage electrode segments $12_1$, $12_2$, and $12_3$ may be constant, and the thickness of the insulating layer segments $82_1$, $82_2$, and $82_3$ may be gradually increased. Further, the thickness of photoelectric conversion layer segments $15_1$, $15_2$ and $15_3$ is constant.

Furthermore, in Embodiment 2 shown in FIG. 12, the thickness of the photoelectric conversion layer segment $15_1$, $15_2$, and $15_3$ is gradually increased by gradually reducing the thickness of the charge storage electrode segment $12_1$, $12_2$, and $12_3$. On the other hand, as shown in FIG. 58 which is a schematic partial sectional view of an expanded part in which a charge storage electrode, a photoelectric conversion layer and a second electrode are stacked in the modified example of the imaging element of Embodiment 2, the thicknesses of the charge storage electrode segments $12_1$, $12_2$, and $12_3$ may be constant, and the thickness of the photoelectric conversion layer segment $15_1$, $15_2$, and $15_3$ may be gradually increased by gradually reducing the thickness of the insulating layer segments $82_1$, $82_2$, and $82_3$.

It is needless to say that various modified examples described above can also be applied to other embodiments.

In the embodiments, the electrons are used as signal charges, and the conductivity type of the photoelectric conversion layer formed on the semiconductor substrate is n type, but embodiments of the present disclosure can also be applied to a solid-state imaging apparatus using holes as signal charges. In this case, each semiconductor region may be formed by a semiconductor region of the opposite conductivity type, and the conductivity type of the photoelectric conversion layer formed on the semiconductor substrate may be p type.

Furthermore, a case in which an embodiment of the present disclosure is applied to a CMOS type solid-state imaging apparatus in which unit pixels for detecting signal charges corresponding to the amount of incident light as a physical quantity are arranged in a matrix was taken as an example in the embodiment, but the present disclosure is not limited to application to a CMOS type solid-state imaging apparatus, and also may be applied to a CCD type solid-state imaging apparatus. In the latter case, the signal charges are transferred in a vertical direction by a vertical transfer register of a CCD type structure, transferred in a horizontal direction by a horizontal transfer register, and amplified, and thereby pixel signals (image signals) are output. Furthermore, the present disclosure is not limited to a general column type solid-state imaging apparatus in which pixels are formed in a two-dimensional matrix and column signal processing circuits are arranged for each pixel column in general. Moreover, in some cases, a select transistor may be omitted.

Moreover, the imaging element and the stacked-type imaging element according to an embodiment of the present disclosure are not limited to application to a solid-state imaging apparatus which detects the distribution of the amount of incident light of visible light and captures as an image, and are applicable to a solid-state imaging apparatus which captures the distribution of the amount of incident light of infrared rays, X-rays, or particles or the like as an image. Furthermore, it can be applied to a solid-state imaging apparatus (physical quantity distribution detection device) such as a fingerprint detection sensor which detects distribution of other physical quantities such as pressure, electrostatic capacity and the like and captures as an image in a broad sense.

Moreover, the present disclosure is not limited to the solid-state imaging apparatus which sequentially scans each unit pixel of an imaging area row by row and reads out a pixel signal from each unit pixel. It can also be applied to an XY address-type solid-state imaging apparatus which selects arbitrary pixels on a pixel unit basis and reads out pixel signals on a pixel basis from selected pixels. The solid-state imaging apparatus may be in the form of one chip or in a modular form having an imaging function and packaged together with an imaging area and a drive circuit or an optical system.

Furthermore, it is not only limited to application to a solid-state imaging apparatus, and can be applied to an imaging apparatus. Here, the imaging apparatus refers to an electronic device having an imaging function such as a camera system such as a digital still camera, video camera or the like, or a mobile phone. The imaging apparatus may be in the form of a module mounted on an electronic device, that is, a camera module.

FIG. 59 shows an example in which the solid-state imaging apparatus 201 formed of the imaging element and stacked-type imaging element according to an embodiment of the present disclosure is used in an electronic device (camera) 200 as a conceptual diagram. The electronic device 200 has the solid-state imaging apparatus 201, an optical lens 210, a shutter device 211, a drive circuit 212, and a signal processing circuit 213. The optical lens 210 forms an image of image light (incident light) from the object on an imaging surface of the solid-state imaging apparatus 201. As a result, a signal charges are stored for a certain period of time in the solid-state imaging apparatus 201. The shutter device 211 controls the light irradiation period and light blocking period with respect to the solid-state imaging apparatus 201. The drive circuit 212 supplies a drive signal for controlling the transfer operation or the like of the solid-state imaging apparatus 201 and the shutter operation of the shutter device 211. A signal of the solid-state imaging apparatus 201 is transferred by a drive signal (timing signal) supplied from the drive circuit 212. The signal processing circuit 213 performs various kinds of signal processing. A video signal on which signal processing has been performed is stored in a storage medium such as a memory or output to a monitor. In such an electronic device 200, it is possible to achieve miniaturization of pixel size and improvement of transfer efficiency in the solid-state imaging apparatus 201, and thus the electronic device 200 with improved pixel characteristics can be obtained. The electronic apparatus 200 to which the solid-state imaging apparatus 201 can be applied is not only limited to a camera, and it is applicable to an imaging apparatus such as a camera module for a mobile device such as a digital still camera or a mobile phone.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(A01)

(imaging element: first aspect)

An imaging element including a photoelectric conversion unit formed by stacking a first electrode, a photoelectric conversion layer and a second electrode, in which the photoelectric conversion unit further includes a charge storage electrode which is disposed to be spaced apart from the first electrode and disposed opposite to the photoelectric conversion layer via an insulating layer, the photoelectric conversion unit is formed of N (where N≥2) number of photoelectric conversion unit segments, the photoelectric conversion layer is formed of N number of photoelectric conversion layer segments, the insulating layer is formed of N number of insulating layer segments, the charge storage electrode is formed of N number of charge storage electrode segments, an $n^{th}$ (where n=1, 2, 3 ..., N) photoelectric conversion unit segment is formed of an $n^{th}$ charge storage electrode segment, an $n^{th}$ insulating layer segment and an $n^{th}$ photoelectric conversion layer segment, as a value of n increases, the $n^{th}$ photoelectric conversion unit segment is located farther from the first electrode, and a thickness of the insulating layer segment gradually changes from a first photoelectric conversion unit segment to an $N^{th}$ photoelectric conversion unit segment.

(A02)

(imaging element: second aspect)

An imaging element including a photoelectric conversion unit formed by stacking a first electrode, a photoelectric conversion layer and a second electrode, in which the photoelectric conversion unit further includes a charge storage electrode which is disposed to be spaced apart from the first electrode and disposed opposite to the photoelectric conversion layer via an insulating layer, the photoelectric conversion unit is formed of N (where N≥2) number of photoelectric conversion unit segments, the photoelectric conversion layer is formed of N number of photoelectric conversion layer segments, the insulating layer is formed of N number of insulating layer segments, the charge storage electrode is formed of N number of charge storage electrode segments, an $n^{th}$ (where n=1, 2, 3 ..., N) photoelectric conversion unit segment is formed of an $n^{th}$ charge storage electrode segment, an $n^{th}$ insulating layer segment and an $n^{th}$ photoelectric conversion layer segment, as a value of n increases, the $n^{th}$ photoelectric conversion unit segment is located farther from the first electrode, and a thickness of the photoelectric conversion layer segment gradually changes from a first photoelectric conversion unit segment to a $N^{th}$ photoelectric conversion unit segment.

(A03)

(imaging element: third aspect)

An imaging element including a photoelectric conversion unit formed by stacking a first electrode, a photoelectric conversion layer and a second electrode, in which the photoelectric conversion unit further includes a charge storage electrode which is disposed to be spaced apart from the first electrode and disposed opposite to the photoelectric conversion layer via an insulating layer, the photoelectric conversion unit is formed of N (where N≥2) number of photoelectric conversion unit segments, the photoelectric conversion layer is formed of N number of photoelectric conversion layer segments, the insulating layer is formed of N number of insulating layer segments, the charge storage electrode is formed of N number of charge storage electrode segments, an $n^{th}$ (where n=1, 2, 3 ..., N) photoelectric conversion unit segment is formed of an $n^{th}$ charge storage electrode segment, an $n^{th}$ insulating layer segment and an $n^{th}$ photoelectric conversion layer segment, as a value of n increases, the $n^{th}$ photoelectric conversion unit segment is located farther from the first electrode, and materials forming the insulating layer segments are different in adjacent photoelectric conversion unit segments.

(A04)

(imaging element: fourth aspect)

An imaging element including a photoelectric conversion unit formed by stacking a first electrode, a photoelectric conversion layer and a second electrode, in which the photoelectric conversion unit further includes a charge storage electrode which is disposed to be spaced apart from the first electrode and disposed opposite to the photoelectric conversion layer via an insulating layer, the photoelectric conversion unit is formed of N (where N≥2) number of photoelectric conversion unit segments, the photoelectric conversion layer is formed of N number of photoelectric conversion layer segments, the insulating layer is formed of N number of insulating layer segments, the charge storage electrode is formed of N number of charge storage electrode segments which are disposed to be spaced apart from each other, an $n^{th}$ (where n=1, 2, 3 ..., N) photoelectric conversion unit segment is formed of an $n^{th}$ charge storage electrode segment, an $n^{th}$ insulating layer segment and an $n^{th}$ photoelectric conversion layer segment, as a value of n increases, the $n^{th}$ photoelectric conversion unit segment is located farther from the first electrode, and materials forming the charge storage electrode segments are different in adjacent photoelectric conversion unit segments.

(A05)

(imaging element: fifth aspect)

An imaging element including a photoelectric conversion unit formed by stacking a first electrode, a photoelectric conversion layer and a second electrode, in which the photoelectric conversion unit further includes a charge storage electrode which is disposed to be spaced apart from the first electrode and disposed opposite to the photoelectric conversion layer via an insulating layer, the photoelectric conversion unit is formed of N (where N≥2) number of photoelectric conversion unit segments, the photoelectric conversion layer is formed of N number of photoelectric conversion layer segments, the insulating layer is formed of N number of insulating layer segments, the charge storage electrode is formed of N number of charge storage electrode segments which are disposed to be spaced apart from each other, an $n^{th}$ (where n=1, 2, 3 . . . , N) photoelectric conversion unit segment is formed of an $n^{th}$ charge storage electrode segment, an $n^{th}$ insulating layer segment and an $n^{th}$ photoelectric conversion layer segment, as a value of n increases, the $n^{th}$ photoelectric conversion unit segment is located farther from the first electrode, and an area of the charge storage electrode segment gradually decreases from a first photoelectric conversion unit segment to an $N^{th}$ photoelectric conversion unit segment.

(A06)

(imaging element: sixth aspect)

An imaging element including a photoelectric conversion unit formed by stacking a first electrode, a photoelectric conversion layer and a second electrode, in which the photoelectric conversion unit further includes a charge storage electrode which is disposed to be spaced apart from the first electrode and disposed opposite to the photoelectric conversion layer via an insulating layer, in a case in which a stacking direction of the charge storage electrode, the insulating layer, and the photoelectric conversion layer is defined as a Z direction and a direction away from the first electrode is defined as an X direction, a cross-sectional area of a stacked portion when the stacked portion in which the charge storage electrode, the insulating layer, and the photoelectric conversion layer are stacked is cut in a YZ virtual plane varies depending on a distance from the first electrode.

(B01) The imaging element as described in any one of (A01) to (B01), further including a semiconductor substrate, in which the photoelectric conversion unit is disposed above the semiconductor substrate.

(B02) The imaging element as described in any one of (A01) to (B01), in which the first electrode extends in an opening provided at the insulating layer, and is connected to the photoelectric conversion layer.

(B03) The imaging element as described in any one of (A01) to (B01), in which the photoelectric conversion layer extends in an opening provided at the insulating layer, and is connected to the first electrode.

(B04) The imaging element as described in (B03), in which the edge of the top surface of the first electrode is covered with the insulating layer, and the first electrode is exposed on the bottom surface of the opening, when the surface of the insulating layer in contact with the top surface of the first electrode is defined as a first surface and the surface of the insulating layer in contact with the portion of the photoelectric conversion layer opposite to the charge storage electrode is defined as a second surface, a side surface of the opening has an inclination extending from the first surface toward the second surface.

(B05) The imaging element as described in (B04), in which a side surface of an opening having an inclination extending from the first surface toward the second surface is located at the charge storage electrode side.

(B06)

(Control of a potential of first electrode and charge storage electrode)

The imaging element as described in any one of (A01) to (B05), further including a control unit which is provided on the semiconductor substrate and has a drive circuit, in which the first electrode and the charge storage electrode are connected to the drive circuit, in a charge storage period, a potential $V_{11}$ is applied to the first electrode, and a potential $V_{12}$ is applied to the charge storage electrode from the drive circuit, charges are stored in the photoelectric conversion layer, in a charge transfer period, a potential $V_{21}$ is applied to the first electrode and a potential $V_{22}$ is applied to the charge storage electrode from the drive circuit, and charges stored in the photoelectric conversion layer are read by the control unit through the first electrode.

Here, when the potential of the first electrode is higher than the potential of the second electrode, $V_{12} \leq V_{11}$ and $V_{22} < V_{21}$, when the potential of the first electrode is lower than that of the second electrode, $V_{12} V_{11}$ and $V_{22} > V_{21}$.

(B07)

(Charge discharge electrode)

The imaging element as described in any one of (A01) to (B06), further including a charge discharge electrode which is connected to the photoelectric conversion layer, and is disposed to be spaced apart from the first electrode and the charge storage electrode.

(B08) The imaging element as described in (B07), in which the charge discharge electrode is disposed to surround the first electrode and the charge storage electrode.

(B09) The imaging element as described in (B07) or (B08), in which the photoelectric conversion layer extends in the second opening provided on the insulating layer, and is connected to the charge discharge electrode, the edge of the top surface of the charge discharge electrode is covered with the insulating layer, the charge discharge electrode is exposed on the bottom surface of the second opening, when the surface of the insulating layer in contact with the top surface of the charge discharge electrode is defined as a third surface and the surface of the insulating layer in contact with the portion of the photoelectric conversion layer opposite to the charge storage electrode is defined as a second surface, a side surface of the second opening has an inclination extending from the third surface toward the second surface.

(B10)

(Control of a potential of first electrode, charge storage electrode and charge discharge electrode)

The imaging element as described in any one of (B07) to (B09), further including a control unit which is provided on the semiconductor substrate and has a drive circuit, in which the first electrode, the charge storage electrode and the charge discharge electrode are connected to the drive circuit, in a charge storage period, a potential $V_{21}$ is applied to the first electrode, a potential $V_{12}$ is applied to the charge storage electrode, and a potential $V_{14}$ is applied to the charge discharge electrode from the drive circuit, charges are stored in the photoelectric conversion layer, in a charge transfer period, a potential $V_{21}$ is applied to the first electrode, a potential $V_{22}$ is applied from the drive circuit to the charge storage electrode, and a potential $V_{24}$ is applied to the charge discharge electrode from the drive circuit, and charges stored in the photoelectric conversion layer are read by the control unit via the first electrode. Here, in a case where the potential of the first electrode is higher than the potential of the second electrode, $V_{14} > V_{11}$ and $V_{24} < V_{21}$, in a case where the potential of the first electrode is lower than that of the second electrode, $V_{14} < V_{11}$ and $V_{24} > V_{21}$.

(B11) The imaging element as described in any one of (A01) to (B10), in which, in a case where the potential of the first electrode is higher than the potential of the second electrode, in a charge transfer period, a potential applied to the charge storage electrode segment located closest to the first electrode is higher than a potential applied to the charge storage electrode segment located furthest from the first electrode, and in a case where the a potential of the first electrode is lower than that of the second electrode, in the charge transfer period, a potential applied to the charge storage electrode segment located closest to the first electrode is lower than a potential applied to the charge storage electrode segment located furthest from the first electrode.

(B12) The imaging element as described in any one of (A01) to (B11), in which at least a floating diffusion layer and an amplification transistor forming a control unit are provided with the semiconductor substrate, and the first electrode is connected to a gate section of the floating diffusion layer and the amplification transistor.

(B13) The imaging element as described in (B12), in which the semiconductor substrate is further provided with a reset transistor and a select transistor forming a control unit, the floating diffusion layer is connected to a source/drain region of one side of the reset transistor, and the source/drain region of one side of the amplification transistor is connected to the source/drain region of one side of the select transistor, and the source/drain region of another side of the select transistor is connected to a signal line.

(B14) The imaging element as described in any one of (A01) to (B13), in which the size of the charge storage electrode is larger than that of the first electrode.

(B15) The imaging element as described in any one of (A01) to (B14), in which light enters from the second electrode side and a light shielding layer is formed on the light incident side from the second electrode.

(B16) The imaging element as described in any one of (A01) to (B14), in which light is incident from the second electrode side, and no light is incident on the first electrode.

(B17) The imaging element as described in (B16), in which a light shielding layer is formed above the first electrode, which is a light incident side from the second electrode.

(B18) The imaging element as described in (B16), in which an on-chip microlens is provided above the charge storage electrode and the second electrode, and light incident on the on-chip microlens is collected to the charge storage electrode. (C01)

(stacked-type imaging element)

A stacked-type imaging element including at least one imaging element as described in any one of (A01) to (B18).

(D01)

(solid-state imaging apparatus: first aspect)

A solid-state imaging apparatus including a photoelectric conversion unit formed by stacking a first electrode, a photoelectric conversion layer and a second electrode, in which the photoelectric conversion unit further includes a plurality of imaging elements each of which includes a charge storage electrode which is disposed to be spaced apart from the first electrode and disposed opposite to the photoelectric conversion layer via an insulating layer, an imaging element block is formed of a plurality of the imaging elements, and the first electrode is shared by a plurality of the imaging elements forming the imaging element block.

(D02)

(solid-state imaging apparatus: second aspect)

A solid-state imaging apparatus including a plurality of the imaging elements as described in any one of (A01) to (B17), in which an imaging element block is formed of a plurality of the imaging elements, and the first electrode is shared by a plurality of the imaging elements forming the imaging element block.

(D03) The solid-state imaging apparatus as described in (D01) or (D02), in which a transfer control electrode is disposed between a plurality of the imaging elements forming the imaging element block (D04) The solid-state imaging apparatus as described in any one of (D01) to (D03), in which one on-chip microlens is disposed above one imaging element.

(D05) The solid-state imaging apparatus as described in any one of (D01) to (D04), in which the imaging element block is formed of two imaging elements, and one on-chip microlens is disposed above the imaging element block.

(D06) The solid-state imaging apparatus as described in any one of (D01) to (D05), in which one floating diffusion layer is provided for a plurality of the imaging elements.

(D07) The solid-state imaging apparatus as described in any one of (D01) to (D06), in which the first electrode is disposed adjacent to the charge storage electrode of each imaging element.

(D08) The solid-state imaging apparatus as described in any one of (D01) to (D07), in which the first electrode is disposed adjacent to a part of the charge storage electrodes of a plurality of the imaging elements and is not disposed adjacent to the remaining charge storage electrodes of a plurality of the imaging elements.

(D09) The solid-state imaging apparatus as described in (D08), in which a distance between the charge storage electrode forming the imaging element and the charge storage electrode forming the imaging element is longer than a distance between the first electrode and the charge storage electrode in the imaging element adjacent to the first electrode.

(E01)

(solid-state imaging apparatus: third aspect)

A solid-state imaging apparatus including a plurality of the imaging elements as described in any one of (A01) to (A06).

(E02)

(solid-state imaging apparatus: fourth aspect)

A solid-state imaging apparatus including a plurality of the stacked-type imaging element as described in (C01).

(F01)

(Method of driving solid-state imaging apparatus)

A method of driving a solid-state imaging apparatus, the solid-state imaging apparatus including a plurality of imaging elements, in which the imaging element includes a photoelectric conversion unit formed by stacking a first electrode, a photoelectric conversion layer and a second electrode, and the photoelectric conversion unit further includes a charge storage electrode which is disposed to be spaced apart from the first electrode and disposed opposite to the photoelectric conversion layer via an insulating layer, and the imaging element has a structure in which light enters from the second electrode side and light does not enter the first electrode, the method repeating each process of discharging charges in the first electrode out of a system in all the imaging elements while simultaneously accumulating charges in the photoelectric conversion layer, thereafter, simultaneously transferring charges stored in the photoelectric conversion layer to the first electrode in all the imaging elements, and after completion of transfer, sequentially reading out charges transferred to the first electrode in each imaging element.

(G01)

An imaging element including a photoelectric conversion unit including: a first electrode, a photoelectric conversion layer, a second electrode, an insulating layer including N number of insulating layer segments, wherein N is greater than or equal to two, and a charge storage electrode spaced apart from the first electrode and disposed such that the insulating layer is between the charge storage electrode and the photoelectric conversion layer, wherein, the photoelectric conversion unit includes N number of photoelectric conversion unit segments, an nth (where n=1, 2, 3 . . . , N) photoelectric conversion unit segment includes the charge storage electrode, an nth insulating layer segment, and the photoelectric conversion layer, as a value of n increases, the nth photoelectric conversion unit segment is located farther from the first electrode, and a thickness of the insulating layer segment in a first photoelectric conversion unit segment is different from a thickness of the insulating layer segment in an Nth photoelectric conversion unit segment.

(G02)

An imaging apparatus including a plurality of the imaging elements as described in (G01).

(G03)

A stacked-type imaging element including at least one imaging element as described in (G01).

(G04)

An imaging apparatus including a plurality of the stacked-type imaging element as described in (G03).

(G05)

An imaging element including a photoelectric conversion unit including a first electrode, a photoelectric conversion layer including N number of photoelectric conversion unit segments, wherein N is greater than or equal to two, a second electrode, an insulating layer, and a charge storage electrode spaced apart from the first electrode and disposed such that the insulating layer is between the charge storage electrode and the photoelectric conversion layer, wherein, the photoelectric conversion unit includes N number of photoelectric conversion unit segments, an nth (where n=1, 2, 3 . . . , N) photoelectric conversion unit segment is formed the charge storage electrode, an nth photoelectric conversion layer segment, and the insulating layer, as a value of n increases, the nth photoelectric conversion unit segment is located farther from the first electrode, and a thickness of the photoelectric conversion layer segment in a first photoelectric conversion unit segment is different from a thickness of the photoelectric conversion layer segment in an Nth photoelectric conversion unit segment.

(G06)

An imaging element including a photoelectric conversion unit including a first electrode, a photoelectric conversion layer, a second electrode, an insulating layer including N number of insulating layer segments, wherein N is greater than or equal to two, and a charge storage electrode spaced apart from the first electrode and disposed such that the insulating layer is between the charge storage electrode and the photoelectric conversion layer, wherein, the photoelectric conversion unit includes N number of photoelectric conversion unit segments, an nth (where n=1, 2, 3 . . . , N) photoelectric conversion unit segment is formed of the charge storage electrode, an nth insulating layer segment, and the photoelectric conversion layer segment, as a value of n increases, the nth photoelectric conversion unit segment is located farther from the first electrode, and materials forming the insulating layer segments are different in adjacent photoelectric conversion unit segments.

(G07)

An imaging element including a photoelectric conversion unit including: a first electrode, a photoelectric conversion layer, a second electrode, an insulating layer, and a charge storage electrode spaced apart from the first electrode and disposed such that the insulating layer is between the charge storage electrode and the photoelectric conversion layer, wherein, the charge storage electrode includes N number of charge storage segments spaced apart from each other, N is greater than or equal to two, the photoelectric conversion unit includes N number of photoelectric conversion unit segments, an nth (where n=1, 2, 3 . . . , N) photoelectric conversion unit segment is formed of an nth charge storage electrode segment, the insulating layer, and the photoelectric conversion layer segment, as a value of n increases, the nth photoelectric conversion unit segment is located farther from the first electrode, and materials forming the charge storage electrode segments are different in adjacent photoelectric conversion unit segments.

(G08)

An imaging element including: a photoelectric conversion unit including a first electrode, a photoelectric conversion layer, a second electrode, an insulating layer, and a charge storage electrode spaced apart from the first electrode and disposed such that the insulating layer is between the charge storage electrode and the photoelectric conversion layer, wherein, the charge storage electrode includes N number of charge storage segments, N is greater than or equal to two, the photoelectric conversion unit includes N number of photoelectric conversion unit segments, an nth (where n=1, 2, 3 . . . , N) photoelectric conversion unit segment is formed of an nth charge storage electrode segment, the insulating layer, and the photoelectric conversion layer, as a value of n increases, the nth photoelectric conversion unit segment is located farther from the first electrode, and an area of the charge storage electrode segment in a first photoelectric conversion unit segment is different from an area of the charge storage electrode segment in an Nth photoelectric conversion unit segment.

(G09)

The imaging element as described in (G08), wherein the area of the charge storage electrode segment in the first photoelectric conversion unit segment is greater than the area of the charge storage electrode segment in the Nth photoelectric conversion unit segment in a planar view.

(G10)

The imaging element as described in (G10), wherein a first dimension in a first direction of the charge storage electrode segment in the first photoelectric conversion unit segment is greater than a first dimension in the first direction of the charge storage electrode segment in the Nth photoelectric conversion unit segment in a planar view, and wherein a second dimension in a second direction of the charge storage electrode segment in the first photoelectric conversion unit segment is less than a second dimension in the second direction of the charge storage electrode segment in the Nth photoelectric conversion unit segment in the planar view.

(G11)

The imaging element as described in (G08), wherein at least three edges of the charge storage segment in the first photoelectric conversion unit segment are adjacent to corresponding edges of the charge storage electrode segment in the Nth photoelectric conversion unit segment in a planar view.

(G12)

The imaging element as described in (G08) wherein the charge storage electrode includes a common portion, and wherein at least one photoelectric conversion unit segment includes a plurality of charge storage electrode portions spaced apart from one another in a direction perpendicular to a direction in which n increases.

(G13)

An imaging element including a photoelectric conversion unit including: a first electrode, a photoelectric conversion layer, a second electrode, an insulating layer, and a charge storage electrode spaced apart from the first electrode and disposed such that the insulating layer is between the charge storage electrode and the photoelectric conversion layer via, wherein in a case in which a stacking direction of the charge storage electrode, the insulating layer, and the photoelectric conversion layer is defined as a Z direction and a direction away from the first electrode is defined as an X direction, a cross-sectional area of a stacked portion including the charge storage electrode, the insulating layer, and the photoelectric conversion layer in a YZ virtual plane varies based on a distance from the first electrode.

(G14)

An imaging apparatus including a photoelectric conversion unit including a first electrode, a photoelectric conversion layer, a second electrode, insulating layer, and a plurality of imaging elements each of which includes a charge storage electrode which is spaced apart from the first electrode and disposed such that the insulating layer is between the charge storage electrode and the photoelectric conversion layer, wherein, an imaging element block includes the plurality of the imaging elements, and the first electrode is shared by the plurality of the imaging elements of the imaging element block.

(G15)

The imaging apparatus as described in (G14), wherein each imaging element of the plurality of the imaging elements includes a photoelectric conversion unit including a first electrode, a photoelectric conversion layer, a second electrode, an insulating layer including N number of insulating layer segments, wherein N is greater than or equal to two, and a charge storage electrode spaced apart from the first electrode and disposed such that the insulating layer is between the charge storage electrode and the photoelectric conversion layer, wherein, the photoelectric conversion unit includes N number of photoelectric conversion unit segments, an nth (where n=1, 2, 3 . . . , N) photoelectric conversion unit segment includes the charge storage electrode, an nth insulating layer segment, and the photoelectric conversion layer, as a value of n increases, the nth photoelectric conversion unit segment is located farther from the first electrode, and a thickness of the insulating layer segment in a first photoelectric conversion unit segment is different from a thickness of the insulating layer segment in an Nth photoelectric conversion unit segment.

(G16)

The imaging apparatus as described in (G14), wherein a transfer control electrode is disposed between the plurality of the imaging elements forming the imaging element block.

(G17)

The imaging apparatus as described in any one of (G01) to (G16), wherein one on-chip microlens is disposed above one imaging element.

(G18)

The imaging apparatus as described in (G14), wherein the imaging element block is formed of two imaging elements and one on-chip microlens is disposed above the imaging element block.

(G19)

The imaging apparatus as described in (G14), further including: a first imaging element block of the plurality of imaging element blocks; and a second imaging element block of the plurality of imaging element blocks, wherein a first imaging element of the first imaging element block is adjacent to a first imaging element of the second imaging element block in a planar view.

(G20)

The imaging apparatus as described in (G14), further including: a first imaging element block of the plurality of imaging element blocks; a second imaging element block of the plurality of imaging element blocks; and a transfer control electrode disposed between the first imaging element block and the second imaging element block.

(G21)

The imaging apparatus as described in (G14), further including: a first imaging element block of the plurality of imaging element blocks; and a second imaging element block of the plurality of imaging element blocks, wherein, a first imaging element of the first imaging element block is adjacent to a second imaging element of the first imaging element block in a planar view, a first imaging element of the second imaging element block is adjacent to a second imaging element of the second imaging element block in the planar view, and the second imaging element of the first imaging element block is adjacent to the first imaging element of the second imaging element block.

(G22)

The imaging apparatus as described in (G21), wherein the first electrode is diagonally between the first imaging element of the first imaging element block and a third imaging element of the first imaging element block in the planar view.

(G23)

The imaging apparatus as described in (G21), further including: a transfer control electrode disposed between the second imaging element of the first imaging element block and the first imaging element of the second imaging element block.

REFERENCE SIGNS LIST 101, 102, 103 photoelectric conversion unit segment
11, 11' first electrode
12, 12' charge storage electrode
121, 122, 123 charge storage electrode segment
13' transfer control electrode
14 charge discharge electrode
15 photoelectric conversion layer
151, 152, 153 photoelectric conversion layer segment
16 second electrode
41 n-type semiconductor region forming second imaging element 43 n-type semiconductor region forming third imaging element
42, 44, 73 p$^+$ layer
FD$_1$, FD$_2$, FD$_3$, 45C, 46C floating diffusion layer
TR1$_{amp}$ amplification transistor
TR1$_{rst}$ reset transistor
TR1$_{sel}$ select transistor
51 gate section of reset transistor TR1$_{rst}$
51A channel forming region of reset transistor TR1$_{rst}$
51B, 51C source/drain region of reset transistor TR1$_{rst}$
52 gate section of amplification transistor TR1$_{amp}$
52A channel forming region of amplification transistor TR1$_{amp}$
52B, 52C source/drain region of amplification transistor TR1$_{amp}$
53 gate section of select transistor TR1$_{sel}$
53A channel forming region of select transistor TR1$_{sel}$
53B, 53C source/drain region of select transistor TR1$_{sel}$
TR2$_{trs}$ transfer transistor
45 gate section of transfer transistor
TR2$_{trs}$ reset transistor
TR2$_{amp}$ amplification transistor
TR2$_{sel}$ select transistor
TR3$_{trs}$ transfer transistor
46 gate section of transfer transistor
TR3$_{rst}$ reset transistor
TR3$_{amp}$ amplification transistor
TR3$_{SEL}$, select transistor
V$_{DD}$ power supply
RST$_1$, RST$_2$, RST$_3$ reset line
SEL$_1$, SEL$_2$, SEL$_3$ select line
117, VSL$_1$, VSL$_2$, VSL$_3$ signal line
TG$_2$, TG$_3$ transfer gate line
V$_{OA}$, V$_{OT}$, V$_{OU}$) wiring
61 contact hole portion
62 wiring layer
63, 64, 68A pad portion
65, 68B connection hole
66, 67, 69 connection portion
70 semiconductor substrate
70A first surface (front surface) of semiconductor substrate
70B second surface (back surface) of semiconductor substrate
71 element separation region
72 oxide film
74 HfO$_2$ film
75 insulating film
76 interlayer insulating layer
77, 78, 81 interlayer insulating layer
82 insulating layer
82$_1$, 82$_2$, 82$_3$ insulating layer segment
82a first surface of insulating layer
82B second surface of insulating layer
82C third surface of insulating layer
83 protective layer
84, 84A, 84B, 84C opening
85, 85A second opening
90 on-chip microlens
91 various components of imaging element located below interlayer insulating layer
92 light shielding layer
100 solid-state imaging apparatus
101 stacked-type imaging element
111 imaging area
112 vertical drive circuit
113 column signal processing circuit
114 horizontal drive circuit
115 output circuit
116 drive control circuit
118 horizontal signal line
200 electronic device (camera)
201 solid-state imaging apparatus
210 optical lens
211 shutter device
212 drive circuit
213 signal processing circuit

What is claimed is:

1. An imaging element, comprising:
a photoelectric conversion unit, including:
  a first electrode,
  a photoelectric conversion layer including N number of photoelectric conversion unit segments, wherein N is greater than or equal to two,
  a second electrode,
  an insulating layer, and
  a charge storage electrode spaced apart from the first electrode and disposed such that the insulating layer is between the charge storage electrode and the photoelectric conversion layer,
wherein,
  an n$^{th}$ (where n=1, 2, 3 . . . , N) photoelectric conversion unit segment is formed of the charge storage electrode, an n$^{th}$ photoelectric conversion layer segment, and the insulating layer,
  as a value of n increases, the n$^{th}$ photoelectric conversion unit segment is located farther from the first electrode, and
  a thickness of the photoelectric conversion layer segment in a first photoelectric conversion unit segment is different from a thickness of the photoelectric conversion layer segment in an N$^{th}$ photoelectric conversion unit segment.

2. An imaging element, comprising:
a photoelectric conversion unit, including:
  a first electrode,
  a photoelectric conversion layer,
  a second electrode,
  an insulating layer including N number of insulating layer segments, wherein N is greater than or equal to two, and
  a charge storage electrode spaced apart from the first electrode and disposed such that the insulating layer is between the charge storage electrode and the photoelectric conversion layer,
wherein,
  the photoelectric conversion unit includes N number of photoelectric conversion unit segments,
  an n$^{th}$ (where n=1, 2, 3 . . . , N) photoelectric conversion unit segment is formed of the charge storage electrode, an n$^{th}$ insulating layer segment, and a photoelectric conversion layer segment,
  as a value of n increases, the n$^{th}$ photoelectric conversion unit segment is located farther from the first electrode, and
  materials forming the insulating layer segments are different in adjacent photoelectric conversion unit segments.

3. An imaging element, comprising:
a photoelectric conversion unit, including:
  a first electrode,
  a photoelectric conversion layer,
  a second electrode,
  an insulating layer, and a charge storage electrode spaced apart from the first electrode and disposed such that the insulating layer is between the charge storage electrode and the photoelectric conversion layer, wherein, the charge storage electrode includes N number of charge storage electrode segments spaced apart from each other, N is greater than or equal to two, the photoelectric conversion unit includes N number of photoelectric conversion unit segments, an $n^{th}$ (where n=1, 2, 3 . . . , N) photoelectric conversion unit segment is formed of an $n^{th}$ charge storage electrode segment, the insulating layer, and a photoelectric conversion layer segment, as a value of n increases, the $n^{th}$ photoelectric conversion unit segment is located farther from the first electrode, and materials forming the charge storage electrode segments are different in adjacent photoelectric conversion unit segments.

4. An imaging element, comprising:

a photoelectric conversion unit, including:

a first electrode, a photoelectric conversion layer, a second electrode, an insulating layer, and a charge storage electrode spaced apart from the first electrode and disposed such that the insulating layer is between the charge storage electrode and the photoelectric conversion layer, wherein, the charge storage electrode includes N number of charge storage electrode segments, N is greater than or equal to two, the photoelectric conversion unit includes N number of photoelectric conversion unit segments, an $n^{th}$ (where n=1, 2, 3 . . . , N) photoelectric conversion unit segment is formed of an $n^{th}$ charge storage electrode segment, the insulating layer, and the photoelectric conversion layer, as a value of n increases, the $n^{th}$ photoelectric conversion unit segment is located farther from the first electrode, and an area of the charge storage electrode segment in a first photoelectric conversion unit segment is different from an area of the charge storage electrode segment in an $N^{th}$ photoelectric conversion unit segment.

5. The imaging element according to claim 4, wherein the area of the charge storage electrode segment in the first photoelectric conversion unit segment is greater than the area of the charge storage electrode segment in the Nth photoelectric conversion unit segment in a planar view.

6. The imaging element according to claim 5, wherein a first dimension in a first direction of the charge storage electrode segment in the first photoelectric conversion unit segment is greater than a first dimension in the first direction of the charge storage electrode segment in the Nth photoelectric conversion unit segment in a planar view, and wherein a second dimension in a second direction of the charge storage electrode segment in the first photoelectric conversion unit segment is less than a second dimension in the second direction of the charge storage electrode segment in the Nth photoelectric conversion unit segment in the planar view.

7. The imaging element according to claim 4, wherein at least three edges of the charge storage segment in the first photoelectric conversion unit segment are adjacent to corresponding edges of the charge storage electrode segment in the Nth photoelectric conversion unit segment in a planar view.

8. The imaging element according to claim 4, wherein the charge storage electrode includes a common portion, and wherein at least one photoelectric conversion unit segment includes a plurality of charge storage electrode portions spaced apart from one another in a direction perpendicular to a direction in which n increases.

* * * * *